(12) United States Patent
Yamazaki et al.

(10) Patent No.: US 12,538,495 B2
(45) Date of Patent: Jan. 27, 2026

(54) SEMICONDUCTOR DEVICE, CAPACITOR, AND MANUFACTURING METHOD THEREOF

(71) Applicant: SEMICONDUCTOR ENERGY LABORATORY CO., LTD., Atsugi (JP)

(72) Inventors: Shunpei Yamazaki, Tokyo (JP); Yasuhiro Jinbo, Kanagawa (JP); Hitoshi Kunitake, Kanagawa (JP); Haruyuki Baba, Kanagawa (JP); Yuki Ito, Aichi (JP); Fumito Isaka, Kanagawa (JP); Kazuki Tanemura, Kanagawa (JP); Yasumasa Yamane, Kanagawa (JP); Tatsuya Onuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 394 days.

(21) Appl. No.: 18/023,618

(22) PCT Filed: Aug. 24, 2021

(86) PCT No.: PCT/IB2021/057736
§ 371 (c)(1),
(2) Date: Feb. 27, 2023

(87) PCT Pub. No.: WO2022/049449
PCT Pub. Date: Mar. 10, 2022

(65) Prior Publication Data
US 2023/0329002 A1    Oct. 12, 2023

(30) Foreign Application Priority Data
Sep. 6, 2020   (JP) .................................. 2020-149507

(51) Int. Cl.
*H10B 53/30*    (2023.01)

(52) U.S. Cl.
CPC .................................... *H10B 53/30* (2023.02)

(58) Field of Classification Search
CPC ...................................................... H10B 53/30
See application file for complete search history.

(56) References Cited

U.S. PATENT DOCUMENTS 6,072,454 A    6/2000   Nakai et al.
6,780,704 B1   8/2004   Raaijmakers et al.
(Continued)

FOREIGN PATENT DOCUMENTS

CN    109087674 A    12/2018
CN    110910926 A    3/2020
(Continued)

OTHER PUBLICATIONS

Zarubin.S et al., "Fully ALD-grown TiN/Hf0.5Zr0.5O2/TiN stacks: Ferroelectric and structural properties", Appl. Phys. Lett. (Applied Physics Letters), Nov. 8, 2016, vol. 109, No. 19, pp. 192903-1-192903-5.
(Continued)

*Primary Examiner* — Richard A Booth
(74) *Attorney, Agent, or Firm* — NIXON PEABODY LLP; Jeffrey L. Costellia

(57) ABSTRACT

A semiconductor device that can be miniaturized or highly integrated is provided. A first conductor is formed over a substrate, a ferroelectric layer is formed over the first conductor, a second conductor is formed over the ferroelectric layer while substrate heating is performed, the ferroelectric layer includes hafnium oxide and zirconium oxide, and heat treatment at 500° C. or higher is not performed after the formation of the second conductor.

19 Claims, 45 Drawing Sheets

(56) References Cited

U.S. PATENT DOCUMENTS

| | | | |
|---|---|---|---|
| 6,812,510 B2 | 11/2004 | Horii et al. | |
| 8,737,109 B2 | 5/2014 | Yamazaki et al. | |
| 9,024,317 B2 | 5/2015 | Endo et al. | |
| 9,076,505 B2 | 7/2015 | Atsumi et al. | |
| 10,553,589 B2 | 2/2020 | Yamazaki et al. | |
| 10,923,500 B2 | 2/2021 | Ino et al. | |
| 11,177,792 B2 | 11/2021 | Koyama | |
| 11,462,538 B2 | 10/2022 | Onuki et al. | |
| 2002/0190294 A1 | 12/2002 | Iizuka et al. | |
| 2003/0230773 A1* | 12/2003 | Horii | H01L 21/31691 257/295 |
| 2005/0094457 A1 | 5/2005 | Chen et al. | |
| 2012/0146196 A1 | 6/2012 | Lee et al. | |
| 2012/0248451 A1 | 10/2012 | Sone et al. | |
| 2012/0276484 A1 | 11/2012 | Izumi et al. | |
| 2015/0017813 A1 | 1/2015 | Akiyama et al. | |
| 2015/0340372 A1 | 11/2015 | Pandey et al. | |
| 2016/0190290 A1 | 6/2016 | Nomura et al. | |
| 2016/0284859 A1 | 9/2016 | Asami | |
| 2017/0040457 A1 | 2/2017 | Okazaki et al. | |
| 2017/0133064 A1 | 5/2017 | Nagatsuka et al. | |
| 2017/0148860 A1 | 5/2017 | Park et al. | |
| 2018/0261798 A1 | 9/2018 | Choi et al. | |
| 2018/0366174 A1 | 12/2018 | Liu | |
| 2020/0091162 A1 | 3/2020 | Morris et al. | |
| 2020/0161340 A1 | 5/2020 | Jintyou et al. | |
| 2020/0203489 A1 | 6/2020 | Tochibayashi et al. | |
| 2020/0212336 A1 | 7/2020 | Heo et al. | |
| 2020/0243514 A1 | 7/2020 | Yamazaki et al. | |
| 2021/0233769 A1 | 7/2021 | Yamazaki et al. | |
| 2021/0265353 A1 | 8/2021 | Okamoto et al. | |
| 2022/0157817 A1 | 5/2022 | Yamazaki et al. | |
| 2022/0157986 A1 | 5/2022 | Yamazaki et al. | |
| 2022/0223721 A1 | 7/2022 | Yamazaki et al. | |
| 2023/0269949 A1 | 8/2023 | Yamazaki et al. | |
| 2023/0363174 A1 | 11/2023 | Yamazaki et al. | |

FOREIGN PATENT DOCUMENTS

| | | |
|---|---|---|
| DE | 102019121696 | 3/2020 |
| JP | 2004-022702 A | 1/2004 |
| JP | 2011-151383 A | 8/2011 |
| JP | 2012-257187 A | 12/2012 |
| JP | 2020-123612 A | 8/2020 |
| WO | WO-2019/235092 | 12/2019 |
| WO | WO-2020/008304 | 1/2020 |

OTHER PUBLICATIONS

Lederer.M et al., "Local crystallographic phase detection and texture mapping in ferroelectric Zr doped HfO2 films by transmission-EBSD", Appl. Phys. Lett. (Applied Physics Letters), Nov. 27, 2019, vol. 115, No. 22, pp. 222902-1-222902-5.

International Search Report (Application No. PCT/IB2021/057736) Dated Nov. 9, 2021.

Written Opinion (Application No. PCT/IB2021/057736) Dated Nov. 9, 2021.

* cited by examiner

FIG. 5A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 5B
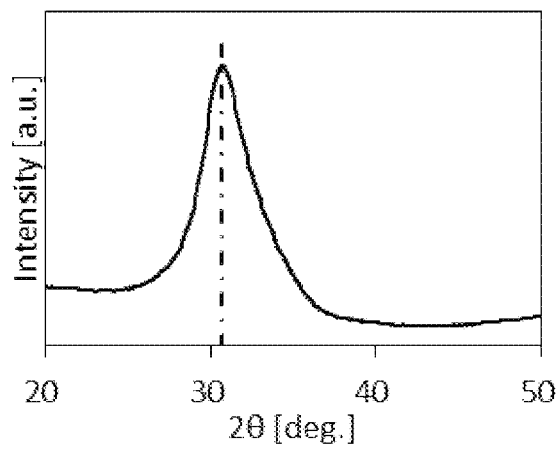
FIG. 5C
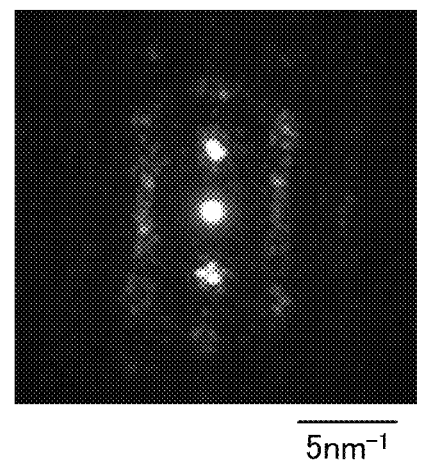

SEMICONDUCTOR DEVICE, CAPACITOR, AND MANUFACTURING METHOD THEREOF

TECHNICAL FIELD

One embodiment of the present invention relates to a metal oxide, a capacitor utilizing a metal oxide, and a manufacturing method thereof. One embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed to be mainly used for an LSI, a CPU, a memory, or the like. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor and further, an oxide semiconductor has been attracting attention as another material.

It is known that a transistor using an oxide semiconductor has an extremely low leakage current in a non-conduction state. For example, Patent Document 1 discloses a low-power-consumption CPU utilizing a characteristic of a low leakage current of the transistor using an oxide semiconductor. Furthermore, for example, Patent Document 2 discloses a storage device that can retain stored contents for a long time by utilizing a feature of a low leakage current of the transistor using an oxide semiconductor.

In recent years, demand for an integrated circuit with higher density has risen with reductions in size and weight of electronic devices. Furthermore, the productivity of a semiconductor device including an integrated circuit is desired to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device in which variation in electrical characteristics of transistors is small. Another object of one embodiment of the present invention is to provide a semiconductor device with favorable reliability. Another object of one embodiment of the present invention is to provide a semiconductor device with favorable electric characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

An object of one embodiment of the present invention is to provide a capacitor including a material that can have ferroelectricity. Another object of one embodiment of the present invention is to provide the above-described capacitor with favorable productivity. Another object of one embodiment of the present invention is to provide a semiconductor device including the above-described capacitor and a transistor. Another object of one embodiment of the present invention is to provide the above-described semiconductor device that can be miniaturized or highly integrated.

Note that the description of these objects does not preclude the existence of other objects. In one embodiment of the present invention, there is no need to achieve all these objects. Other objects are apparent from and can be derived from the description of the specification, the drawings, the claims, and the like.

Means for Solving the Problems

One embodiment of the present invention is a method for manufacturing a capacitor, including forming a first conductor over a substrate, forming a ferroelectric layer over the first conductor, and forming a second conductor over the ferroelectric layer while substrate heating is performed. The ferroelectric layer includes hafnium oxide and zirconium oxide.

In the above, a structure in which the ferroelectric layer is deposited by a thermal ALD method and heat treatment at 500° C. or higher is not performed after the formation of the second conductor may be employed. In the above, it is preferable that a precursor used in the deposition of the ferroelectric layer contain no hydrocarbon.

In the above, it is preferable that the second conductor be deposited by a thermal ALD method. In the above, it is preferable that a precursor used in the deposition of the second conductor contain no hydrocarbon. In the above, it is preferable that the temperature of the substrate heating be set to be higher than or equal to 350° C. and lower than or equal to 450° C.

Another embodiment of the present invention is a semiconductor device including a capacitor and a transistor electrically connected to the capacitor, in which the capacitor includes a first conductor, a second conductor, and a ferroelectric layer; the ferroelectric layer is provided between the first conductor and the second conductor; the ferroelectric layer includes hafnium oxide and zirconium oxide; and the transistor includes an oxide semiconductor in its channel formation region.

In the above, it is preferable that the concentration of at least one of hydrogen and carbon contained in the ferroelectric layer be lower than or equal to $5\times10^{20}$ atoms/cm$^3$.

In the above, it is preferable that the concentration of at least one of the hydrogen and the carbon contained in the ferroelectric layer be lower than or equal to $1\times10^{20}$ atoms/cm$^3$.

In the above, a structure in which the first conductor is electrically connected to one of a source and a drain of the transistor may be employed. In the above, it is preferable that the thickness of the ferroelectric layer be less than or equal to 10 nm.

In the above, the capacitor may be positioned above the transistor.

In the above, the following structure may be employed: a first insulator is positioned below the capacitor, a second insulator is positioned to cover the capacitor, the first insulator is in contact with the top surface of the second insulator in a region not overlapping with the capacitor, and the first insulator and the second insulator each include silicon nitride.

In the above, the following structure may be employed: a first insulator is positioned below the transistor, a second insulator is positioned to cover the capacitor, the first insulator is in contact with the top surface of the second insulator in a region not overlapping with the transistor or the capacitor, and the first insulator and the second insulator each include silicon nitride.

In the above, it is preferable that the second insulator include a first layer and a second layer over the first layer.

In the above, the following structure may be employed: an interlayer insulating film is positioned above the transistor, the interlayer insulating film comprises an opening reaching any one of the source and the drain of the transistor, the first conductor is positioned in contact with a side surface and a bottom surface of the opening, the ferroelectric layer is positioned to cover the first conductor, and the second conductor is positioned over the ferroelectric layer.

Effect of the Invention

According to one embodiment of the present invention, a semiconductor device in which variation in electrical characteristics of transistors is small can be provided. According to one embodiment of the present invention, a semiconductor device with favorable reliability can be provided. According to one embodiment of the present invention, a semiconductor device having favorable electrical characteristics can be provided. According to one embodiment of the present invention, a semiconductor device with a high on-state current can be provided. According to one embodiment of the present invention, a semiconductor device that can be miniaturized or highly integrated can be provided.

According to one embodiment of the present invention, a semiconductor device with low power consumption can be provided.

With one embodiment of the present invention, a capacitor including a material that can have ferroelectricity can be provided. With one embodiment of the present invention, the above-described capacitor can be provided with favorable productivity. With one embodiment of the present invention, a semiconductor device including the above-described capacitor and a transistor can be provided. With one embodiment of the present invention, the above-described semiconductor device that can be miniaturized or highly integrated can be provided.

Note that the description of these effects does not preclude the existence of other effects. One embodiment of the present invention does not have to have all these effects. Other effects will be apparent from and can be derived from the description of the specification, the drawings, the claims, and the like.

BRIEF DESCRIPTION OF THE DRAWINGS

FIG. 5A is a diagram showing a classification of crystal structures of IGZO. FIG. 5B is a diagram showing an XRD spectrum of a CAAC-IGZO film. FIG. 5C is a diagram showing nanobeam electron diffraction patterns of the CAAC-IGZO film.

MODE FOR CARRYING OUT THE INVENTION

Figure 1A:
FIG. 1A to FIG. 1C are cross-sectional views illustrating a method for manufacturing a capacitor of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

Moreover, in this specification and the like, terms for describing arrangement, such as "over" and "under", are used for convenience for describing the positional relation between components with reference to drawings. The positional relation between components is changed as appropriate in accordance with the direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of current is changed in a circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where a current flows in a semiconductor when a transistor is in an on state) and a gate electrode overlap each other or a channel formation region in a top view of the transistor. Note that in one transistor, channel lengths in all regions do not necessarily have the same value. In other words, the channel length of one transistor is not fixed to one value in some cases. Thus, in this specification, the channel length is anyone of the values, the maximum value, the minimum value, or the average value in a channel formation region.

A channel width refers to, for example, the length of a channel formation region in a direction perpendicular to a channel length direction in a region where a semiconductor (or a portion where a current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be referred to as a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

In this embodiment, an example of a semiconductor device including a transistor 200 and a capacitor 100, which is one embodiment of the present invention, and a manufacturing method thereof are described with reference to FIG. 3A to FIG. 20D.

<Structure Example of Semiconductor Device>

Figure 3A:
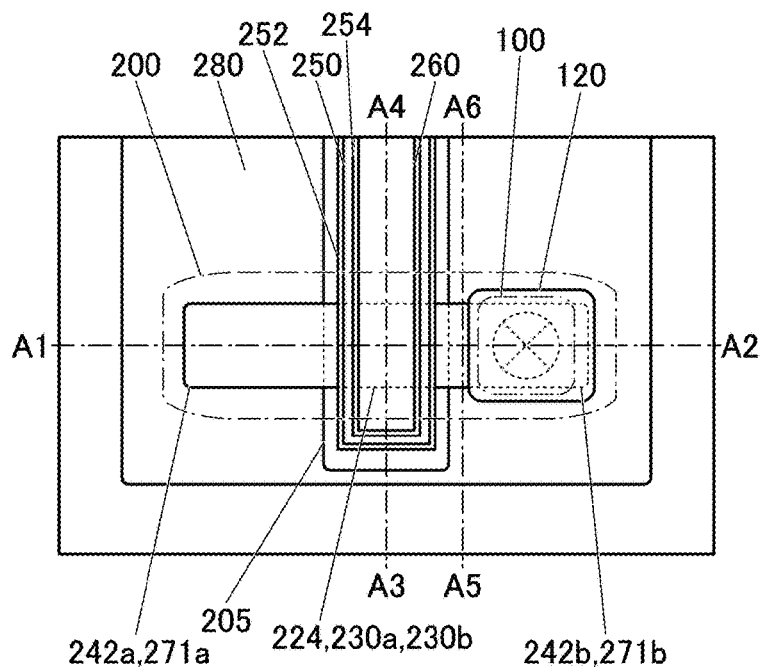
FIG. 3A is a top view of a semiconductor device of one embodiment of the present invention.
Figure 3C:
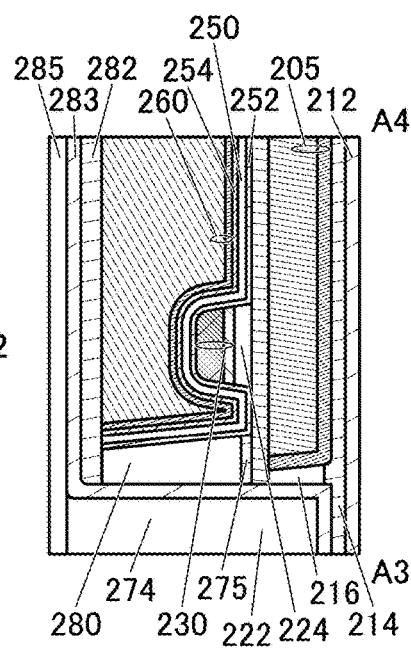
FIG. 3B to FIG. 3D are cross-sectional views of the semiconductor device of one embodiment of the present invention.
Figure 3B:
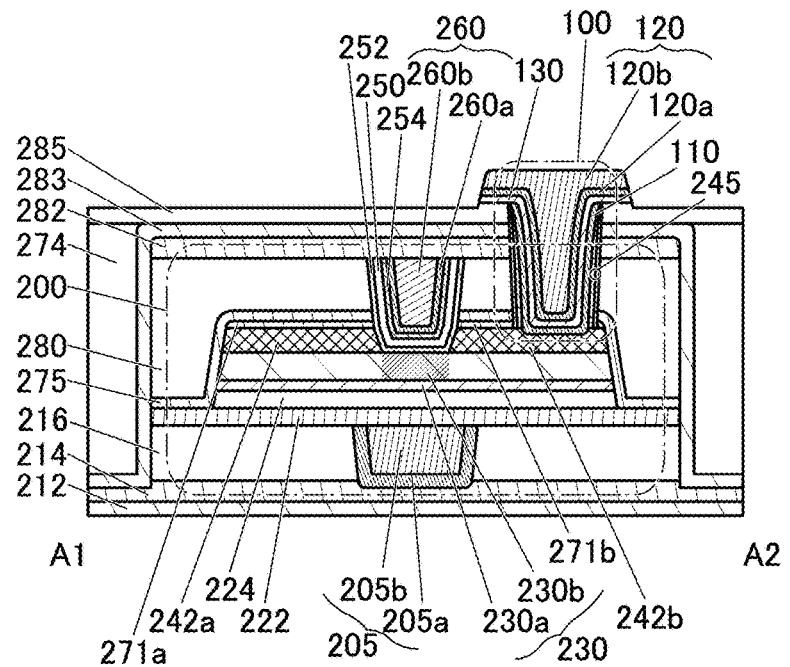
Figure 3D:
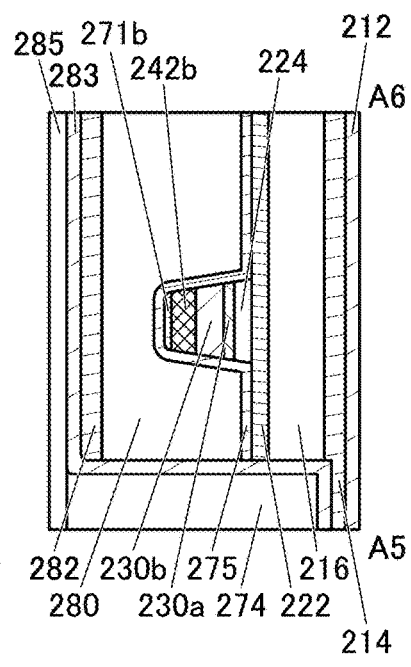

FIG. 3A to FIG. 3D are a top view and cross-sectional views of the semiconductor device including the transistor 200 and the capacitor 100. FIG. 3A is a top view of the semiconductor device. FIG. 3B to FIG. 3D are cross-sectional views of the semiconductor device. FIG. 3B is a cross-sectional view of a portion indicated by dashed-dotted line A1-A2 in FIG. 3A, which corresponds to a cross-sectional view in the channel length direction of the transistor 200. FIG. 3C is a cross-sectional view of a portion indicated by dashed-dotted line A3-A4 in FIG. 3A, which corresponds to a cross-sectional view in the channel width direction of the transistor 200. FIG. 3D is a cross-sectional view of a portion indicated by dashed-dotted line A5-A6 in FIG. 3A. Note that for clarity of the drawing, some components are not illustrated in the top view of FIG. 3A.

The semiconductor device of one embodiment of the present invention includes an insulator 212 over a substrate (not illustrated), an insulator 214 over the insulator 212, the transistor 200 over the insulator 214, an insulator 280 which is over an insulator 275 and provided in the transistor 200, an insulator 282 over the insulator 280, an insulator 283 over the insulator 282, an insulator 274 over the insulator 283, and an insulator 285 over the insulator 283 and the insulator 274. The insulator 212, the insulator 214, an insulator 216, the insulator 275, the insulator 280, the insulator 282, the insulator 283, the insulator 285, and the insulator 274 function as interlayer films. The insulator 283 is in contact with part of the top surface of the insulator 214, the side surface of the insulator 216, the side surface of an insulator 222, the side surface of the insulator 275, the side surface of the insulator 280, and the side surface and the top surface of the insulator 282.

Here, the transistor 200 includes a semiconductor layer, a first gate, a second gate, a source, and a drain. One of the source and the drain of the transistor 200 is in contact with one electrode of the capacitor 100 at a position above the semiconductor layer. An insulator 271 (an insulator 271a and an insulator 271b) is provided on and in contact with the source and the drain of the transistor 200. Note that the insulator 271a and the insulator 271b are collectively referred to as the insulator 271 in some cases.

The capacitor 100 is provided in an opening that is formed in the insulator 271, the insulator 275, the insulator 280, the insulator 282, the insulator 283, and the insulator 285 and reaches one of the source and the drain of the transistor 200. The capacitor 100 includes a conductor 110 that is in contact with the top surface of the one of the source and the drain of the transistor 200 in the opening, an insulator 130 placed over the conductor 110 and the insulator 285, and a conductor 120 (a conductor 120a and a conductor 120b) placed over the insulator 130. Here, the conductor 110 is preferably placed along the side surface and the bottom surface of the opening.

An insulator 245 is preferably provided between the conductor 110 and the insulator 280. It is preferable that the insulator 245 have a function of inhibiting diffusion of hydrogen (e.g., at least one of a hydrogen atom, a hydrogen molecule, and the like). In addition, it is preferable that the insulator 245 have a function of inhibiting diffusion of oxygen (e.g., at least one of an oxygen atom, an oxygen molecule, and the like). For example, the insulator 245 preferably has lower permeability of one or both of oxygen and hydrogen than the insulator 280.

[Transistor 200]

As illustrated in FIG. 3A to FIG. 3D, the transistor 200 includes the insulator 216 over the insulator 214, a conductor 205 (a conductor 205a and a conductor 205b) placed to be embedded in the insulator 216, the insulator 222 over the insulator 216 and the conductor 205, an insulator 224 over the insulator 222, an oxide 230a over the insulator 224, an oxide 230b over the oxide 230a, a conductor 242a over the oxide 230b, the insulator 271a over the conductor 242a, a conductor 242b over the oxide 230b, the insulator 271b over the conductor 242b, an insulator 252 over the oxide 230b, an insulator 250 over the insulator 252, an insulator 254 over the insulator 250, a conductor 260 (a conductor 260a and a conductor 260b) over the insulator 254 and overlapping with part of the oxide 230b, and the insulator 275 placed over the insulator 222, the insulator 224, the oxide 230a, the oxide 230b, the conductor 242a, the conductor 242b, the insulator 271a, and the insulator 271b. Here, as illustrated in FIG. 3B and FIG. 3C, the insulator 252 is in contact with the top surface of the insulator 222, the side surface of the insulator 224, the side surface of the oxide 230a, the side surface and the top surface of the oxide 230b, the side surface of the conductor 242, the side surface of the insulator 271, the side surface of the insulator 275, the side surface of the insulator 280, and the bottom surface of the insulator 250. The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with at least parts of the top surfaces of the conductor 260, the insulator 252, the insulator 250, the insulator 254, and the insulator 280.

Hereinafter, the oxide 230a and the oxide 230b are collectively referred to as an oxide 230 in some cases. The conductor 242a and the conductor 242b are collectively referred to as the conductor 242 in some cases.

An opening reaching the oxide 230b is provided in the insulator 280 and the insulator 275. The insulator 252, the insulator 250, the insulator 254, and the conductor 260 are placed in the opening. The conductor 260, the insulator 252, the insulator 250, and the insulator 254 are provided between the insulator 271a and the conductor 242a, and the insulator 271b and the conductor 242b in the channel length direction of the transistor 200. The insulator 254 includes a region in contact with the side surface of the conductor 260 and a region in contact with the bottom surface of the conductor 260

The oxide 230 preferably includes the oxide 230a placed over the insulator 224 and the oxide 230b placed over the oxide 230a. Including the oxide 230a under the oxide 230b makes it possible to inhibit diffusion of impurities into the oxide 230b from components formed below the oxide 230a.

Although a structure in which two layers, the oxide 230a and the oxide 230b, are stacked as the oxide 230 in the transistor 200 is described, the present invention is not limited thereto. For example, the oxide 230 may be provided as a single layer of the oxide 230b or to have a stacked-layer structure of three or more layers, or the oxide 230a and the oxide 230b may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242a functions as one of a source and a drain, and the conductor 242b functions as the other of the source and the drain. At least part of a region of the oxide 230 overlapping with the conductor 260 functions as a channel formation region.

Figure 4A:
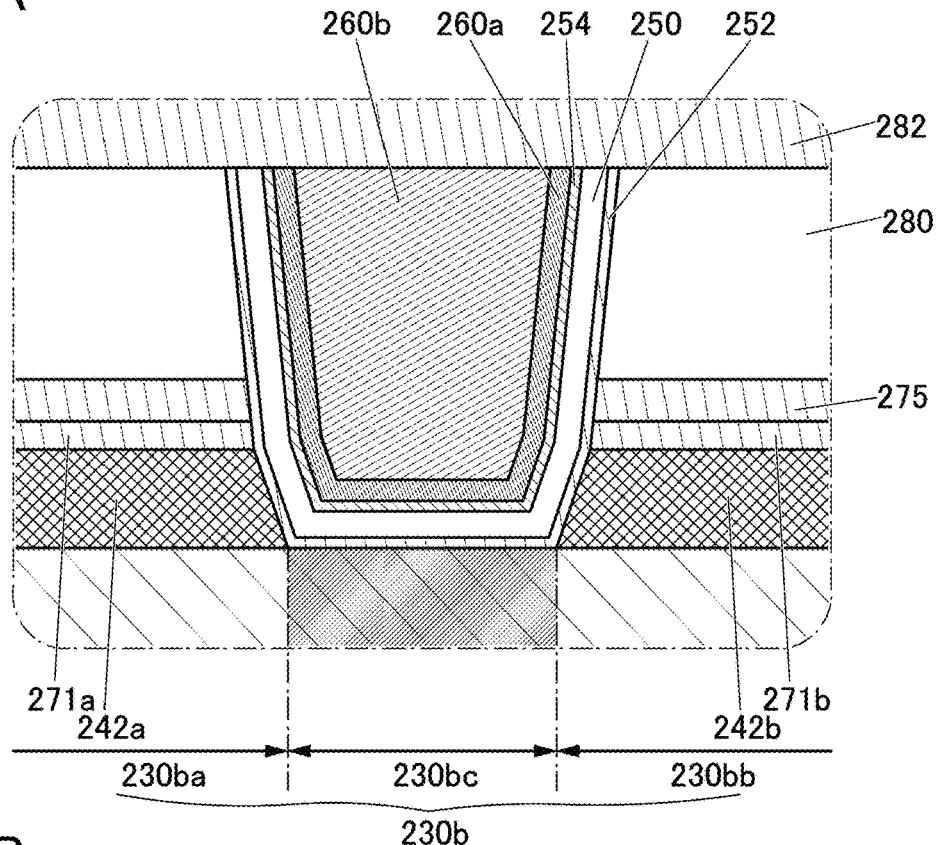
FIG. 4A and FIG. 4B are cross-sectional views of a semiconductor device of one embodiment of the present invention.

FIG. 4A is an enlarged view of the vicinity of the channel formation region in FIG. 3B. In the oxide 230b, the channel formation region is formed in a region between the conductor 242a and the conductor 242b. As illustrated in FIG. 4A, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

The region 230bc functioning as the channel formation region has a smaller amount of oxygen vacancies or a lower impurity concentration than those of the regions 230ba and 230bb, in other words, the region 230bc is a high-resistance region with a low carrier concentration. Thus, the region 230bc can be regarded as being i-type (intrinsic) or substantially i-type. Here, oxygen is preferably supplied to the region 230bc to reduce oxygen vacancies.

The region 230ba and the region 230bb functioning as the source region and the drain region have a large amount of oxygen vacancies and/or a high concentration of an impurity such as hydrogen, nitrogen, or a metal element, and thus are each a low-resistance region with an increased carrier concentration. In other words, the region 230ba and the region 230bb are each an n-type region having a higher carrier concentration and a lower resistance than the region 230bc.

The carrier concentration in the region 230bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 230bc functioning as the channel formation region is not particularly limited and can be, for example, $1 \times 10^{-9}$ cm$^{-3}$.

Between the region 230bc and the region 230ba or the region 230bb, a region having a carrier concentration that is lower than or substantially equal to the carrier concentrations in the region 230ba and the region 230bb and higher than or substantially equal to the carrier concentration in the region 230bc may be formed. That is, the region functions as a junction region between the region 230bc and the region 230ba or the region 230bb. The hydrogen concentration in the junction region is lower than or substantially equal to the hydrogen concentrations in the region 230ba and the region 230bb and higher than or substantially equal to the hydrogen concentration in the region 230bc in some cases. The amount of oxygen vacancies in the junction region is smaller than or substantially equal to the amounts of oxygen vacancies in the region 230ba and the region 230bb and larger than or substantially equal to the amount of oxygen vacancies in the region 230bc in some cases.

Although FIG. 4A illustrates an example where the region 230ba, the region 230bb, and the region 230bc are formed in the oxide 230b, the present invention is not limited thereto. For example, the above regions may be formed not only in the oxide 230b but also in the oxide 230a.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 200, a metal oxide functioning as a semiconductor (such a metal oxide is hereinafter also referred to as an oxide semiconductor) is preferably used for the oxide 230 (the oxide 230a and the oxide 230b) including the channel formation region.

The metal oxide functioning as a semiconductor preferably has a band gap of 2 eV or more, further preferably 2.5 eV or more. With the use of such a metal oxide having a large band gap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The atomic ratio of In to the element M in the metal oxide used as the oxide 230b is preferably greater than the atomic ratio of In to the element M in the metal oxide used as the oxide 230a.

The oxide 230a is placed under the oxide 230b, whereby impurities and oxygen can be inhibited from diffusing into the oxide 230b from components formed below the oxide 230a.

When the oxide 230a and the oxide 230b contain a common element (as the main component) besides oxygen, the density of defect states at an interface between the oxide 230a and the oxide 230b can be made low. Since the density of defect states at the interface between the oxide 230a and the oxide 230b can be made low, the influence of interface scattering on carrier conduction is small, and a high on-state current can be obtained.

The oxide 230b preferably has crystallinity. It is particularly preferable to use a CAAC-OS (c-axis aligned crystalline oxide semiconductor) as the oxide 230b.

The CAAC-OS is a metal oxide having a dense structure with high crystallinity and a small amount of impurities and defects (for example, oxygen vacancies $V_O$). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 200. Furthermore, a variation of oxygen supplied to the source region or the drain region in the substrate plane leads to a variation in characteristics of the semiconductor device including the transistor.

Therefore, the region 230bc functioning as the channel formation region in the oxide semiconductor is preferably an i-type or substantially i-type region with reduced carrier concentration, whereas the region 230ba and the region 230bb functioning as the source region and the drain region are preferably n-type regions with high carrier concentrations. That is, it is preferable that oxygen vacancies and $V_OH$ in the region 230bc of the oxide semiconductor be reduced and the region 230ba and the region 230bb not be supplied with an excess amount of oxygen.

Thus, in this embodiment, microwave treatment is performed in an oxygen-containing atmosphere in a state where the conductor 242a and the conductor 242b are provided over the oxide 230b so that oxygen vacancies and $V_OH$ in the region 230bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF (Radio Frequency) and activates the oxygen plasma. At this time, the region 230bc can be irradiated with the high-frequency wave such as a microwave or RF. By the effect of the plasma, the microwave, or the like, $V_OH$ in the region 230bc can be cut; thus, hydrogen H can be removed from the region 230bc and an oxygen vacancy $V_O$ can be filled with oxygen. That is, the reaction "$V_OH \rightarrow H + V_O$" occurs in the region 230bc, so that the hydrogen concentration in the region 230bc can be reduced. As a result, oxygen vacancies and $V_OH$ in the region 230bc can be reduced to lower the carrier concentration.

In the microwave treatment in an oxygen-containing atmosphere, the high-frequency wave such as the microwave or RF, the oxygen plasma, or the like is blocked by the conductor 242a and the conductor 242b and does not affect the region 230ba nor the region 230bb. In addition, the effect of the oxygen plasma can be reduced by the insulator 271 and the insulator 280 that are provided to cover the oxide 230b and the conductor 242. Hence, a reduction in $V_OH$ and supply of an excess amount of oxygen do not occur in the region 230ba or the region 230bb in the microwave treatment, preventing a decrease in carrier concentration.

In particular, microwave treatment is preferably performed in an oxygen-containing atmosphere after formation of an insulating film to be the insulator 252 or after formation of an insulating film to be the insulator 250. By performing the microwave treatment in an oxygen-containing atmosphere through the insulator 252 or the insulator 250 in such a manner, oxygen can be efficiently supplied into the region 230bc. In addition, the insulator 252 is placed to be in contact with the side surface of the conductor 242 and the surface of the region 230bc, thereby inhibiting oxygen more than necessary from being supplied to the region 230bc and inhibiting the side surface of the conductor 242 from being oxidized. Furthermore, the side surface of the conductor 242 can be inhibited from being oxidized when the insulating film to be the insulator 250 is formed.

The oxygen supplied into the region 230bc has any of a variety of forms such as an oxygen atom, an oxygen molecule, an oxygen radical (an O radical, an atom or a molecule having an unpaired electron, or an ion). Note that the oxygen supplied into the region 230bc has any one or more of the above forms, particularly preferably an oxygen radical. Furthermore, the film quality of the insulator 252 and the insulator 250 can be improved, leading to higher reliability of the transistor 200.

In the above manner, oxygen vacancies and $V_O H$ can be selectively removed from the region 230bc serving as a channel formation region, whereby the region 230bc can be an i-type or substantially i-type region. Furthermore, supply of an excess amount of oxygen to the region 230ba and the region 230bb functioning as the source region and the drain region can be inhibited and the n-type conductivity can be maintained. As a result, a change in the electrical characteristics of the transistor 200 can be inhibited, and thus a variation in the electrical characteristics of the transistors 200 in the substrate plane can be inhibited As illustrated in FIG. 3C, a curved surface may be provided between the side surface of the oxide 230b and the top surface of the oxide 230b in a cross-sectional view of the transistor 200 in the channel width direction. In other words, an end portion of the side surface and an end portion of the top surface may be curved (hereinafter referred to as rounded).

The radius of curvature of the curved surface is preferably greater than 0 nm and less than the thickness of the oxide 230b in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230b with the insulator 252, the insulator 250, the insulator 254, and the conductor 260.

The oxide 230 preferably has a stacked-layer structure of a plurality of oxide layers with different chemical compositions. Specifically, the atomic ratio of the element M to a metal element that is a main component of the metal oxide used as the oxide 230a is preferably greater than the atomic ratio of the element M to a metal element that is a main component of the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a.

The oxide 230b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

Here, the conduction band minimum gradually changes at a junction portion of the oxide 230a and the oxide 230b. In other words, the conduction band minimum at the junction portion of the oxide 230a and the oxide 230b continuously changes or is continuously connected. To achieve this, the density of defect states in a mixed layer formed at the interface between the oxide 230a and the oxide 230b is preferably made low.

Specifically, when the oxide 230a and the oxide 230b contain a common element as a main component besides oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like may be used as the oxide 230a.

Specifically, as the oxide 230a, a metal oxide with a composition of InM:Zn=1:3:4 [atomic ratio] or in the neighborhood thereof, or a composition of InM:Zn=1:1:0.5 [atomic ratio] or in the neighborhood thereof is used. As the oxide 230b, a metal oxide with a composition of InM:Zn=1:1:1 [atomic ratio] or in the neighborhood thereof, a composition of InM:Zn=1:1:2 [atomic ratio] or in the neighborhood thereof, or a composition of InM:Zn=4:2:3 [atomic ratio] or in the neighborhood thereof can be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 3C or the like, the insulator 252 formed using aluminum oxide or the like is provided in contact with the top surface and the side surface of the oxide 230, whereby indium contained in the oxide 230 is unevenly distributed, in some cases, at the interface between the oxide 230 and the insulator 252 and in its vicinity. Accordingly, the vicinity of the surface of the oxide 230 comes to have an atomic ratio close to that of an indium oxide or that of an In—Zn oxide. Such an increase in the atomic ratio of indium in the vicinity of the surface of the oxide 230, especially the vicinity of a surface of the oxide 230b, can increase the field-effect mobility of the transistor 200.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 275, the insulator 282, the insulator 283, and the insulator 285, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like)(an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used for the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283. For example, aluminum oxide or magnesium oxide, which has a function of capturing or fixing hydrogen well, is preferably used for the insulator 214, the insulator 271, the insulator 282, and the insulator 285. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to above the transistor 200 through the insulator 282 and the like. In this manner, it is preferable that the transistor 200 be surrounded by the insulator 212, the insulator 214, the insulator 271, the insulator 275, the insulator 282, the insulator 283, and the insulator 285, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. The metal oxide having an amorphous structure is used as the component of the transistor 200 or provided around the transistor 200, whereby the transistor 200 and a semiconductor device which have favorable characteristics and high reliability can be manufactured.

Although each of the insulator 212, the insulator 214, the insulator 271, the insulator 275, the insulator 282, the insulator 283, and the insulator 285 preferably has an amorphous structure, a region having a polycrystalline structure may be partly formed. Alternatively, each of the insulator 212, the insulator 214, the insulator 271, the insulator 275, the insulator 282, the insulator 283, and the insulator 285 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 271, the insulator 275, the insulator 282, the insulator 283, and the insulator 285 can be deposited by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 212, the insulator 275, and the insulator 283 are preferably low in some cases. For example, by setting the resistivities of the insulator 212, the insulator 275, and the insulator 283 to approximately $1 \times 10^{13}$ $\Omega$cm, the insulator 212, the insulator 275, and the insulator 283 can sometimes reduce charge up of the conductor 205, the conductor 242, the conductor 260, or the conductor 110 in treatment using plasma or the like in the manufacturing process of a semiconductor device. The resistivities of the insulator 212, the insulator 275, and the insulator 283 are preferably higher than or equal to $1 \times 10^{10}$ ($\Omega$cm and lower than or equal to $1 \times 10^{15}$ $\Omega$cm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205a and the conductor 205b. The conductor 205a is provided in contact with the bottom surface and the sidewall of the opening. The conductor 205b is provided to be embedded in a depressed portion formed in the conductor 205a. Here, the top surface of the conductor 205b is substantially level with the top surfaces of the conductor 205a and the insulator 216.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a is formed using a conductive material having a function of inhibiting diffusion of hydrogen, impurities such as hydrogen contained in the conductor 205b can be prevented from diffusing into the oxide 230 through the insulator 224 and the like. When the conductor 205a is formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, thereby reducing the amount of the impurities to be diffused into the oxide 230.

As illustrated in FIG. 3A, the conductor 205 is preferably provided to be larger than a region of the oxide 230 that does not overlap with the conductor 242a or the conductor 242b. As illustrated in FIG. 3C, it is particularly preferable that the conductor 205 extend to a region outside end portions of the oxide 230a and the oxide 230b in the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 3C, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the conductor 205 is a stack of the conductor 205a and the conductor 205b is illustrated, the present invention is not limited thereto. For example, the conductor 205 may be provided to have a single-layer structure or a stacked-layer structure of three or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. Alternatively, an oxide containing hafnium and zirconium, e.g., a hafnium-zirconium oxide is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 222.

For example, a single layer or stacked layers of an insulator(s) containing what is called a high-k material such as aluminum oxide, hafnium oxide, tantalum oxide, zirconium oxide, or hafnium-zirconium oxide may be used for the insulator 222. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate (SrTiO$_3$), or (Ba,Sr)TiO$_3$ (BST) may be used for the insulator 222.

Silicon oxide or silicon oxynitride, for example, can be used as appropriate for the insulator 224 that is in contact with the oxide 230.

In a manufacturing process of the transistor 200, heat treatment is preferably performed with a surface of the oxide 230 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas (e.g., an oxygen gas) at a flow rate ratio of 10 ppm or more, 1% or more, or 10% or more. For example, the heat treatment is preferably performed in an oxygen atmosphere. This can supply oxygen to the oxide 230 to reduce oxygen vacancies (V$_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 230 can promote a reaction in which oxygen vacancies in the oxide 230 are repaired with supplied oxygen, i.e., a reaction of "V$_O$+O→null". Furthermore, hydrogen remaining in the oxide 230 reacts with supplied oxygen, so that the hydrogen can be removed as H$_2$O (dehydration). This can inhibit recombination of hydrogen remaining in the oxide 230 with oxygen vacancies and formation of V$_O$H.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230a. In this case, the insulator 275 is in contact with the side surface of the insulator 224 and the top surface of the insulator 222.

The conductor 242a and the conductor 242b are provided in contact with the top surface of the oxide 230b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230b or the like diffuses into the conductor 242a or the conductor 242b in some cases. In particular, when a nitride containing tantalum is used for the conductor 242a and the conductor 242b, hydrogen contained in the oxide 230b or the like is likely to diffuse into the conductor 242a or the conductor 242b, and the diffused hydrogen is bonded to nitrogen contained in the conductor 242a or the conductor 242b in some cases. That is, hydrogen contained in the oxide 230b or the like is absorbed by the conductor 242a or the conductor 242b in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 3D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. As the insulator 271, an insulator such as aluminum oxide or magnesium oxide is used, for example.

The insulator 275 is provided to cover the insulator 224, the oxide 230a, the oxide 230b, the conductor 242, and the insulator 271. The insulator 275 preferably has a function of capturing and fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275.

When the above insulator 271 and the insulator 275 are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 252 functions as part of the gate insulator. As the insulator 252, a barrier insulating film against oxygen is preferably used. As the insulator 252, an insulator that can be used as the insulator 282 described above may be used. An insulator containing an oxide of one or both of aluminum and hafnium may be used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

As illustrated in FIG. 3C, the insulator 252 is provided in contact with the top surface and the side surface of the oxide 230b, the side surface of the oxide 230a, the side surface of the insulator 224, and the top surface of the insulator 222. That is, the regions of the oxide 230a, the oxide 230b, and the insulator 224 that overlap with the conductor 260 are covered with the insulator 252 in the cross section in the channel width direction. With this structure, the insulator 252 having a barrier property against oxygen can prevent release of oxygen from the oxide 230a and the oxide 230b at the time of heat treatment or the like. This can inhibit formation of oxygen vacancies ($V_O$) in the oxide 230a and the oxide 230b. Therefore, oxygen vacancies ($V_O$) and $V_OH$ formed in the region 230bc can be reduced. Thus, the transistor 200 can have favorable electrical characteristics and higher reliability.

Even when an excess amount of oxygen is contained in the insulator 280, the insulator 250 and the like, oxygen can be inhibited from being excessively supplied to the oxide 230a and the oxide 230b. Thus, the region 230ba and the region 230bb are inhibited from being excessively oxidized by oxygen through the region 230bc; a reduction in on-state current or field-effect mobility of the transistor 200 can be inhibited.

As illustrated in FIG. 3B, the insulator 252 is provided in contact with the side surfaces of the conductor 242, the insulator 271, the insulator 275, and the insulator 280. This can inhibit formation of an oxide film on the side surface of the conductor 242 by oxidization of the side surface. Accordingly, a reduction in on-state current or field-effect mobility of the transistor 200 can be inhibited.

Furthermore, the insulator 252 needs to be provided in an opening formed in the insulator 280, and the like, together with the insulator 254, the insulator 250, and the conductor 260. The thickness of the insulator 252 is preferably thin for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 252 preferably includes a region having the above-described thickness. The thickness of the insulator 252 is preferably smaller than that of the insulator 250. In this case, at least part of the insulator 252 preferably includes a region having a thickness smaller than that of the insulator 250.

To form the insulator 252 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 252 can be formed on the side surface of the opening formed in the insulator 280 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS), X-ray photoelectron spectroscopy (XPS), or auger electron spectroscopy (AES).

The insulator 250 functions as part of the gate insulator. The insulator 250 is preferably in contact with the top surface of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 250 in this case is an insulator containing at least oxygen and silicon.

As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, it is acceptable that at least part of the insulator 250 has a region with a thickness like the above-described thickness.

Although FIG. 3A to FIG. 3D and the like illustrate a single-layer structure of the insulator 250, the present invention is not limited to this structure, and a stacked-layer structure of two or more layers may be employed. For example, as illustrated in FIG. 4B, the insulator 250 may have a stacked-layer structure including two layers of an insulator 250a and an insulator 250b over the insulator 250a.

Figure 4B:
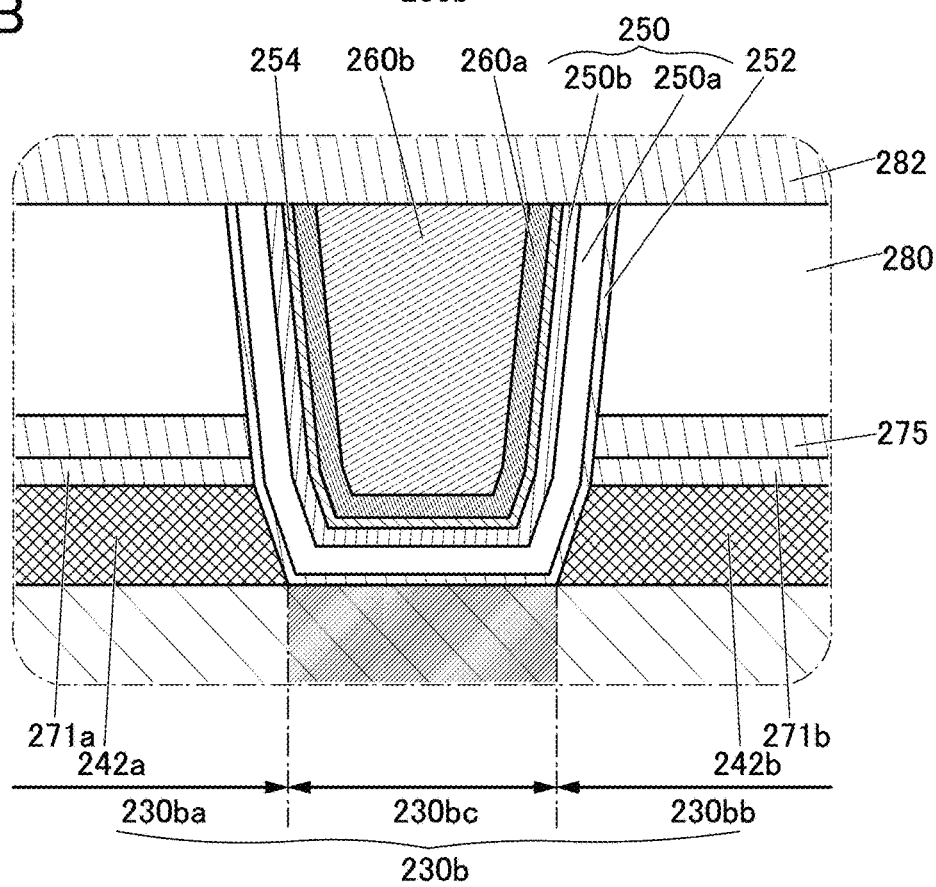

In the case where the insulator 250 has a stacked-layer structure of two layers as illustrated in FIG. 4B, it is preferable that the insulator 250a in a lower layer be formed using an insulator that is likely to transmit oxygen and the insulator 250b in an upper layer be formed using an insulator having a function of inhibiting oxygen diffusion. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, it is preferable that the insulator 250a be provided using any of the above-described materials that can be used for the insulator 250 and the insulator 250b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250b. In this case, the insulator 250b is an insulator containing at least oxygen and hafnium. The thickness of the insulator 250b is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator 250b may include a region having a thickness like the above-described thickness.

In the case where silicon oxide, silicon oxynitride, or the like is used for the insulator 250a, the insulator 250b may be formed using an insulating material that is a high-k material having a high dielectric constant. The gate insulator having a stacked-layer structure of the insulator 250a and the insulator 250b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250 can be increased.

The insulator 254 functions as part of a gate insulator. As the insulator 254, a barrier insulating film against hydrogen is preferably used. This can prevent diffusion of impurities such as hydrogen contained in the conductor 260 into the insulator 250 and the oxide 230b. As the insulator 254, an insulator that can be used as the insulator 283 described above may be used. For example, silicon nitride deposited by a PEALD method may be used as the insulator 254. In this case, the insulator 254 is an insulator containing at least nitrogen and silicon.

Furthermore, the insulator 254 may have a barrier property against oxygen. Thus, diffusion of oxygen contained in the insulator 250 into the conductor 260 can be inhibited.

Furthermore, the insulator 254 needs to be provided in an opening formed in the insulator 280 and the like, together with the insulator 252, the insulator 250, and the conductor 260. The thickness of the insulator 254 is preferably thin for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 254 preferably includes a region having the above-described thickness. The thickness of the insulator 254 is preferably smaller than that of the insulator 250. In this case, at least part of the insulator 254 may include a region having a thickness that is smaller than that of the insulator 250.

The conductor 260 functions as the first gate electrode of the transistor 200. The conductor 260 preferably includes the conductor 260a and the conductor 260b placed over the conductor 260a. For example, the conductor 260a is preferably placed to cover the bottom surface and the side surface of the conductor 260b. Moreover, as illustrated in FIG. 3B and FIG. 3C, the top surface of the conductor 260 is substantially level with the top surface of the insulator 250. Although the conductor 260 is illustrated to have a two-layer structure of the conductor 260a and the conductor 260b in FIG. 3B and FIG. 3C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242a and the conductor 242b without alignment.

As illustrated in FIG. 3C, in the channel width direction of the transistor 200, with reference to the bottom surface of the insulator 222, the level of the bottom surface of the conductor 260 in a region where the conductor 260 and the oxide 230b do not overlap is preferably lower than the level of the bottom surface of the oxide 230b. When the conductor 260 functioning as the gate electrode covers the side surface and the top surface of the channel formation region of the oxide 230b with the insulator 250 and the like therebetween, the electric field of the conductor 260 can easily act on the entire channel formation region of the oxide 230b. Thus, the on-state current of the transistor 200 can be increased and the frequency characteristics of the transistor 200 can be improved. With a reference to the bottom surface of the insulator 222, the difference between the level of the bottom surface of the conductor 260 in a region where the conductor 260 do not overlap with the oxide 230a or the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 280 is preferably reduced. Oxide containing silicon such as silicon oxide, silicon oxynitride, or the like is used as appropriate for the insulator 280, for example.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be constant. It is preferable to use, in particular, aluminum oxide having an amorphous structure for the insulator 282, because hydrogen can be captured or fixed more effectively in some cases. Accordingly, the transistor 200 and a semiconductor device which have favorable characteristics and high reliability can be manufactured.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is formed by a sputtering method, a high-density silicon nitride film can be formed. To obtain the insulator 283, silicon nitride deposited by a PEALD method or a CVD method may be stacked over silicon nitride deposited by a sputtering method.

[Capacitor 100]

The capacitor 100 is placed in the opening that is formed in the insulator 271, the insulator 275, the insulator 280, the insulator 282, the insulator 283, and the insulator 285 and includes the conductor 110 in contact with the top surface of the conductor 242b, the insulator 130 over the conductor 110 and the insulator 283, and the conductor 120 over the insulator 130. Note that the conductor 120 has a stacked-layer structure of the conductor 120a over the insulator 130 and the conductor 120b over the conductor 120a. Here, at least parts of the conductor 110, the insulator 130, and the conductor 120 are placed in the opening that is formed in the insulator 271, the insulator 275, the insulator 280, the insulator 282, the insulator 283, and the insulator 285.

The conductor 110 functions as a lower electrode of the capacitor 100, the conductor 120 functions as an upper electrode of the capacitor 100, and the insulator 130 functions as a dielectric of the capacitor 100. In the capacitor 100, the upper electrode and the lower electrode face each other with the dielectric positioned therebetween on the side surface as well as the bottom surface of the opening that is formed in the insulator 271, the insulator 275, the insulator 280, the insulator 282, the insulator 283, and the insulator 285; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

The shape of the opening that is formed in the insulator 271, the insulator 275, the insulator 280, the insulator 282, the insulator 283, and the insulator 285 when seen from above may be a quadrangular shape, a polygonal shape other than a quadrangular shape, a polygonal shape with rounded corners, or a circular shape including an elliptical shape. Here, the area where the opening and the transistor 200 overlap each other is preferably large in the top view. For example, as illustrated in FIG. 3A, the capacitor 100 is preferably provided so that the capacitor 100 can fit in the area of the conductor 242b in the top view. In that case, the length of the conductor 110 in the channel width direction is smaller than the length of the conductor 242b in the channel width direction. Such a structure can reduce the area occupied by the semiconductor device including the capacitor 100 and the transistor 200. The structure is not limited thereto and the length of the conductor 110 in the channel width direction can be larger than the length of the conductor 242b in the channel width direction.

The conductor 110 is placed along the opening that is formed in the insulator 271, the insulator 275, the insulator 280, the insulator 282, the insulator 283, and the insulator 285. Here, the opening preferably has a shape in which the side surface and the bottom surface of the opening is connected with a curved surface. With this structure, the conductor 110 can be deposited in the opening with favorable coverage.

Furthermore, part of the top surface of the conductor 110 is preferably substantially level with the top surface of the insulator 285. The top surface of the conductor 242b is in contact with the bottom surface of the conductor 110. The conductor 110 is preferably deposited by an ALD method, a CVD method, or the like and a conductor that can be used as the conductor 205 may be used. Titanium nitride deposited by a thermal ALD method can be used as the conductor 110, for example.

The insulator 130 is placed to cover the conductor 110, the insulator 245, and part of the insulator 285. Here, the top surface of the insulator 285 becomes higher in a region where the insulator 285 overlaps with the insulator 130 than in a region where the insulator 285 does not overlap with the insulator 130, in some cases. The insulator 130 is preferably deposited by an ALD method, a CVD method, or the like. The insulator 130 is preferably formed using a material that can have ferroelectricity.

As examples of the material that can have ferroelectricity, hafnium oxide, zirconium oxide, $HfZrO_x$ (x is a real number greater than 0), a material obtained by adding an element J1 (the element J1 here is zirconium (Zr), silicon (Si), aluminum (Al), gadolinium (Gd), yttrium (Y), lanthanum (La), or strontium (Sr), for example) to hafnium oxide, and a material obtained by adding an element J2 (the element J2 here is hafnium (Hf), silicon (Si), aluminum (Al), gadolinium (Gd), yttrium (Y), lanthanum (La), or strontium (Sr), for example) to zirconium oxide can be given. As the material that can have ferroelectricity, a piezoelectric ceramic having a perovskite structure such as $PbTiO_x$, barium strontium titanate (BST), strontium titanate, lead zirconate titanate (PZT), strontium bismuth tantalate (SBT), bismuth ferrite (BFO), or barium titanate may be used. As the material that can have ferroelectricity, a mixture or compound containing a plurality of materials selected from the above-described materials can be used, for example. Alternatively, the insulator 130 can have a stacked-layer structure of a plurality of materials selected from the above-described materials. Note that since the crystal structures (properties) of hafnium oxide, zirconium oxide, $HfZrO_x$, the material obtained by adding the element J1 to hafnium oxide, and the like can be changed depending on the processes as well as the deposition conditions, a material that exhibits ferroelectricity is referred to as a material that can have ferroelectricity as well as a ferroelectric in this specification or the like.

Hafnium oxide or a material containing hafnium oxide and zirconium oxide is especially preferable as the material that can have ferroelectricity because of being able to have ferroelectricity even when processed into a several-nanometer-thick thin film. Here, the thickness of the insulator 130 can be less than or equal to 100 nm, preferably less than or equal to 50 nm, further preferably less than or equal to 20 nm, still further preferably less than or equal to nm. When the ferroelectric layer that can be thin is used, the capacitor 100 can be combined with the miniaturized transistor 200 to form a semiconductor device. Note that in this specification and the like, a layer of the material that can have ferroelectricity is referred to as a ferroelectric layer in some cases.

The material that can have ferroelectricity is an insulator and has a property in which application of an electric field from the outside causes internal polarization and the polarization remains even after the electric field is made zero. Thus, with a capacitor using such a material as a dielectric (the capacitor may be referred to as a ferroelectric capacitor below), a nonvolatile storage element can be formed. A nonvolatile storage element using a ferroelectric capacitor is sometimes referred to as an FeRAM (Ferroelectric Random Access Memory), a ferroelectric memory, or the like. For example, a ferroelectric memory can have a structure including a transistor and a ferroelectric capacitor, where one of a source and a drain of the transistor is electrically connected to one terminal of the ferroelectric capacitor. Thus, the semiconductor device including the capacitor 100 and the transistor 200 described in this embodiment can function as a ferroelectric memory.

Note that the insulator 130 can have a stacked-layer structure of the above-described material that can have ferroelectricity and a material having high dielectric strength, in some cases. Examples of the material having high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. The use of such an insulator having high dielectric strength in the stacked-layer structure can increase the dielectric strength and inhibit a leakage current of the capacitor 100 in some cases.

The conductor 120 is placed to fill the opening that is formed in the insulator 271, the insulator 275, the insulator 280, the insulator 282, the insulator 283, and the insulator 285. Here, the conductor 120 preferably has a region overlapping with the insulator 285 with the insulator 130 positioned therebetween. With such a structure, the conductor 120 can be insulated from the conductor 110 with the insulator 130 positioned therebetween. Furthermore, a portion above the insulator 283 of the conductor 120 may be extended and formed as a wiring.

The conductor 120 preferably includes the conductor 120a and the conductor 120b over the conductor 120a, as illustrated in FIG. 3B. In that case, as the conductor 120a, a thin conductive film with favorable coverage may be provided over the insulator 130. The conductor 120b may be placed so as to fill the opening over the conductor 120a. The conductor 120a is preferably deposited by an ALD method, a CVD method, or the like and a conductor that can be used as the conductor 205 may be used. Titanium nitride deposited by an ALD method can be used as the conductor 120a, for example. The conductor 120b is preferably deposited by an ALD method, a CVD method, a sputtering method, or the like and a conductor that can be used as the conductor 205 may be used. As the conductor 120b, tungsten deposited by a sputtering method can be used. Note that the conductor 120 is not limited to the two-layer structure, and may have a single-layer structure or a stacked-layer structure of three or more layers.

A conductor functioning as a wiring may be placed in contact with the top surface of the conductor 120. For the conductor, a conductive material containing tungsten, copper, or aluminum as its main component is preferably used. Furthermore, the conductor may have a stacked-layer structure and may be stacked layers of titanium or titanium nitride and the above-described conductive material, for example. Note that the conductor may be formed to be embedded in an opening provided in an insulator.

The insulator 245 is preferably placed in contact with the side surface of the opening that is formed in the insulator 271, the insulator 275, the insulator 280, the insulator 282, the insulator 283, and the insulator 285. The conductor 110 is provided in contact with the inner side surface of the insulator 245, the insulator 130 is provided in contact with the inner side surface of the conductor 110, and the conductor 120 is provided in contact with the inner side surface of the insulator 130.

As the insulator 245, a barrier insulating film that can be used for the insulator 275 or the like can be used. For example, an insulator such as silicon nitride, aluminum oxide, or silicon nitride oxide can be used for the insulator 245. Since the insulator 245 is provided in contact with the insulator 283, the insulator 282, the insulator 275, and the insulator 271, impurities such as water and hydrogen contained in the insulator 280, the insulator 285, or the like can be inhibited from entering the oxide 230 through the conductor 110. In particular, silicon nitride is suitable because of its high blocking property against hydrogen. Moreover, oxygen contained in the insulator 280 can be prevented from being absorbed into the conductor 110.

When the insulator 245 has a stacked-layer structure illustrated in FIG. 3B, a first insulator in contact with an inner wall of the opening formed in the insulator 280 and the like and a second insulator on the inner side of the first insulator are preferably formed using a combination of a barrier insulating film against oxygen and a barrier insulating film against hydrogen. For example, aluminum oxide deposited by an ALD method may be used as the first insulator and silicon nitride deposited by a PEALD method may be used as the second insulator. With this structure, oxidation of the conductor 110 can be inhibited, and hydrogen can be prevented from entering the conductor 110.

Although the structure where the first insulator and the second insulator are stacked as the insulator 245 is illustrated, the present invention is not limited thereto. For example, the insulator 245 may have a single-layer structure or a stacked-layer structure of three or more layers.

<Component Materials of Semiconductor Device Semiconductor Device>

Component materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed in which silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is preferable to use, in particular, a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M.

Note that in this specification and the like, a metal oxide containing nitrogen is also collectively referred to as a metal oxide in some cases. A metal oxide containing nitrogen may be referred to as a metal oxynitride.

<Classification of Crystal Structures>

First, the classification of crystal structures of an oxide semiconductor is described with reference to FIG. 5A. FIG. 5A is a diagram showing the classification of crystal structures of an oxide semiconductor, typically IGZO (a metal oxide containing In, Ga, and Zn).

As shown in FIG. 5A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and polycrystal). Note that "Crystalline" excludes single crystal, poly crystal, and completely amorphous. "Crystal" includes single crystal and poly crystal.

Note that the structures in the thick frame in FIG. 5A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 5B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 5B and obtained by GIXD measurement may be hereinafter simply referred to as an XRD spectrum in this specification. The CAAC-IGZO film in FIG. 5B has a composition in the neighborhood of In:Ga:Zn=4:2:3 [atomic ratio]. The CAAC-IGZO film in FIG. 5B has a thickness of 500 nm.

In FIG. 5B, the horizontal axis represents 2θ [deg.], and the vertical axis represents Intensity [a.u.]. As shown in FIG. 5B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 5B, the peak at 2θ of around 310 is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 5C shows a diffraction pattern of the CAAC-IGZO film. FIG. 5C shows a diffraction pattern obtained by the NBED in which an electron beam is incident in the direction parallel to the substrate. The CAAC-IGZO film in FIG. 5C has a composition in the neighborhood of In:Ga:Zn=4:2:3 [atomic ratio]. In the nanobeam electron diffraction method, electron diffraction is performed with a probe diameter of 1 nm.

As shown in FIG. 5C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 5A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element Mmay be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] than the second region and has lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is lower than or equal to $1\times10^{17}$ cm$^{-3}$, preferably lower than or equal to $1\times10^{11}$ cm$^{-3}$, further preferably lower than or equal to $1\times10^{13}$ cm$^{-3}$, still further preferably lower than or equal to $1\times10^{9}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region in the oxide semiconductor and the concentration of silicon or carbon in the vicinity of an interface with in the channel formation region in the oxide semiconductor (the concentrations obtained by secondary ion mass spectrometry) are each set lower than or equal to $2\times10^{18}$ atoms/cm$^{3}$, preferably lower than or equal to $2\times10^{17}$ atoms/cm$^{3}$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to have normally-on characteristics. Thus, the concentration of an alkali metal or an alkaline earth metal in the channel formation region in the oxide semiconductor, which is obtained by SIMS, is set lower than or equal to $1\times10^{18}$ atoms/cm$^{3}$, preferably lower than or equal to $2\times10^{16}$ atoms/cm$^{3}$.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region in the oxide semiconductor, which is obtained by SIMS, is set lower than $5\times10^{19}$ atoms/cm$^{3}$, preferably lower than or equal to $5\times10^{18}$ atoms/cm$^{3}$, further preferably lower than or equal to $1\times10^{18}$ atoms/cm$^{3}$, still further preferably lower than or equal to $5\times10^{17}$ atoms/cm$^{3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region in the oxide semiconductor is preferably reduced as much as possible. Specifically, the hydrogen concentration in the channel formation region in the oxide semiconductor, which is obtained by SIMS, is set lower than $1\times10^{20}$ atoms/cm$^{3}$, preferably lower than $5\times10^{19}$ atoms/cm$^{3}$, further preferably lower than $1\times10^{19}$ atoms/cm$^{3}$, still further preferably lower than $5\times10^{18}$ atoms/cm$^{3}$, yet still further preferably lower than $1\times10^{18}$ atoms/cm$^{3}$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Manufacturing Method of Semiconductor Device>

Next, a method for manufacturing the semiconductor device of one embodiment of the present invention illustrated in FIG. 3A to FIG. 3D is described with reference to FIG. 9A to FIG. 20D.

Note that A of each drawing is a top view. Moreover, B of each drawing is a cross-sectional view corresponding to a portion indicated by dashed-dotted line A1-A2 in A of each drawing, and is also a cross-sectional view in the channel length direction of the transistor 200. Furthermore, C of each drawing is a cross-sectional view corresponding to a portion indicated by dashed-dotted line A3-A4 in A of each drawing, and is also a cross-sectional view in the channel width direction of the transistor 200. Furthermore, D of each drawing is a cross-sectional view of a portion indicated by dashed-dotted line A5-A6 in A of each drawing. Note that for clarity of the drawing, some components are not illustrated in the top view of A of each drawing.

Hereinafter, an insulating material for forming an insulator, a conductive material for forming a conductor, or a semiconductor material for forming a semiconductor can be deposited by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which a voltage applied to an electrode is changed in a pulsed manner. An RF sputtering method is mainly used in the case where an insulating film is formed, and a DC sputtering method is mainly used in the case where a metal conductive film is formed. The pulsed DC sputtering method is mainly used in the case where a compound such as an oxide, a nitride, or a carbide is deposited by a reactive sputtering method.

Note that the CVD method can be classified into a plasma CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In this case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD method, in which a reactant excited by plasma is used, and the like can be used.

A CVD method and an ALD method are different from a sputtering method in which particles ejected from a target or the like are deposited. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method, a film with a certain composition can be formed depending on the flow rate ratio of the source gases. For example, by a CVD method, by changing the flow rate ratio of the source gases during the deposition, a film in which the composition is continuously changed can be deposited. In the case where the film is formed while the flow rate ratio of the source gases is changed, as compared to the case where the film is formed using a plurality of deposition chambers, the time taken for the deposition can be shortened because the time taken for transfer or pressure adjustment is omitted. Thus, the productivity of the semiconductor device can be increased in some cases.

By an ALD method, a film with a certain composition can be formed by concurrently introducing a plurality of kinds of different precursors or controlling the number of cycles of each of the plurality of kinds of different precursors.

First, a substrate (not illustrated) is prepared, and the insulator 212 is formed over the substrate (see FIG. 9A to FIG. 9D). The insulator 212 is preferably formed by a sputtering method. By using a sputtering method that does not need to use a molecule containing hydrogen as a deposition gas, the hydrogen concentration in the insulator 212 can be reduced. Without limitation to a sputtering method, the insulator 212 may be formed by a CVD method, an MBE method, a PLD method, an ALD method, or the like as appropriate.

In this embodiment, for the insulator 212, silicon nitride is deposited by a pulsed DC sputtering method using a silicon target in an atmosphere containing a nitrogen gas. The use of the pulsed DC sputtering method can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are less likely to pass, such as silicon nitride, can inhibit diffusion of impurities such as water and hydrogen contained in a layer below the insulator 212. When an insulator through which copper is less likely to pass, such as silicon nitride, is used for the insulator 212, even in the case where a metal that is likely to diffuse, such as copper, is used for a conductor in a layer (not illustrated) below the insulator 212, upward diffusion of the metal through the insulator 212 can be inhibited.

Next, the insulator 214 is formed over the insulator 212 (see FIG. 9A to FIG. 9D). The insulator 214 is preferably formed by a sputtering method. By using a sputtering method that does not need to use a molecule containing hydrogen as a deposition gas, the hydrogen concentration in the insulator 214 can be reduced. Without limitation to a sputtering method, the insulator 214 may be formed by a CVD method, an MBE method, a PLD method, an ALD method, or the like as appropriate.

In this embodiment, for the insulator 214, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. Here, RF power may be applied to the substrate. The amount of oxygen supplied to a layer below the insulator 214 can be controlled depending on the amount of the RF power applied to the substrate. The RF power is higher than or equal to 0 W/cm$^2$ and lower than or equal to 1.86 W/cm$^2$. In other words, the supply amount of oxygen can be changed to be appropriate for the characteristics of the transistor, with the RF power used at the time of forming the insulator 214. Accordingly, an appropriate amount of oxygen for improving the reliability of the transistor can be supplied. The RF frequency is preferably 10 MHz or higher. The typical frequency is 13.56 MHz. The higher the RF frequency is, the less damage the substrate gets.

A metal oxide having an amorphous structure and an excellent function of capturing or fixing hydrogen, such as aluminum oxide, is preferably used for the insulator 214. In this case, the insulator 214 captures or fixes hydrogen contained in the insulator 216 and the like and prevents the hydrogen from diffusing into the oxide 230. In particular, it is preferable to use aluminum oxide having an amorphous structure or amorphous aluminum oxide for the insulator 214 because hydrogen can be captured or fixed more effectively in some cases. Accordingly, the transistor 200 and a semiconductor device which have favorable characteristics and high reliability can be manufactured.

Next, the insulator 216 is formed over the insulator 214. The insulator 216 is preferably formed by a sputtering method. By using a sputtering method that does not need to use a molecule containing hydrogen as a deposition gas, the hydrogen concentration in the insulator 216 can be reduced. Without limitation to a sputtering method, the insulator 216 may be formed by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of the pulsed DC sputtering method can achieve more uniform film thickness and improve the sputtering rate and film quality.

The insulator 212, the insulator 214, and the insulator 216 are preferably successively formed without exposure to the air. For example, a multi-chamber deposition apparatus is used. As a result, the amounts of hydrogen in the formed insulator 212, insulator 214, and insulator 216 can be reduced, and furthermore, entry of hydrogen into the films in intervals between deposition steps can be inhibited.

Then, an opening reaching the insulator 214 is formed in the insulator 216. Examples of the opening include a groove and a slit. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is formed. The conductive film to be the conductor 205a desirably includes a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, titanium nitride is deposited as the conductive film to be the conductor 205a. When such a metal nitride is used for a layer under the conductor 205b, oxidation of the conductor 205b by the insulator 216 or the like can be inhibited. Furthermore, even when a metal that is likely to diffuse, such as copper, is used for the conductor 205b, the metal can be prevented from diffusing to the outside through the conductor 205a.

Next, a conductive film to be the conductor 205b is formed. Tantalum, tungsten, titanium, molybdenum, aluminum, copper, a molybdenum-tungsten alloy, or the like can be used for the conductive film to be the conductor 205b. The conductive film can be formed by a plating method, a sputtering method, a CVD method, an MBE method, a PLD method, an ALD method, or the like. In this embodiment, tungsten is deposited for the conductive film to be the conductor 205b.

Next, by performing CMP treatment, the conductive film to be the conductor 205a and the conductive film to be the conductor 205b are partly removed to expose the insulator 216 (see FIG. 9A to FIG. 9D). As a result, the conductor 205a and the conductor 205b remain only in the opening portion. Note that the insulator 216 is partly removed by the CMP treatment in some cases.

Next, the insulator 222 is formed over the insulator 216 and the conductor 205 (see FIG. 10A to FIG. 10D). An insulator containing an oxide of one or both of aluminum and hafnium is preferably formed as the insulator 222. Note that as the insulator containing an oxide of one or both of aluminum and hafnium, aluminum oxide, hafnium oxide, an oxide containing aluminum and hafnium (hafnium aluminate), or the like is preferably used. Alternatively, hafnium-zirconium oxide is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be formed by a sputtering method, a CVD method, an MBE method, a PLD method, an ALD method, or the like. In this embodiment, for the insulator 222, hafnium oxide is deposited by an ALD method.

Sequentially, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment is performed in a nitrogen gas or inert gas atmosphere.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, treatment is performed with a flow rate ratio of a nitrogen gas and an oxygen gas of 4 slm:1 slm at 400° C. for one hour after the formation of the insulator 222. By the heat treatment, impurities such as water and hydrogen contained in the insulator 222 can be removed, for example. In the case where an oxide containing hafnium is used for the insulator 222, the insulator 222 is partly crystallized by the heat treatment in some cases. The heat treatment can also be performed after the formation of the insulator 224, for example.

Next, an insulating film 224A is formed over the insulator 222 (see FIG. 10A to FIG. 10D). The insulating film 224A can be formed by a sputtering method, a CVD method, an MBE method, a PLD method, an ALD method, or the like. In this embodiment, for the insulating film 224A, silicon oxide is deposited by a sputtering method. By using a sputtering method that does not need to use a molecule containing hydrogen as a deposition gas, the hydrogen concentration in the insulating film 224A can be reduced. The hydrogen concentration in the insulating film 224A is preferably reduced because the insulating film 224A is in contact with the oxide 230a in a later step.

Next, an oxide film 230A and an oxide film 230B are formed in this order over the insulating film 224A (see FIG. 10A to FIG. 10D). Note that it is preferable to form the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be formed by a sputtering method, a CVD method, an MBE method, a PLD method, an ALD method, or the like. An ALD method is preferably employed for the formation of the oxide film 230A and the oxide film 230B, in which case a film with a uniform thickness can be formed even in a groove or an opening portion having a high aspect ratio. Employing a PEALD method is preferable because the oxide film 230A and the oxide film 230B can be formed at a lower temperature than that in the case of employing a thermal ALD method. In this embodiment, the oxide film 230A and the oxide film 230B are formed by a sputtering method.

For example, in the case where the oxide film 230A and the oxide film 230B are formed by a sputtering method, oxygen or a mixed gas of oxygen and a rare gas is used as a sputtering gas. Increasing the proportion of oxygen contained in the sputtering gas can increase the amount of excess oxygen in the formed oxide films. In the case where the oxide films are formed by a sputtering method, the above In-M-Zn oxide target or the like can be used.

In particular, when the oxide film 230A is formed, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor including an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor including an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is formed by a sputtering method using an oxide target with In:Ga:Zn=1: 3:4 [atomic ratio]. In addition, the oxide film 230B is formed by a sputtering method using an oxide target with In:Ga: Zn=4:2:4.1 [atomic ratio], an oxide target with In:Ga:Zn=1: 1:1 [atomic ratio], or an oxide target with In:Ga:Zn=1:1:2 [atomic ratio]. Note that each of the oxide films is preferably formed so as to have characteristics required for the oxide 230a and the oxide 230b by selecting the deposition conditions and the atomic ratios as appropriate.

The insulating film 224A, the oxide film 230A, and the oxide film 230B are preferably formed by a sputtering method without exposure to the air. For example, a multi-chamber deposition apparatus is used. As a result, entry of hydrogen into the insulating film 224A, the oxide film 230A, and the oxide film 230B in intervals between deposition steps can be inhibited.

Next, heat treatment is preferably performed. The heat treatment can be performed in a temperature range where the oxide film 230A and the oxide film 230B do not become polycrystals, i.e., at higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment is performed in a nitrogen gas or inert gas atmosphere.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent entry of moisture or the like into the oxide film 230A, the oxide film 230B, and the like as much as possible.

In this embodiment, the heat treatment is performed at 400° C. for one hour with the flow rate ratio of nitrogen gas to oxygen gas being 4 slm:1 slm. By the heat treatment using the oxygen gas, impurities such as carbon, water, and hydrogen in the oxide film 230A and the oxide film 230B can be reduced, for example. Furthermore, the reduction of impurities in the films improves the crystallinity of the oxide film 230B, thereby offering a dense structure with higher density. Thus, crystalline regions in the oxide film 230A and the oxide film 230B are expanded, so that in-plane variations of the crystalline regions in the oxide film 230A and the oxide film 230B can be reduced. Accordingly, an in-plane variation of electrical characteristics of the transistor 200 can be reduced.

By performing heat treatment, hydrogen in the insulator 216, the insulating film 224A, the oxide film 230A, and the oxide film 230B moves into the insulator 222 and is absorbed by the insulator 222. In other words, it can be said that hydrogen in the insulator 216, the insulating film 224A, the oxide film 230A, and the oxide film 230B diffuses into the insulator 222. Accordingly, the hydrogen concentration in the insulator 222 increases, and the hydrogen concentrations in the insulator 216, the insulating film 224A, the oxide film 230A, and the oxide film 230B decrease.

In particular, the insulating film 224A functions as a gate insulator of the transistor 200, and the oxide film 230A and the oxide film 230B function as a channel formation region of the transistor 200. Thus, the transistor 200 preferably includes the insulating film 224A, the oxide film 230A, and the oxide film 230B with reduced hydrogen concentrations because favorable reliability can be obtained.

Next, a conductive film 242A is formed over the oxide film 230B (see FIG. 10A to FIG. 10D). The conductive film 242A can be formed by a sputtering method, a CVD method, an MBE method, a PLD method, an ALD method, or the like. For example, for the conductive film 242A, tantalum nitride is deposited by a sputtering method. Note that heat treatment may be performed before the formation of the conductive film 242A. This heat treatment may be performed under reduced pressure, and the conductive film 242A may be successively formed without exposure to the air. The treatment can remove moisture and hydrogen adsorbed onto the surface of the oxide film 230B, and further can reduce the moisture concentration and the hydrogen concentration in the oxide film 230A and the oxide film 230B. The heat treatment is preferably performed at a temperature higher than or equal to 100° C. and lower than or equal to 400° C. In this embodiment, the heat treatment is performed at 200° C.

Next, an insulating film 271A is formed over the conductive film 242A (see FIG. 10A to FIG. 10D). The insulating film 271A can be formed by a sputtering method, a CVD method, an MBE method, a PLD method, an ALD method, or the like. As the insulating film 271A, an insulating film having a function of inhibiting passage of oxygen is preferably used. For example, for the insulating film 271A, aluminum oxide or silicon nitride may be deposited by a sputtering method.

Note that the conductive film 242A and the insulating film 271A are preferably formed by a sputtering method without exposure to the air. For example, a multi-chamber deposition apparatus is used. As a result, the amounts of hydrogen in the conductive film 242A and the insulating film 271A can be reduced, and furthermore, entry of hydrogen into the films in intervals between deposition steps can be inhibited. In the case where a hard mask is provided over the insulating film 271A, a film to be the hard mask is preferably successively formed without exposure to the air.

Next, the insulating film 224A, the oxide film 230A, the oxide film 230B, the conductive film 242A, and the insulating film 271A are processed into island shapes by a lithography method to form the insulator 224, the oxide 230a, the oxide 230b, a conductive layer 242B, and an insulating layer 271B (see FIG. 11A to FIG. 11D). Here, the insulator 224, the oxide 230a, the oxide 230b, the conductive layer 242B, and the insulating layer 271B are formed to at least partly overlap with the conductor 205. A dry etching method or a wet etching method can be used for the processing. A dry etching method is suitable for microfabrication. The insulating film 224A, the oxide film 230A, the oxide film 230B, the conductive film 242A, and the insulating film 271A may be processed under different conditions.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask may be formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by a dry etching process such as ashing, a wet etching process, a wet etching process after a dry etching process, or a dry etching process after a wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B is used as a hard mask.

Figure 11A:
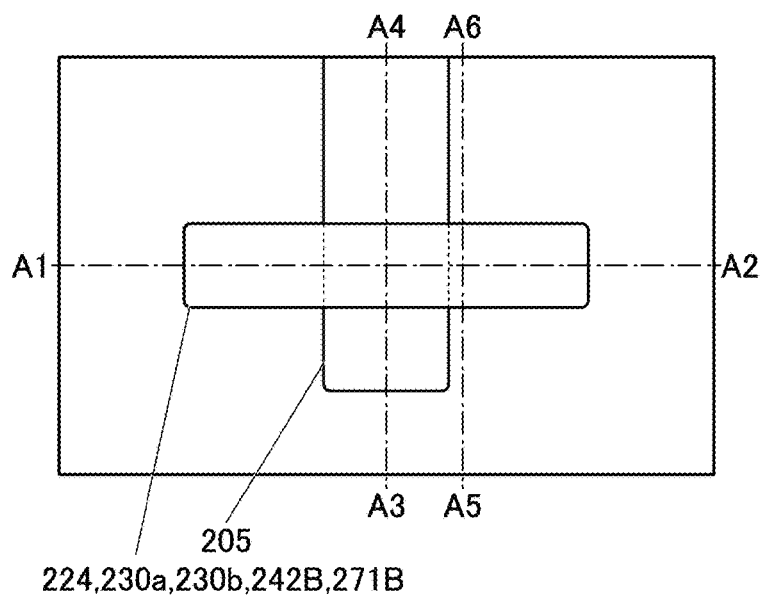
FIG. 11A is a top view illustrating a method for manufacturing a semiconductor device of one embodiment of the present invention.
Figure 11C:
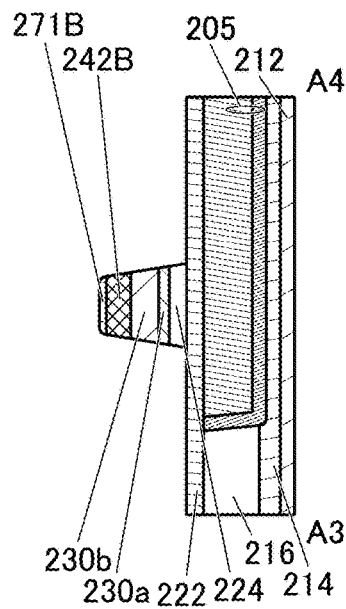
FIG. 11B to FIG. 11D are cross-sectional views illustrating a method for manufacturing a semiconductor device of one embodiment of the present invention.
Figure 11B:
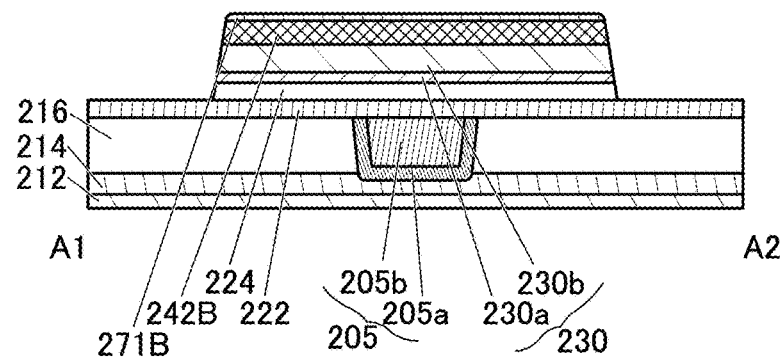
Figure 11D:
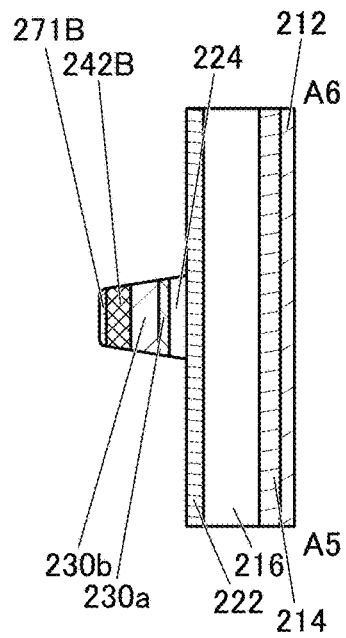
Figure 12A:
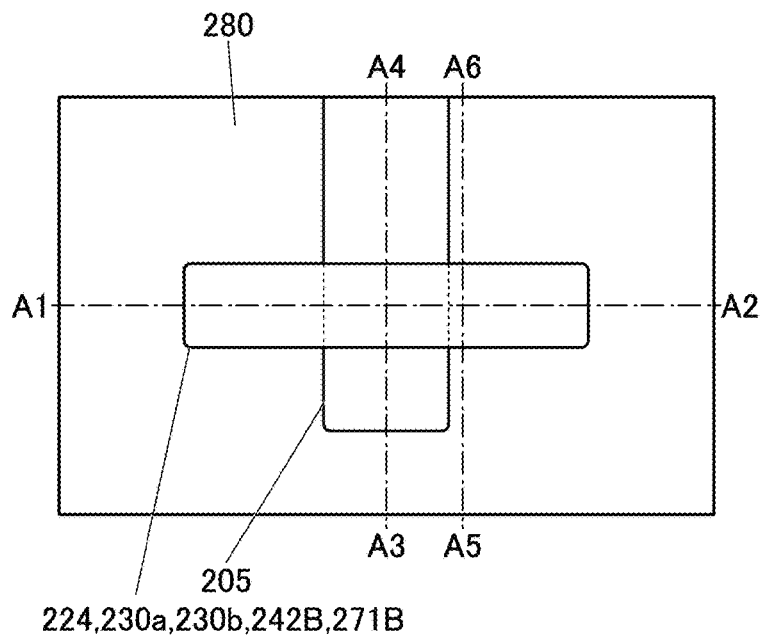
FIG. 12A is a top view illustrating a method for manufacturing a semiconductor device of one embodiment of the present invention.
Figure 12C:
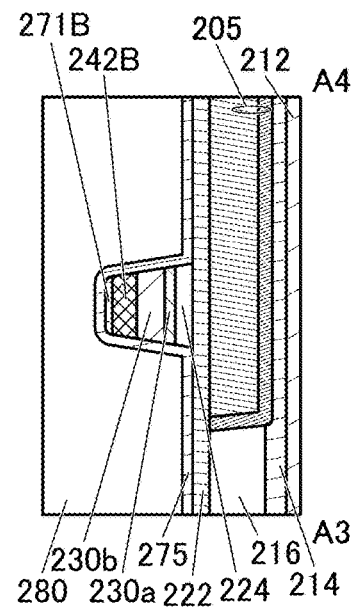
FIG. 12B to FIG. 12D are cross-sectional views illustrating a method for manufacturing a semiconductor device of one embodiment of the present invention.
Figure 12B:
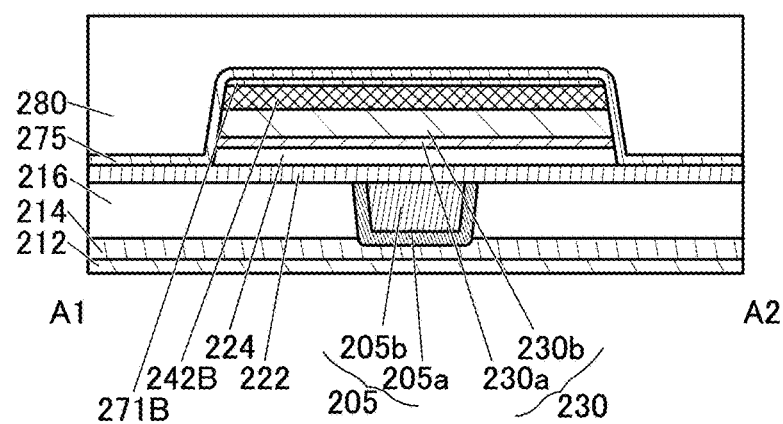
Figure 12D:
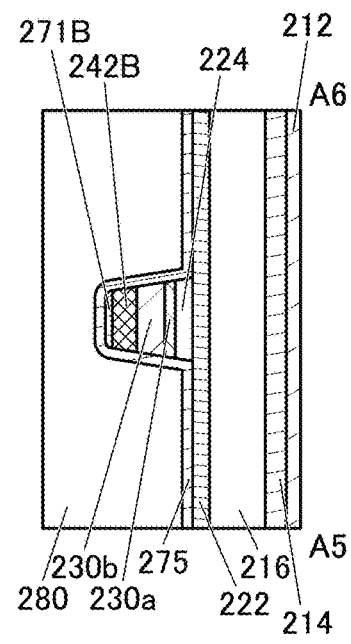

Here, the insulating layer 271B functions as a mask for the conductive layer 242B; thus, as illustrated in FIG. 11B to FIG. 11D, the conductive layer 242B does not have a curved surface between the side surface and the top surface. Thus, end portions at the intersections of the side surfaces and the top surfaces of the conductor 242a and the conductor 242b illustrated in FIG. 3B and FIG. 3D are angular. The cross-sectional area of the conductor 242 in the case where the end portion at the intersection of the side surface and the top surface of the conductor 242 is angular is larger than that in the case where the end portion is rounded. Accordingly, the resistance of the conductor 242 is reduced, so that the on-state current of the transistor 200 can be increased.

Furthermore, as illustrated in FIG. 11B to FIG. 11D, the sections of the insulator 224, the oxide 230a, the oxide 230b, the conductive layer 242B, and the insulating layer 271B may have tapered shapes. In this specification and the like, a tapered shape indicates a shape in which at least part of a side surface of a structure is inclined to a substrate surface. For example, the angle formed between the inclined side surface and the substrate surface (the angle is also referred to as a taper angle) is preferably less than 90°. Each of the insulator 224, the oxide 230a, the oxide 230b, the conductive layer 242B, and the insulating layer 271B may have a taper angle greater than or equal to 60° and less than 90°. With such tapered shapes on the sections, the coverage with the insulator 275 and the like can be improved in a later step, so that defects such as a void can be reduced.

Not being limited to the above, the insulator 224, the oxide 230a, the oxide 230b, the conductive layer 242B, and the insulating layer 271B may be processed to have side surfaces that are substantially perpendicular to the top surface of the insulator 222. With such a structure, a plurality of the transistors 200 can be provided with high density in a small area.

A by-product generated in the above etching step is sometimes formed in a layered manner on the side surfaces of the insulator 224, the oxide 230a, the oxide 230b, the conductive layer 242B, and the insulating layer 271B. In this case, the layered by-product is formed between the insulator 275 and the insulator 224, the oxide 230a, the oxide 230b, the conductive layer 242B, and the insulating layer 271B. Hence, the layered by-product formed in contact with the top surface of the insulator 222 is preferably removed.

Next, the insulator 275 is formed to cover the insulator 224, the oxide 230a, the oxide 230b, the conductive layer 242B, and the insulating layer 271B (see FIG. 12A to FIG. 12D). Here, it is preferable that the insulator 275 be in close contact with the top surface of the insulator 222 and the side surface of the insulator 224. The insulator 275 can be formed by a sputtering method, a CVD method, an MBE method, a PLD method, an ALD method, or the like. The insulator 275 is preferably formed using an insulating film having a function of inhibiting passage of oxygen. For example, as the insulator 275, aluminum oxide may be deposited by a sputtering method, and silicon nitride may be deposited thereover by a PEALD method. When the insulator 275 has such a stacked-layer structure, the function of inhibiting diffusion of impurities such as water or hydrogen and oxygen is improved in some cases.

In this manner, the oxide 230a, the oxide 230b, and the conductive layer 242B can be covered with the insulator 275 and the insulating layer 271B, which have a function of inhibiting diffusion of oxygen. This structure can suppress direct diffusion of oxygen from the insulator 280 or the like into the insulator 224, the oxide 230a, the oxide 230b, and the conductive layer 242B in a later step Next, an insulating film to be the insulator 280 is formed over the insulator 275. The insulating film can be formed by a sputtering method, a CVD method, an MBE method, a PLD method, an ALD method, or the like. A silicon oxide film may be formed by a sputtering method as the insulating film, for example. When the insulating film to be the insulator 280 is formed by a sputtering method in an oxygen-containing atmosphere, the insulator 280 containing excess oxygen can be formed. Since a molecule containing hydrogen is not used as a deposition gas in the sputtering method, the concentration of hydrogen in the insulator 280 can be reduced. Note that heat treatment may be performed before the insulating film is formed. The heat treatment may be performed under reduced pressure, and the insulating film may be successively formed without exposure to the air. The treatment can remove moisture and hydrogen adsorbed onto the surface of the insulator 275 and the like, and further can reduce the moisture concentration and the hydrogen concentration in the oxide 230a, the oxide 230b, and the insulator 224. For the heat treatment, the above heat treatment conditions can be used.

Next, the insulating film to be the insulator 280 is subjected to CMP treatment, so that the insulator 280 with a flat top surface is formed (see FIG. 12A to FIG. 12D). Note that, for example, silicon nitride may be deposited over the insulator 280 by a sputtering method and CMP treatment may be performed on the silicon nitride until the insulator 280 is reached.

Then, part of the insulator 280, part of the insulator 275, part of the insulating layer 271B, and part of the conductive layer 242B are processed to form an opening reaching the oxide 230b. The opening is preferably formed to overlap with the conductor 205. The insulator 271a, the insulator 271b, the conductor 242a, and the conductor 242b are formed through the formation of the opening (see FIG. 13A to FIG. 13D).

Figure 13A:
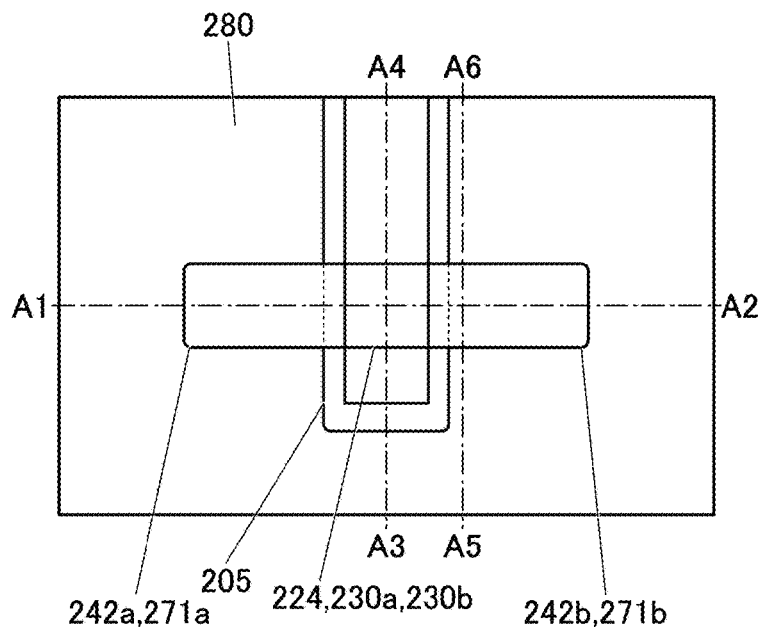
FIG. 13A is a top view illustrating a method for manufacturing a semiconductor device of one embodiment of the present invention.
Figure 13C:
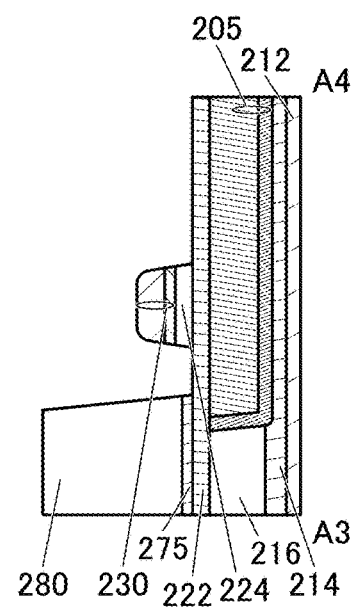
FIG. 13B to FIG. 13D are cross-sectional views illustrating a method for manufacturing a semiconductor device of one embodiment of the present invention.
Figure 13B:
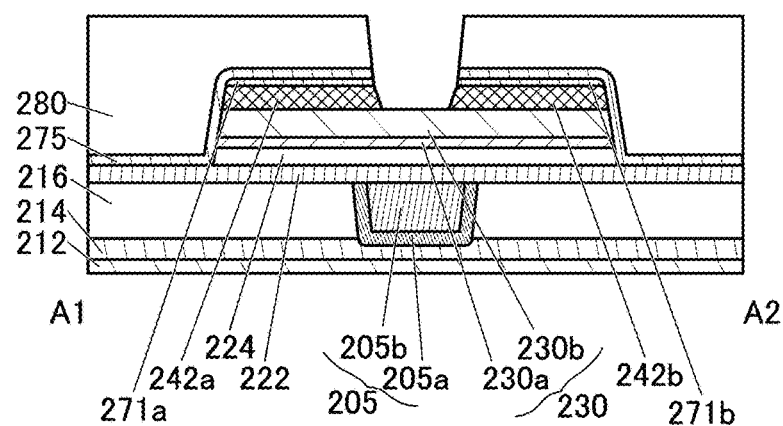
Figure 13D:
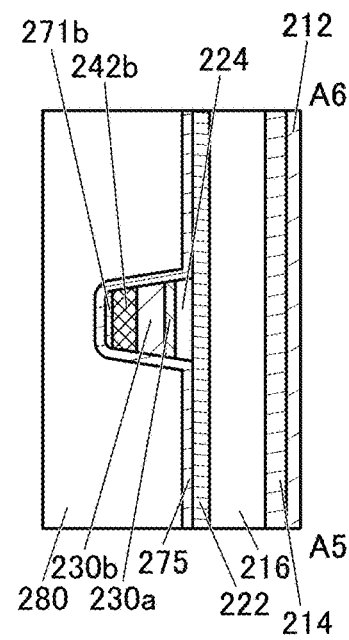

As illustrated in FIG. 13B and FIG. 13C, the side surfaces of the insulator 280, the insulator 275, and the insulator 271 and the conductor 242 may be tapered. The taper angle of the insulator 280 is larger than that of the conductor 242 in some cases. Although not illustrated in FIG. 13A to FIG. 13C, the upper portion of the oxide 230b is removed in some cases when the opening is formed.

The part of the insulator 280, the part of the insulator 275, the part of the insulating layer 271B, and the part of the conductive layer 242B can be processed by a dry etching method or a wet etching method. A dry etching method is suitable for microfabrication. The processing may be performed under different conditions. For example, the part of the insulator 280 may be processed by a dry etching method, the part of the insulator 275 and the part of the insulating layer 271B may be processed by a wet etching method, and the part of the conductive layer 242B may be processed by a dry etching method.

Here, impurities might be attached onto the side surface of the oxide 230a, the top surface and the side surface of the oxide 230b, the side surface of the conductor 242, the side surface of the insulator 280, and the like or the impurities might be diffused thereinto. A step of removing the impurities may be performed. In addition, a damaged region might be formed on the surface of the oxide 230b by the above dry etching. The damaged region may be removed. The impurities come from components contained in the insulator 280, the insulator 275, part of the insulating layer 271B, and the conductive layer 242B; components contained in a member of an apparatus used to form the opening; and components contained in a gas or a liquid used for etching, for instance. Examples of the impurities include hafnium, aluminum, silicon, tantalum, fluorine, and chlorine.

In particular, impurities such as aluminum and silicon hinder the oxide 230b from becoming a CAAC-OS. It is thus preferable to reduce or remove impurity elements such as aluminum and silicon, which hinder the oxide from becoming a CAAC-OS. For example, the concentration of aluminum atoms in the oxide 230b and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an amorphous-like oxide semiconductor (a-like OS) is referred to as a non-CAAC region in some cases. In the non-CAAC region, the density of the crystal structure is reduced to increase $V_OH$; thus, the transistor is likely to be normally on. Hence, the non-CAAC region in the oxide 230b is preferably reduced or removed.

In contrast, the oxide 230b preferably has a layered CAAC structure. In particular, the CAAC structure preferably reaches a lower edge portion of a drain in the oxide 230b. Here, in the transistor 200, the conductor 242a or the conductor 242b, and its vicinity function as a drain. In other words, the oxide 230b in the vicinity of the lower edge portion of the conductor 242a (conductor 242b) preferably has a CAAC structure. In this manner, the damaged region of the oxide 230b is removed and the CAAC structure is formed also in the edge portion of the drain, which significantly affects the drain withstand voltage, so that variation in the electrical characteristics of the transistor 200 can be further suppressed. In addition, the reliability of the transistor 200 can be improved.

In order to remove impurities and the like attached to the surface of the oxide 230b in the above etching step, cleaning treatment is performed. Examples of the cleaning method include wet cleaning using a cleaning solution (also can be referred to as wet etching process), plasma treatment using plasma, and cleaning by heat treatment, and any of these cleanings may be performed in combination as appropriate. Note that the cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

For the ultrasonic cleaning, a frequency higher than or equal to 200 kHz is preferable, and a frequency higher than or equal to 900 kHz is further preferable. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted ammonia water is performed. The cleaning treatment can remove impurities that are attached onto the surfaces of the oxide 230a, the oxide 230b, and the like or diffused into the oxide 230a, the oxide 230b, and the like. Furthermore, the crystallinity of the oxide 230b can be increased.

After the etching or the cleaning treatment, heat treatment may be performed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce oxygen vacancies $V_O$. In addition, the crystallinity of the oxide 230b can be improved by the heat treatment. The heat treatment may be performed under reduced pressure. Alternatively, heat treatment may be performed in an oxygen atmosphere, and then heat treatment may be successively performed in a nitrogen atmosphere without exposure to the air.

Figure 14A:
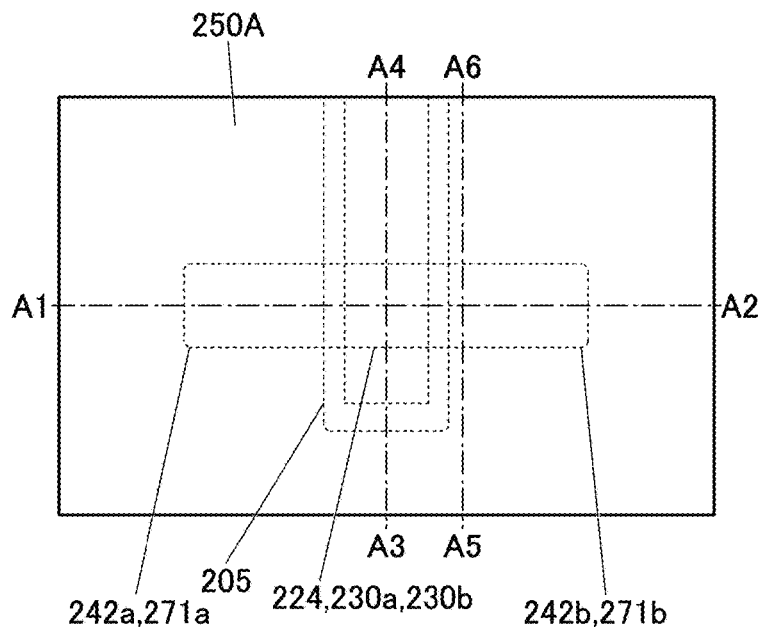
FIG. 14A is a top view illustrating a method for manufacturing a semiconductor device of one embodiment of the present invention.
Figure 14B:
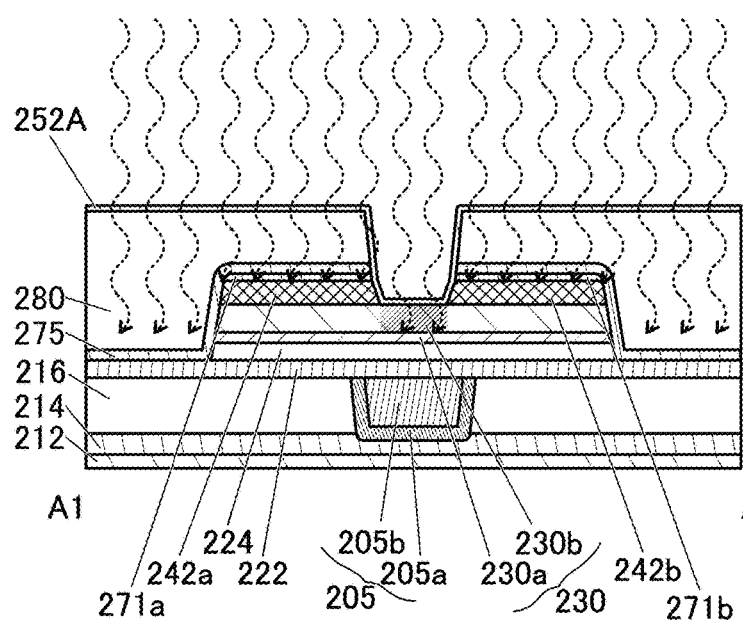
FIG. 14B to FIG. 14D are cross-sectional views illustrating a method for manufacturing a semiconductor device of one embodiment of the present invention.
Figure 14C:
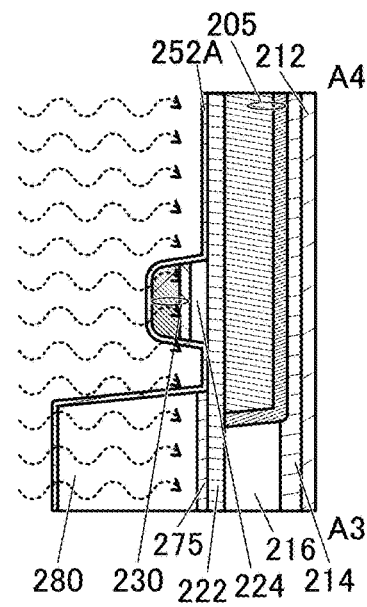

Next, an insulating film 252A is formed (see FIG. 14A to FIG. 14D). The insulating film 252A can be formed by a sputtering method, a CVD method, an MBE method, a PLD method, an ALD method, or the like. The insulating film 252A is preferably formed by an ALD method. As described above, it is preferable to form the insulating film 252A to have a small thickness, and an unevenness of the thickness needs to be reduced. In contrast, an ALD method is a deposition method in which a precursor and a reactant (e.g., oxidizer) are alternately introduced, and the film thickness can be adjusted with the number of repetition times of the cycle; thus, accurate control of the film thickness is possible. Furthermore, as illustrated in FIG. 14B and FIG. 14C, the insulating film 252A needs to be formed on the bottom surface and the side surface of the opening formed in the insulator 280 and the like so as to have good coverage. In particular, it is preferable that the insulating film 252A be formed on the top surface and the side surface of the oxide 230 and the side surface of the conductor 242 so as to have good coverage. An atomic layer can be deposited one by one on the bottom surface and the side surface of the opening, whereby the insulating film 252A can be formed in the opening with good coverage.

When the insulating film 252A is formed by an ALD method, ozone ($O_3$), oxygen ($O_2$), water ($H_2O$), or the like can be used as the oxidizer. When an oxidizer without containing hydrogen, such as ($O_3$) or ($O_2$), is used, the amount of hydrogen diffusing into the oxide 230$b$ can be reduced.

In this embodiment, aluminum oxide is deposited for the insulating film 252A by a thermal ALD method.

Next, it is preferable to perform microwave treatment in an atmosphere containing oxygen (see FIG. 14A to FIG. 14D). Here, the microwave treatment refers to, for example, treatment using an apparatus including a power source that generates high-density plasma with the use of a microwave. Note that in this specification and the like, a microwave refers to an electromagnetic wave having a frequency greater than or equal to 300 MHz and less than or equal to 300 GHz.

Figure 14D:
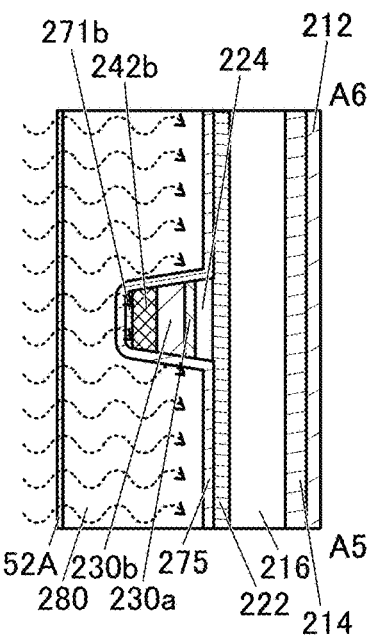
Figure 15A:
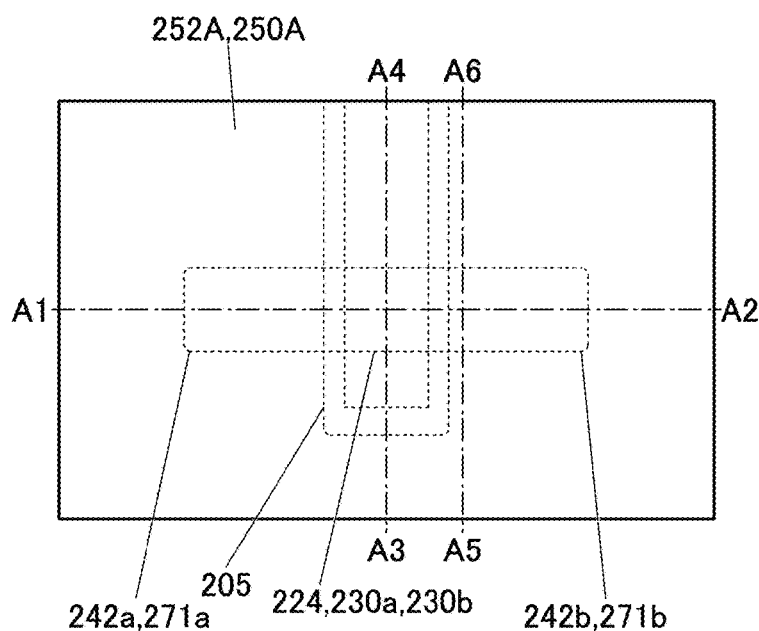
FIG. 15A is a top view illustrating a method for manufacturing a semiconductor device of one embodiment of the present invention.
Figure 15C:
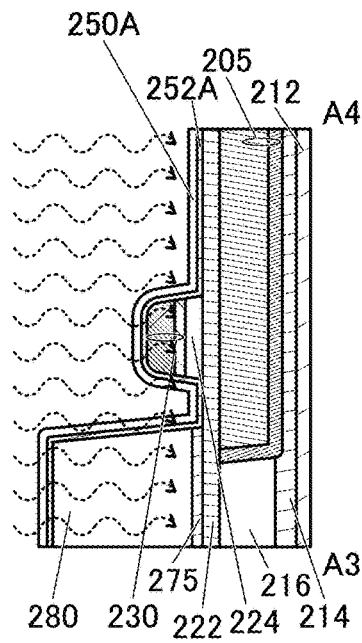
FIG. 15B to FIG. 15D are cross-sectional views illustrating a method for manufacturing a semiconductor device of one embodiment of the present invention.
Figure 15B:
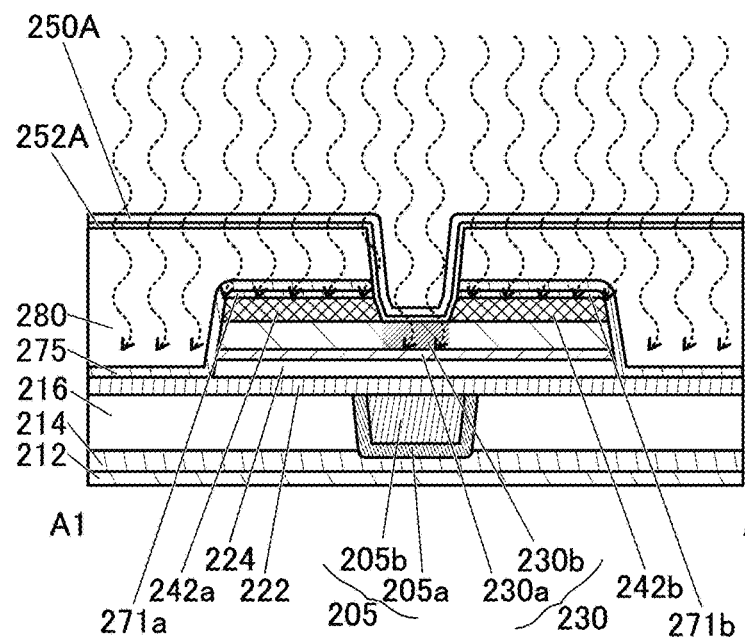
Figure 15D:
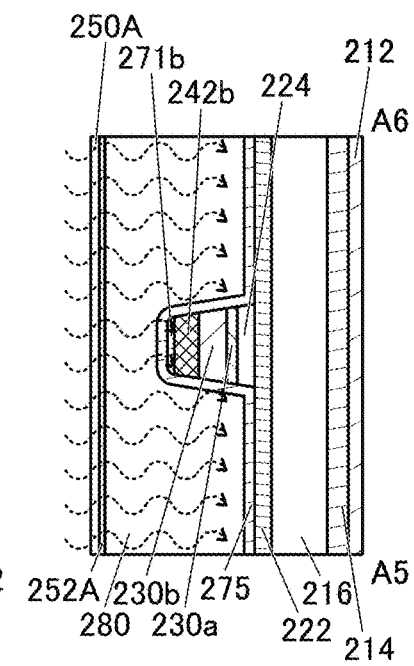
Figure 16A:
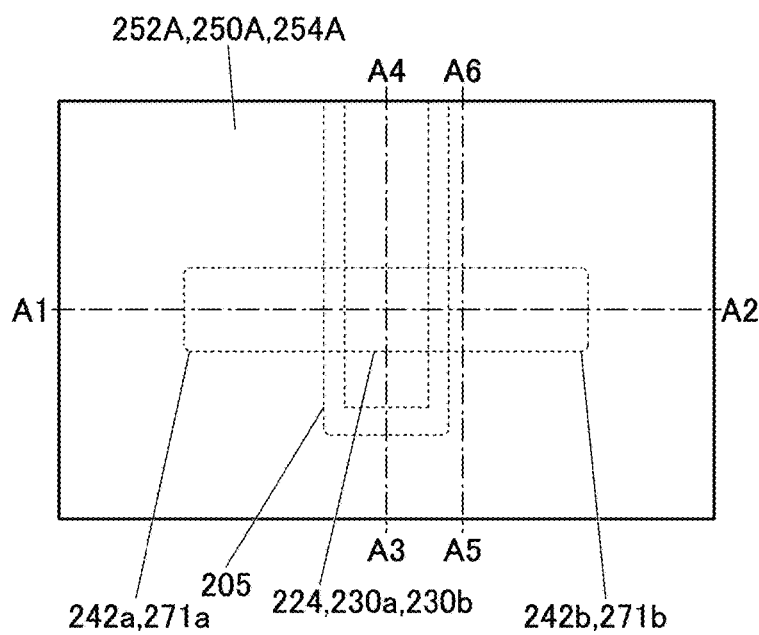
FIG. 16A is a top view illustrating a method for manufacturing a semiconductor device of one embodiment of the present invention.
Figure 16C:
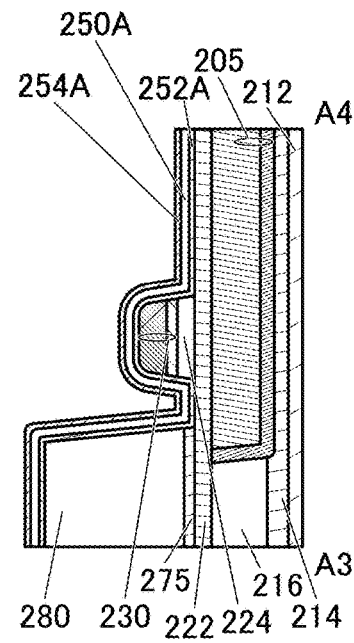
FIG. 16B to FIG. 16D are cross-sectional views illustrating a method for manufacturing a semiconductor device of one embodiment of the present invention.
Figure 16B:
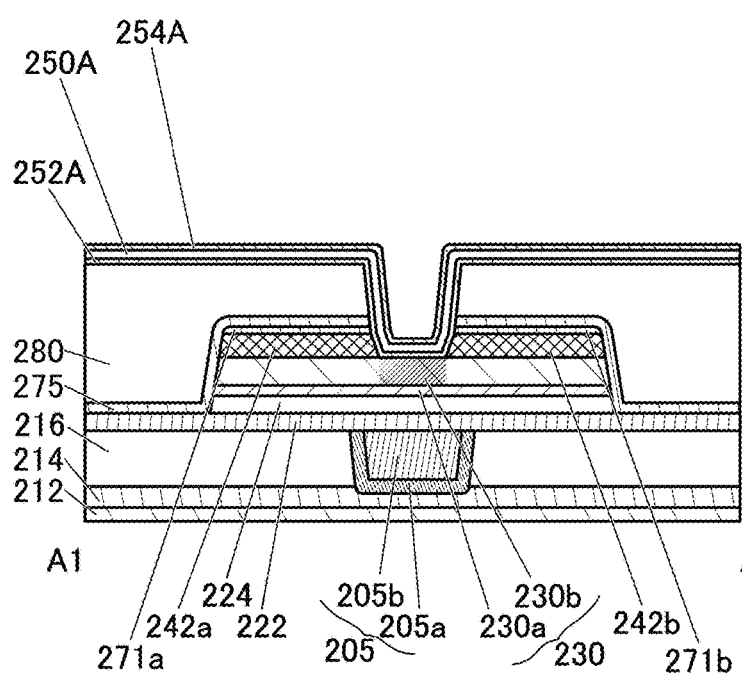
Figure 16D:
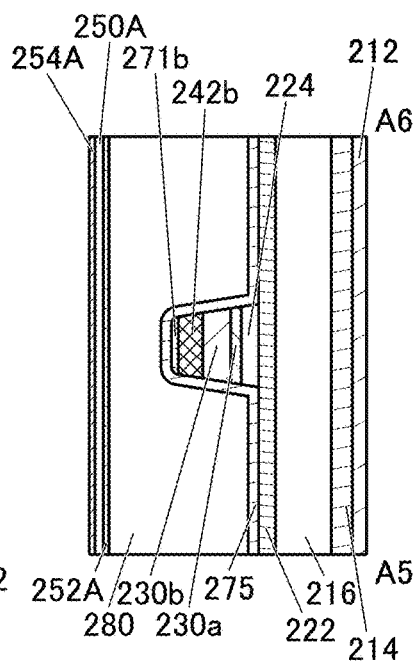
Figure 17A:
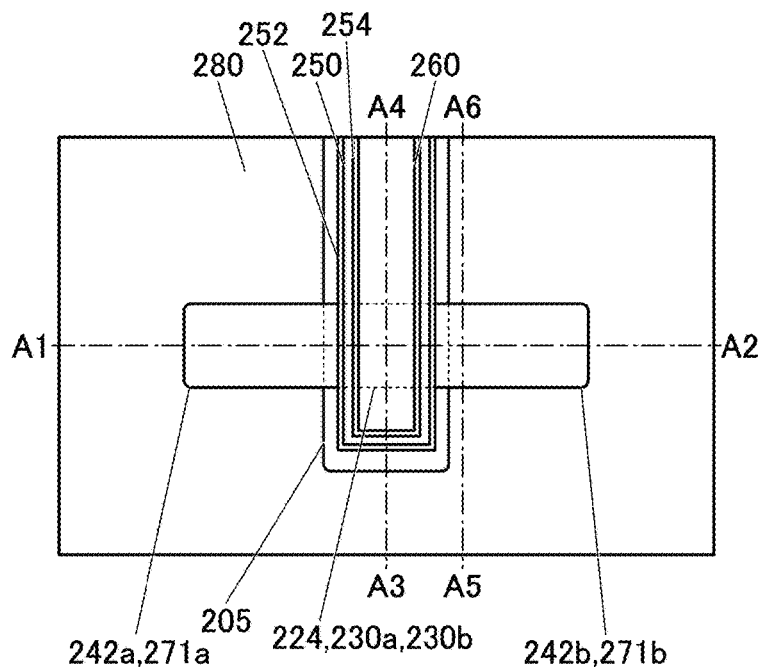
FIG. 17A is a top view illustrating a method for manufacturing a semiconductor device of one embodiment of the present invention.
Figure 17C:
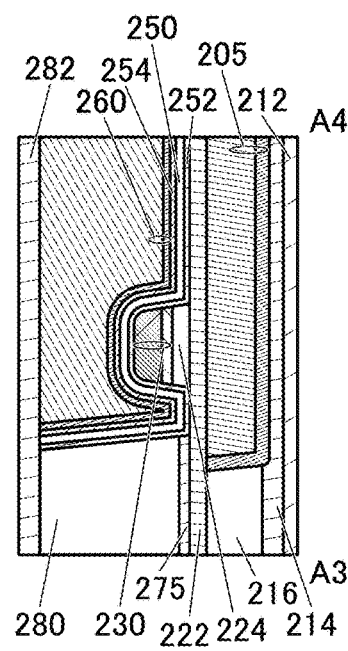
FIG. 17B to FIG. 17D are cross-sectional views illustrating a method for manufacturing a semiconductor device of one embodiment of the present invention.
Figure 17B:
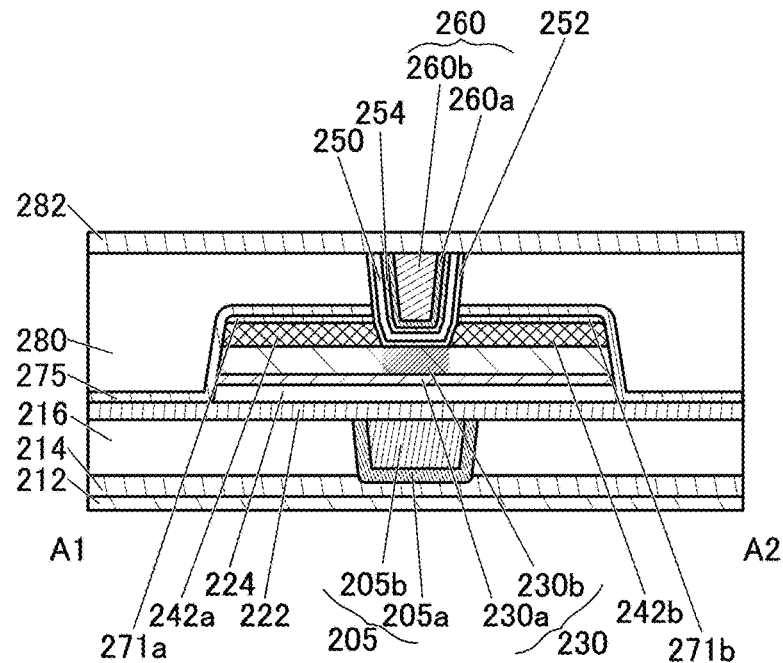
Figure 17D:
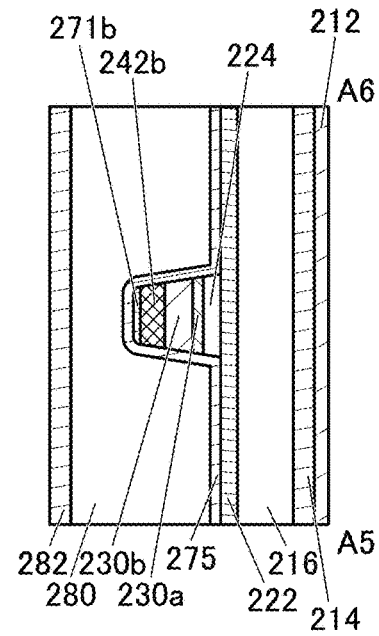
Figure 18A:
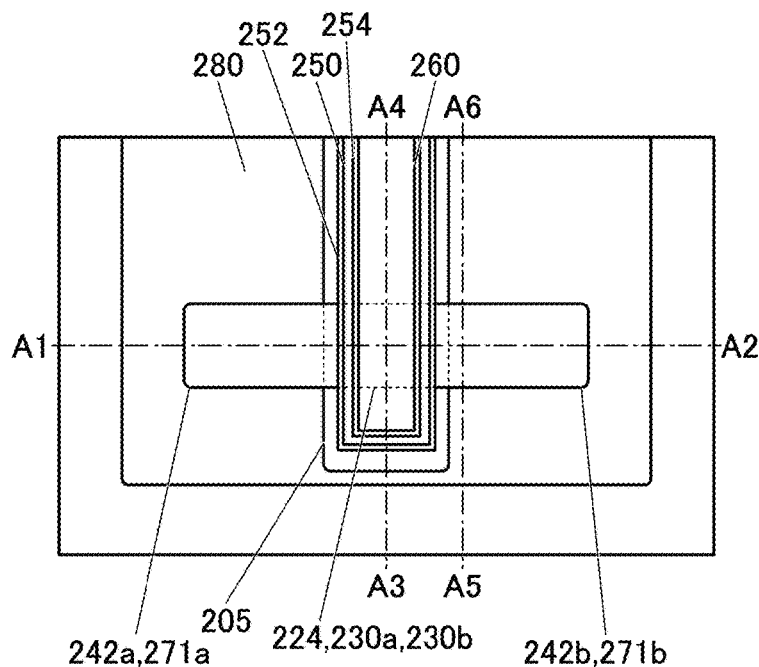
FIG. 18A is a top view illustrating a method for manufacturing a semiconductor device of one embodiment of the present invention.
Figure 18B:
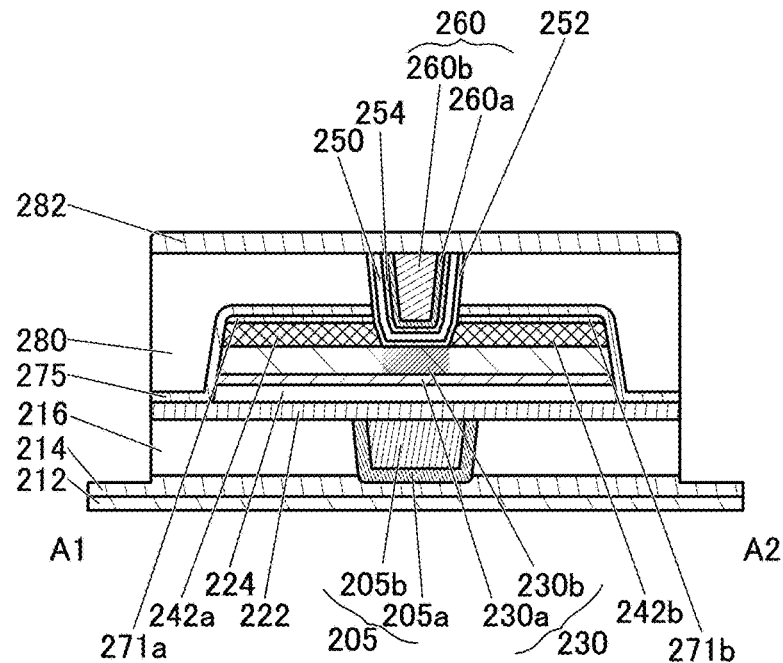
FIG. 18B to FIG. 18D are cross-sectional views illustrating a method for manufacturing a semiconductor device of one embodiment of the present invention.
Figure 18C:
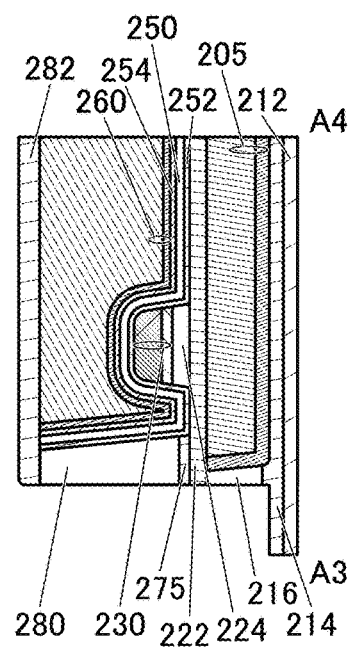
Figure 18D:
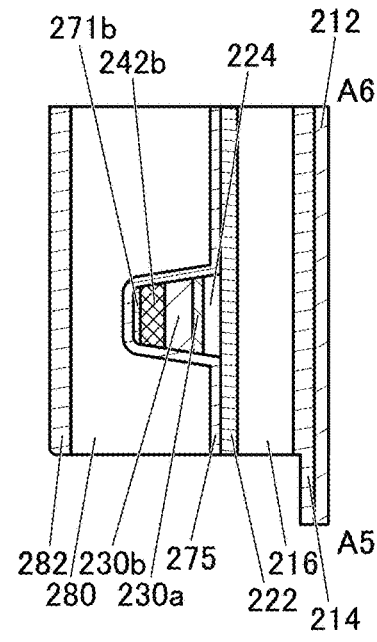
Figure 19A:
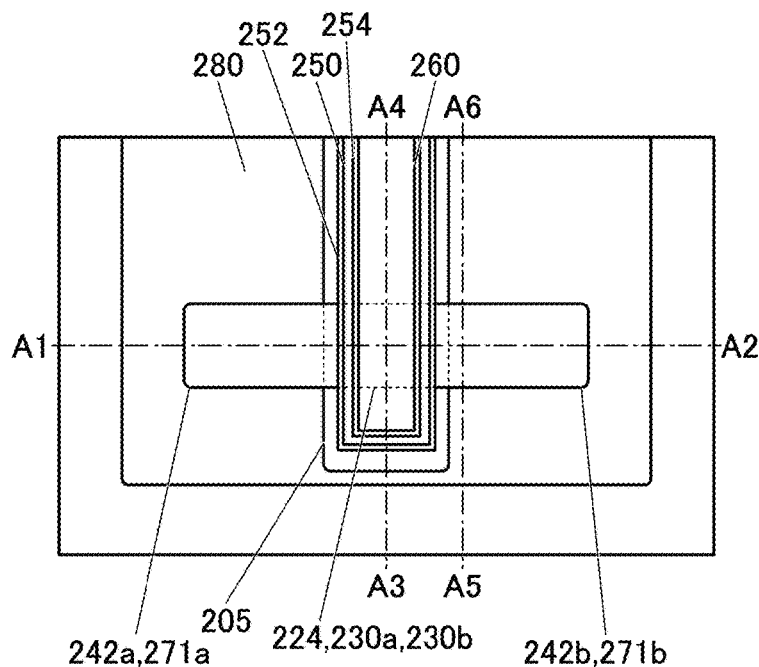
FIG. 19A is a top view illustrating a method for manufacturing a semiconductor device of one embodiment of the present invention.
Figure 19C:
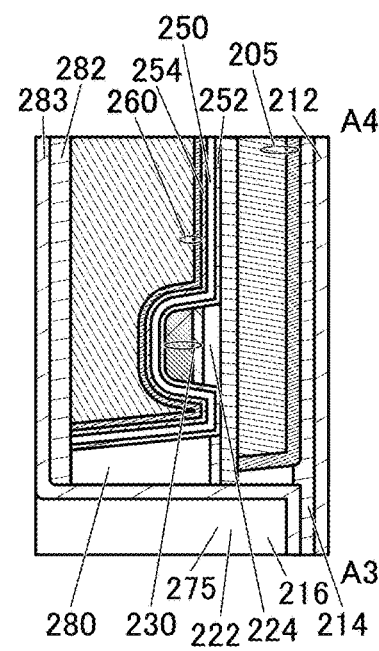
FIG. 19B to FIG. 19D are cross-sectional views illustrating a method for manufacturing a semiconductor device of one embodiment of the present invention.
Figure 19B:
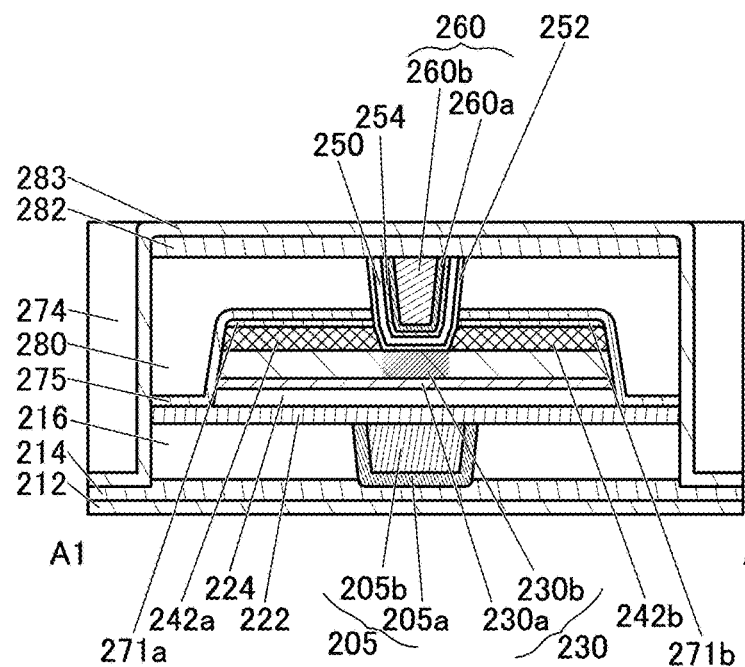
Figure 19D:
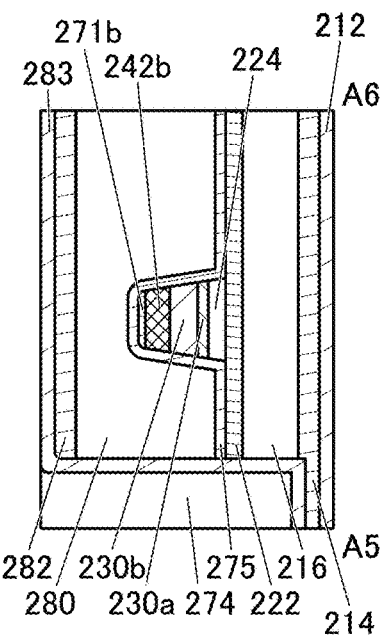

Here, dotted lines in FIG. 14B to FIG. 14D indicate high-frequency waves such as microwaves or RF, oxygen plasma, oxygen radicals, or the like. The microwave treatment is preferably performed with a microwave treatment apparatus including a power source for generating high-density plasma using microwaves, for example. Here, the frequency of the microwave treatment apparatus is set to greater than or equal to 300 MHz and less than or equal to 300 GHz, preferably greater than or equal to 2.4 GHz and less than or equal to 2.5 GHz, for example, 2.45 GHz. Oxygen radicals at a high density can be generated with high-density plasma. The electric power of the power source that applies microwaves of the microwave treatment apparatus is set to higher than or equal to 1000 W and lower than or equal to 10000 W, preferably higher than or equal to 2000 W and lower than or equal to 5000 W. A power source may be provided to the microwave treatment apparatus to apply RF to the substrate side. Furthermore, application of RF to the substrate side allows oxygen ions generated by the high-density plasma to introduce the oxide 230$b$ efficiently.

The microwave treatment is preferably performed under reduced pressure, and the pressure may be higher than or equal to 10 Pa and lower than or equal to 1000 Pa, preferably higher than or equal to 300 Pa and lower than or equal to 700 Pa. The treatment temperature may be lower than or equal to 750° C., preferably lower than or equal to 500° C., and is approximately 400° C., for example. The oxygen plasma treatment can be followed successively by heat treatment without exposure to air. For example, the heat treatment may be performed at higher than or equal to 100° C. and lower than or equal to 750° C., preferably higher than or equal to 300° C. and lower than or equal to 500° C.

Furthermore, the microwave treatment is performed using an oxygen gas and an argon gas, for example. Here, the oxygen flow rate ratio ($O_2/O_2+Ar$) is higher than 0% and lower than or equal to 100%. The oxygen flow rate ratio ($O_2/O_2+Ar$) is preferably higher than 0% and lower than or equal to 50%. The oxygen flow rate ratio ($O_2/O_2+Ar$) is further preferably higher than or equal to 10% and lower than or equal to 40%. The oxygen flow rate ratio ($O_2/O_2+Ar$) is still further preferably higher than or equal to 10% and lower than or equal to 30%. The carrier concentration in the region 230$bc$ can be reduced by thus performing the microwave treatment in an atmosphere containing oxygen. In addition, the carrier concentrations in the region 230$ba$ and the region 230$bb$ can be prevented from being excessively reduced by preventing an excess amount of oxygen from being introduced into the chamber in the microwave treatment.

As illustrated in FIG. 14B to FIG. 14D, the microwave treatment in an oxygen-containing atmosphere can convert an oxygen gas into plasma using a high-frequency wave such as a microwave or RF, and apply the oxygen plasma to a region of the oxide 230$b$ which is between the conductor 242$a$ and the conductor 242$b$. At this time, the region 230$bc$ can also be irradiated with the high-frequency wave such as the microwave or RF. In other words, the high-frequency oxygen plasma such as a microwave or RF, or the like can be applied to the region 230$bc$ illustrated in FIG. 4A. The effect of the plasma, the microwave, or the like enables $V_O H$ in the region 230$bc$ to be cut, and hydrogen H to be removed from the region 230$bc$. That is, the reaction "$V_O H \rightarrow H + V_O$" occurs in the region 230$bc$, so that $V_O H$ contained in the region 230$bc$ can be reduced. As a result, oxygen vacancies and $V_O H$ in the region 230$bc$ can be reduced to lower the carrier concentration. In addition, oxygen radicals generated by the oxygen plasma or oxygen contained in the insulator 250 can be supplied to oxygen vacancies formed in the region 230$bc$, thereby further reducing oxygen vacancies and lowering the carrier concentration in the region 230$bc$.

Meanwhile, the conductor 242$a$ and the conductor 242$b$ are provided over the region 230$ba$ and the region 230$bb$ illustrated in FIG. 4A. The conductor 242 preferably functions as a blocking film preventing the effect caused by the microwave, the high-frequency waves such as RF, the oxygen plasma, or the like in the microwave treatment in an atmosphere containing oxygen. Therefore, the conductor 242 preferably has a function of blocking an electromagnetic wave greater than or equal to 300 MHz and less than or equal to 300 GHz, for example, greater than or equal to 2.4 GHz and less than or equal to 2.5 GHz.

As illustrated in FIG. 14B to FIG. 14D, the effect of the microwave, the high-frequency waves such as RF, the oxygen plasma, or the like is blocked by the conductor 242$a$ and the conductor 242$b$, and thus does not reach the region 230$ba$ and the region 230$bb$. Hence, a reduction in $V_O H$ and supply of an excess amount of oxygen due to the microwave treatment do not occur in the region 230$ba$ and the region 230$bb$, preventing a decrease in carrier concentration.

Furthermore, the insulator 252 having a barrier property against oxygen is provided in contact with the side surfaces of the conductor 242$a$ and the conductor 242$b$. Thus, formation of oxide films on the side surfaces of the conductor 242$a$ and the conductor 242$b$ by the microwave treatment can be inhibited.

In the above manner, oxygen vacancies and $V_O H$ can be selectively removed from the region 230$bc$ in the oxide semiconductor, whereby the region 230bc can be an i-type or substantially i-type region. Furthermore, supply of an excess amount of oxygen to the region 230ba and the region 230bb functioning as the source region and the drain region can be inhibited and the n-type conductivity can be maintained. As a result, a change in the electrical characteristics of the transistor 200 can be inhibited, and thus a variation in the electrical characteristics of the transistors 200 in the substrate plane can be inhibited.

In the microwave treatment, thermal energy is directly transmitted to the oxide 230b in some cases owing to an electromagnetic interaction between the microwave and a molecule in the oxide 230b. The oxide 230b might be heated by this thermal energy. Such heat treatment is sometimes referred to as microwave annealing. When microwave treatment is performed in an atmosphere containing oxygen, an effect equivalent to that of oxygen annealing is sometimes obtained. In the case where hydrogen is contained in the oxide 230b, it is probable that the thermal energy is transmitted to the hydrogen in the oxide 230b and the hydrogen activated by the energy is released from the oxide 230b.

Next, an insulating film 250A is formed (see FIG. 15A to FIG. 15D). Heat treatment may be performed before the formation of the insulating film 250A; the heat treatment may be performed under reduced pressure, and the insulating film 250A may be successively formed without exposure to the air. The heat treatment is preferably performed in an oxygen-containing atmosphere. Such treatment can remove moisture and hydrogen adsorbed onto the surface of the insulating film 252A and the like, and further can reduce the moisture concentration and the hydrogen concentration in the oxide 230a and the oxide 230b. The heat treatment is preferably performed at a temperature higher than or equal to 100° C. and lower than or equal to 400° C.

The insulating film 250A can be formed by a sputtering method, a CVD method, a PECVD method, an MBE method, a PLD method, an ALD method, or the like. The insulating film 250A is preferably formed by a deposition method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250 that faces the oxide 230b with the insulator 252 with a small thickness therebetween, in a later step.

In this embodiment, silicon oxynitride is deposited for the insulating film 250A by a PECVD method.

In the case where the insulator 250 has a two-layer structure as illustrated in FIG. 4B, an insulating film to be the insulator 250b may be formed after the formation of the above insulating film 250A. The insulating film to be the insulator 250b can be formed by a sputtering method, a CVD method, an MBE method, a PLD method, an ALD method, or the like. The insulating film to be the insulator 250b is preferably formed using an insulator having a function of inhibiting diffusion of oxygen. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, the insulating film to be the insulator 250b can be provided using a material similar to that for the insulator 222. For example, hafnium oxide may be deposited by a thermal ALD method for the insulating film to be the insulator 250b.

After the insulating film 250A is formed, microwave treatment may be performed (see FIG. 15A to FIG. 15D). The microwave treatment may be performed under the conditions for the above-described microwave treatment after formation of the insulating film 252A. Alternatively, microwave treatment may be performed after the formation of the insulating film 250A without the microwave treatment after the formation of the insulating film 252A. In the case where the insulating film to be the insulator 250b is provided as described above, microwave treatment may be performed after the formation of the insulating film. For the microwave treatment, the conditions for the microwave treatment performed after the formation of the insulating film 252A may be used. Alternatively, microwave treatment may be performed after the formation of the insulating film to be the insulator 250b, without microwave treatment performed after the formation of the insulating film 252A or the insulating film 250A.

Heat treatment may be performed while the reduced pressure is maintained after each of microwave treatment after the formation of the insulating film 252A and the insulating film 250A and microwave treatment after the formation of the insulating film to be the insulator 250b. Such treatment enables hydrogen in the insulating film 252A, the insulating film 250A, the insulating film to be the insulator 250b, the oxide 230b, and the oxide 230a to be removed efficiently. Part of hydrogen is gettered by the conductor 242 (the conductor 242a and the conductor 242b) in some cases. Alternatively, the step of performing microwave treatment and then performing heat treatment with the reduced pressure being maintained may be repeated a plurality of cycles. The repetition of the heat treatment enables hydrogen in the insulating film 252A, the insulating film 250A, the insulating film to be the insulator 250b, the oxide 230b, and the oxide 230a to be removed more efficiently. Note that the temperature of the heat treatment is preferably higher than or equal to 300° C. and lower than or equal to 500° C. The microwave treatment, i.e., the microwave annealing may also serve as the heat treatment. The heat treatment is not necessarily performed in the case where the oxide 230b and the like are adequately heated by the microwave annealing.

Furthermore, the microwave treatment improves the film quality of the insulating film 252A, the insulating film 250A and the insulating film to be the insulator 250b, thereby inhibiting diffusion of hydrogen, water, impurities, and the like. Accordingly, hydrogen, water, impurities, and the like can be inhibited from diffusing into the oxide 230b, the oxide 230a, and the like through the insulator 252 in a later step such as formation of a conductive film to be the conductor 260 or later treatment such as heat treatment.

Next, an insulating film 254A is formed (see FIG. 16A to FIG. 16D). The insulating film 254A can be formed by a sputtering method, a CVD method, an MBE method, a PLD method, an ALD method, or the like. Like the insulating film 252A, the insulating film 254A is preferably formed by an ALD method. By an ALD method, the insulating film 254A can be formed to have small thickness and good coverage. In this embodiment, for the insulating film 254A, silicon nitride is deposited by a PEALD method.

Next, a conductive film to be the conductor 260a and a conductive film to be the conductor 260b are formed in this order. The conductive film to be the conductor 260a and the conductive film to be the conductor 260b can be formed by a sputtering method, a CVD method, an MBE method, a PLD method, an ALD method, or the like. In this embodiment, titanium nitride is deposited for the conductive film to be the conductor 260a by an ALD method, and tungsten is deposited for the conductive film to be the conductor 260b by a CVD method.

Then, the insulating film 252A, the insulating film 250A, the insulating film 254A, the conductive film to be the conductor 260a, and the conductive film to be the conductor 260b are polished by CMP treatment until the insulator 280 is exposed, whereby the insulator 252, the insulator 250, the insulator 254, and the conductor 260 (the conductor 260a and the conductor 260b) are formed (see FIG. 17A to FIG. 17D). Accordingly, the insulator 252 is placed to cover the opening reaching the oxide 230b. The conductor 260 is placed to fill the opening with the insulator 252 and the insulator 250 therebetween.

Then, heat treatment may be performed under conditions similar to those for the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be formed successively without exposure to the air.

Next, the insulator 282 is formed over the insulator 252, the insulator 250, the conductor 260, and the insulator 280 (see FIG. 17A to FIG. 17D). The insulator 282 can be formed by a sputtering method, a CVD method, an MBE method, a PLD method, an ALD method, or the like. The insulator 282 is preferably formed by a sputtering method. Since a molecule containing hydrogen is not needed to be used as a deposition gas in the sputtering method, the hydrogen concentration in the insulator 282 can be reduced.

In this embodiment, for the insulator 282, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

The insulator 282 is formed by a sputtering method in an oxygen-containing atmosphere, whereby oxygen can be added to the insulator 280 during the formation. Thus, excess oxygen can be contained in the insulator 280. At this time, the insulator 282 is preferably formed while the substrate is being heated.

Next, an etching mask is formed over the insulator 282 by a lithography method and part of the insulator 282, part of the insulator 280, part of the insulator 275, part of the insulator 222, and part of the insulator 216 are processed until the top surface of the insulator 214 is exposed (see FIG. 18A to FIG. 18D). Wet etching can be used for the processing; however, dry etching is preferably used for microfabrication.

Next, heat treatment may be performed. The heat treatment is performed at higher than or equal to 250° C. and lower than or equal to 650° C., preferably higher than or equal to 350° C. and lower than or equal to 600° C. The heat treatment is preferably performed at a temperature lower than that of the heat treatment performed after the formation of the oxide film 230B. By the heat treatment, part of oxygen added to the insulator 280 is diffused into the oxide 230 through the insulator 250 and the like.

By the heat treatment, oxygen contained in the insulator 280 and hydrogen bonded to the oxygen can be released to the outside from the side surface of the insulator 280 formed by the processing of the insulator 282, the insulator 280, the insulator 275, the insulator 222, and the insulator 216. Note that the hydrogen bonded to oxygen is released as water. Thus, unnecessary oxygen and hydrogen contained in the insulator 280 can be reduced.

In a region of the oxide 230 that overlaps with the conductor 260, the insulator 252 is provided to be in contact with the top surface and the side surface of the oxide 230. Since the insulator 252 has a barrier property against oxygen, diffusion of an excess amount of oxygen into the oxide 230 can be suppressed. Thus, oxygen can be supplied to the region 230bc or in the vicinity of the region 230bc, without supply of an excess amount of oxygen. Accordingly, oxygen vacancies and $V_O H$ formed in the region 230bc can be reduced while oxidation of the side surface of the conductor 242 due to excess oxygen can be inhibited. Thus, the transistor 200 can have good electrical characteristics and higher reliability.

On the other hand, in the case where the transistors 200 are integrated at a high density, the volume of the insulator 280 becomes excessively small with respect to one transistor 200 in some cases. In this case, the amount of oxygen diffusing into the oxide 230 in the heat treatment becomes significantly small. When the oxide 230 is heated while being in contact with the oxide insulator (e.g., the insulator 250) which does not contain sufficient oxygen, oxygen contained in the oxide 230 might be released. However, in the transistor 200 described in this embodiment, the insulator 252 is provided in contact with the top surface and the side surface of the oxide 230 in the region of the oxide 230 that overlaps with the conductor 260. Since the insulator 252 has a barrier property against oxygen, release of the oxygen from the oxide 230 can be reduced also in the heat treatment. Thus, the amount of oxygen vacancies and $V_O H$ formed in the region 230bc can be reduced. Thus, the transistor 200 can have good electrical characteristics and higher reliability.

As described above, in either case of a large or small amount of oxygen supplied from the insulator 280 in the semiconductor device of this embodiment, a transistor having good electric characteristics and high reliability can be formed. Thus, a semiconductor device with a reduced variation in the electrical characteristics of the transistors 200 in the substrate plane can be provided.

Next, the insulator 283 is formed over the insulator 282 (see FIG. 19A to FIG. 19D).

The insulator 283 can be formed by a sputtering method, a CVD method, an MBE method, a PLD method, an ALD method, or the like. The insulator 283 is preferably formed by a sputtering method. By using a sputtering method that does not need to use a molecule containing hydrogen as a deposition gas, the hydrogen concentration in the insulator 283 can be reduced. The insulator 283 may be a multilayer. For example, silicon nitride may be deposited by a sputtering method and silicon nitride may be deposited over the silicon nitride by an ALD method. Surrounding the transistor 200 by the insulator 283 and the insulator 214 that have a high barrier property can prevent entry of moisture and hydrogen from the outside.

Next, the insulator 274 is formed over the insulator 283. The insulator 274 can be formed by a sputtering method, a CVD method, an MBE method, a PLD method, an ALD method, or the like. In this embodiment, for the insulator 274, silicon oxide is deposited by a CVD method.

Next, the insulator 274 is polished by CMP treatment until the insulator 283 is exposed, whereby the top surface of the insulator 274 is planarized (see FIG. 19A to FIG. 19D). The top surface of the insulator 283 is partly removed by the CMP treatment in some cases.

Next, the insulator 285 is formed over the insulator 274 and the insulator 283 (see FIG. 20A to FIG. 20D). The insulator 285 can be formed by a sputtering method, a CVD method, an MBE method, a PLD method, an ALD method, or the like. The insulator 285 is preferably formed by a sputtering method. By using a sputtering method that does not need to use a molecule containing hydrogen as a deposition gas, the hydrogen concentration in the insulator 285 can be reduced.

In this embodiment, for the insulator 285, silicon oxide is deposited by a sputtering method.

Next, an opening 290 reaching the conductor 242b is formed in the insulator 271b, the insulator 275, the insulator 280, the insulator 282, the insulator 283, and the insulator 285 (see FIG. 20A to FIG. 20D). The opening 290 may be formed by a lithography method. Since the opening 290 has a high aspect ratio, anisotropic etching is preferably performed, and dry etching may be performed, for example. For the dry etching, for example, a $C_4F_6$ gas, a $CsF_6$ gas, a $C_4F_8$ gas, a $CF_4$ gas, a $SF_6$ gas, a $CHF_3$ gas, a $Cl_2$ gas, a $BC_3$ gas, a $SiCl_4$ gas, or the like can be used alone or two or more of the gases can be mixed and used. Alternatively, an oxygen gas, a helium gas, an argon gas, a hydrogen gas, or the like can be added to any of the above gases as appropriate. These etching gases can be appropriately changed depending on the object to be etched (the insulator 271b, the insulator 275, the insulator 280, the insulator 282, the insulator 283, and the insulator 285).

Figure 20A:
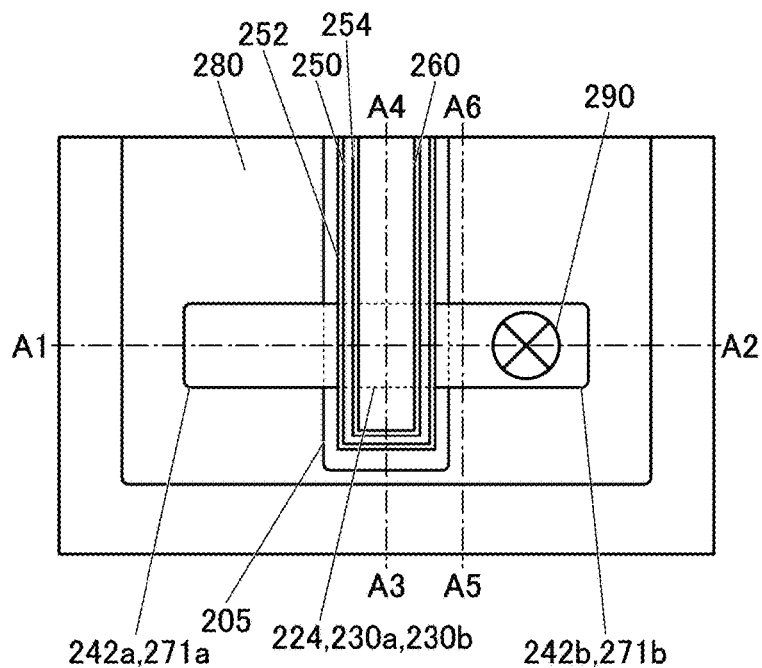
FIG. 20A is a top view illustrating a method for manufacturing a semiconductor device of one embodiment of the present invention.
Figure 20C:
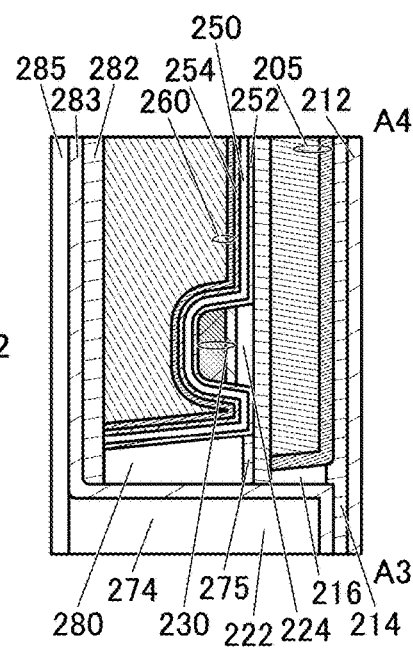
FIG. 20B to FIG. 20D are cross-sectional views illustrating a method for manufacturing a semiconductor device of one embodiment of the present invention.

Note that the opening 290 in the top view in FIG. 20A has a circular shape; however, the shape is not limited thereto. For example, the opening 290 in the top view may have an almost circular shape such as an elliptical shape, a polygonal shape such as a quadrangular shape, or a polygonal shape such as a quadrangular shape with rounded corners.

Here, the opening 290 preferably has a shape in which the side surface and the bottom surface of the opening is connected with a curved surface. With this structure, the conductor 110 can be deposited in the opening 290 with favorable coverage.

Next, an insulating film to be the insulator 245 is formed. At this time, the insulating film is deposited to be in contact with at least the side surface of the opening 290. The insulating film may be, for example, deposited along the side surface and the bottom surface of the opening 290. The insulating film can be formed by a sputtering method, a CVD method, an MBE method, a PLD method, an ALD method, or the like. As the insulating film to be the insulator 245, an insulating film having a function of inhibiting passage of oxygen or impurities such as water and hydrogen is preferably used. For example, preferably, aluminum oxide is deposited by an ALD method and silicon nitride is deposited thereover by a PEALD method. Silicon nitride is preferable because it has a high blocking property against hydrogen.

Figure 20B:
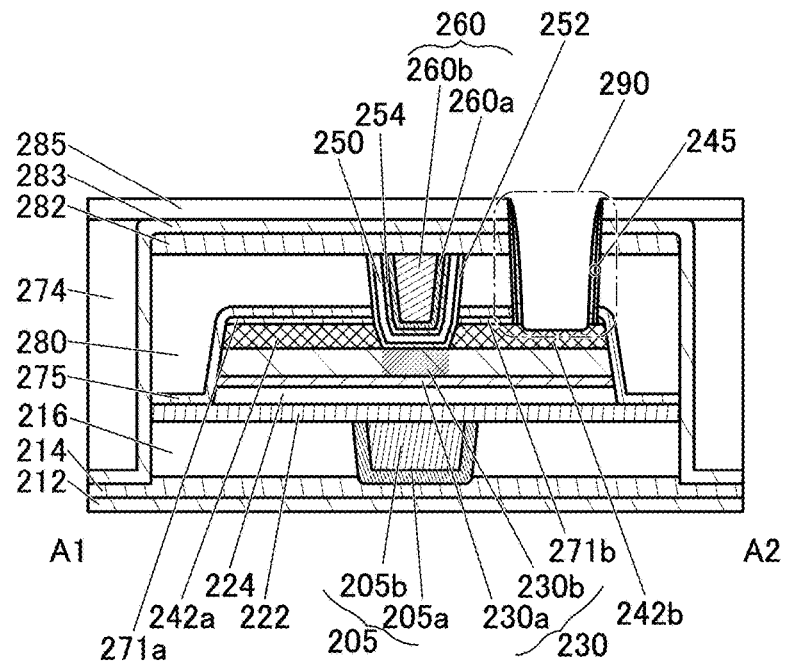
Figure 20D:
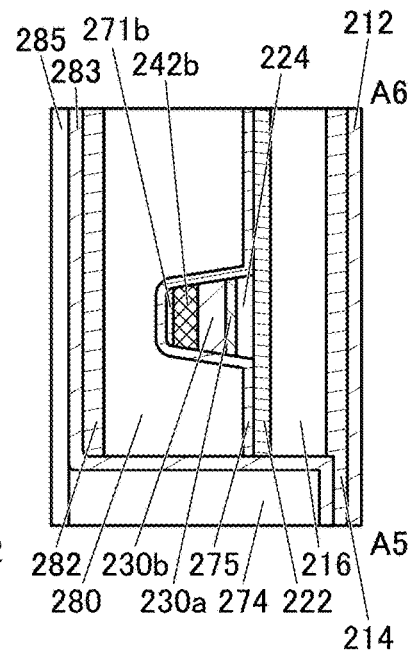
Figure 21A:
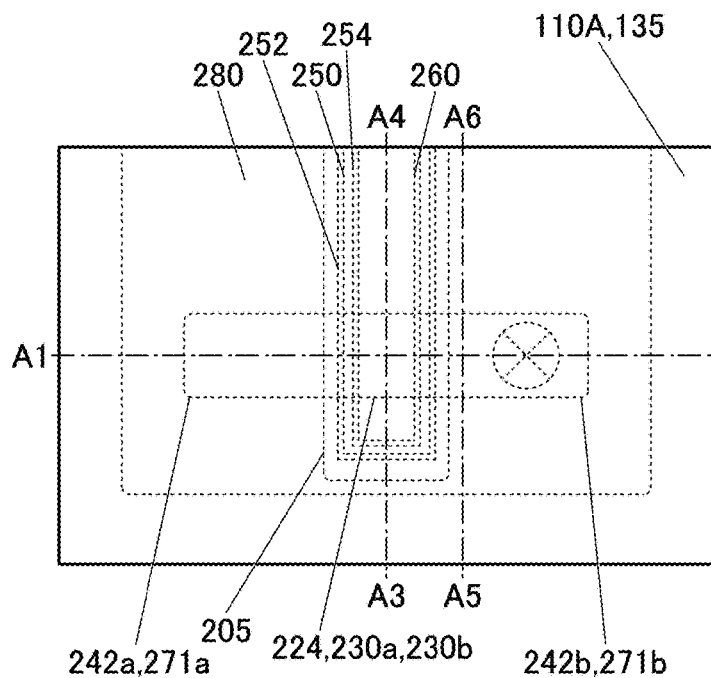
FIG. 21A is a top view illustrating a method for manufacturing a semiconductor device of one embodiment of the present invention.
Figure 21C:
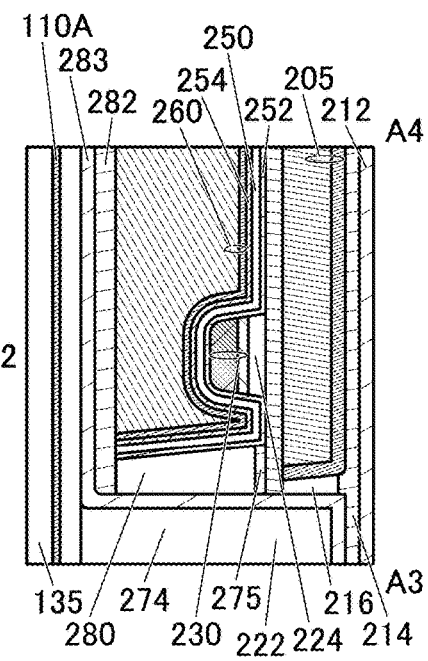
FIG. 21B to FIG. 21D are cross-sectional views illustrating a method for manufacturing a semiconductor device of one embodiment of the present invention.
Figure 21B:
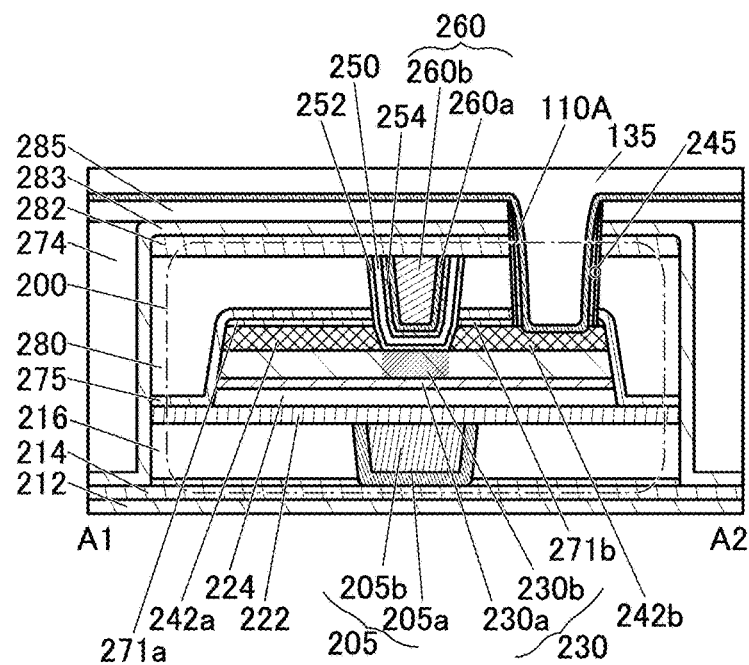
Figure 21D:
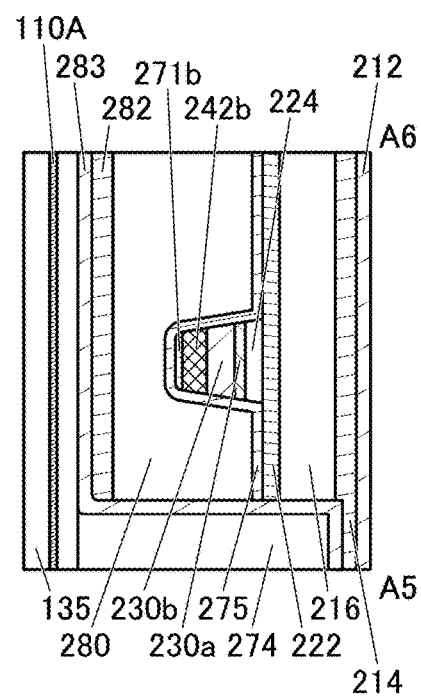
Figure 22A:
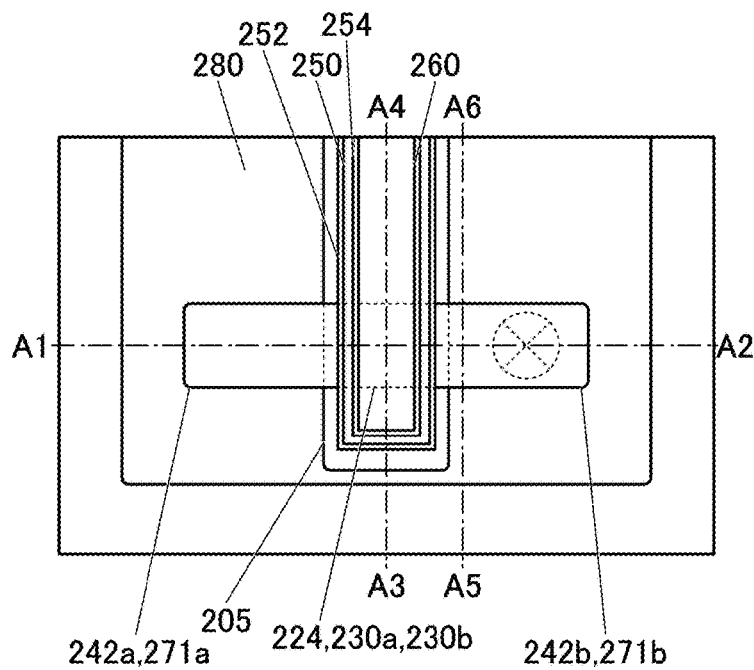
FIG. 22A is a top view illustrating a method for manufacturing a semiconductor device of one embodiment of the present invention.
Figure 22C:
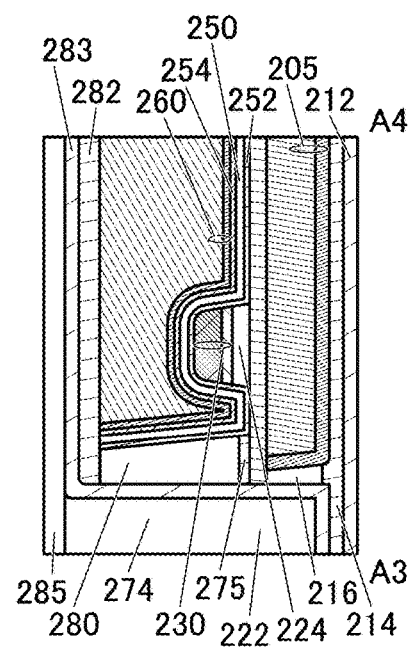
FIG. 22B to FIG. 22D are cross-sectional views illustrating a method for manufacturing a semiconductor device of one embodiment of the present invention.
Figure 22B:
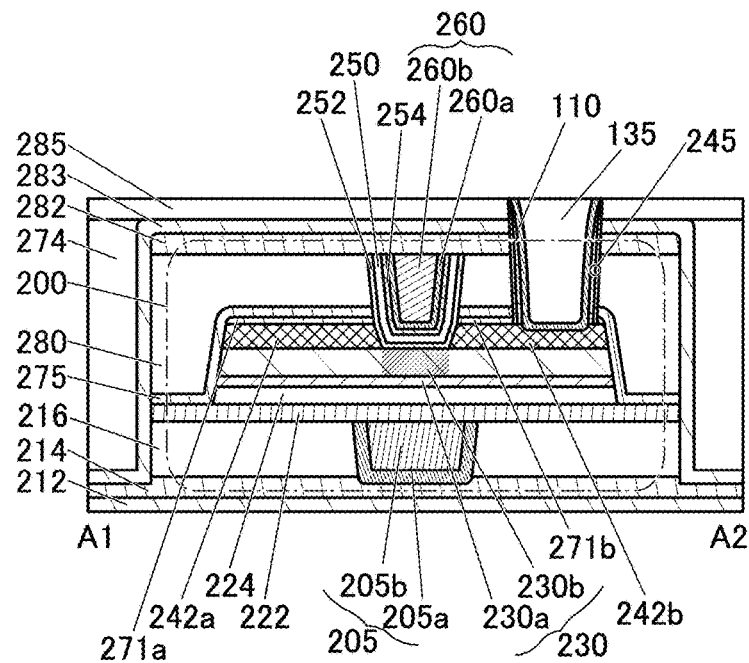
Figure 22D:
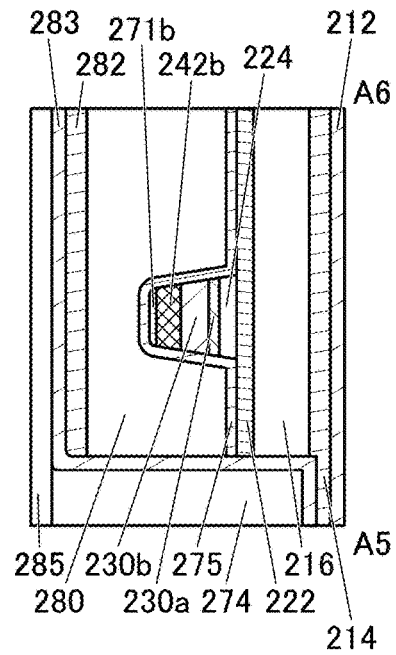
Figure 23A:
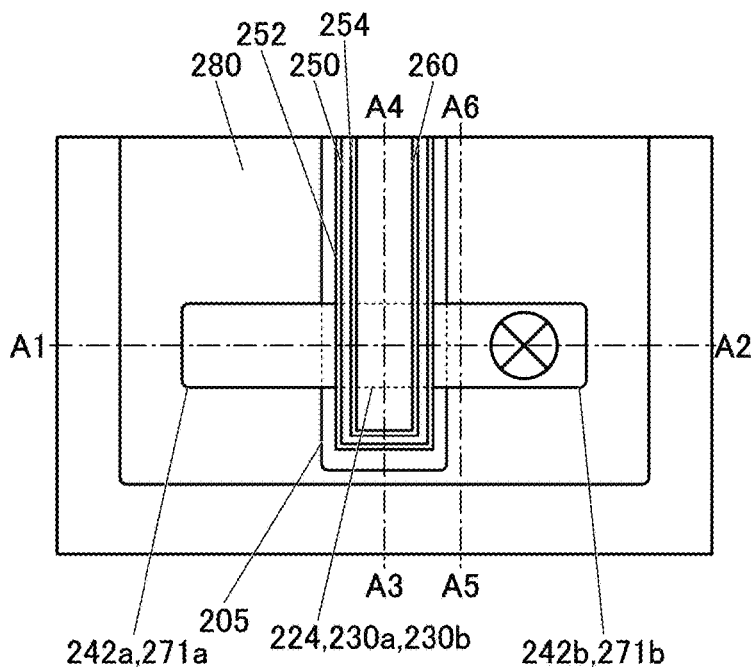
FIG. 23A is a top view illustrating a method for manufacturing a semiconductor device of one embodiment of the present invention.
Figure 23B:
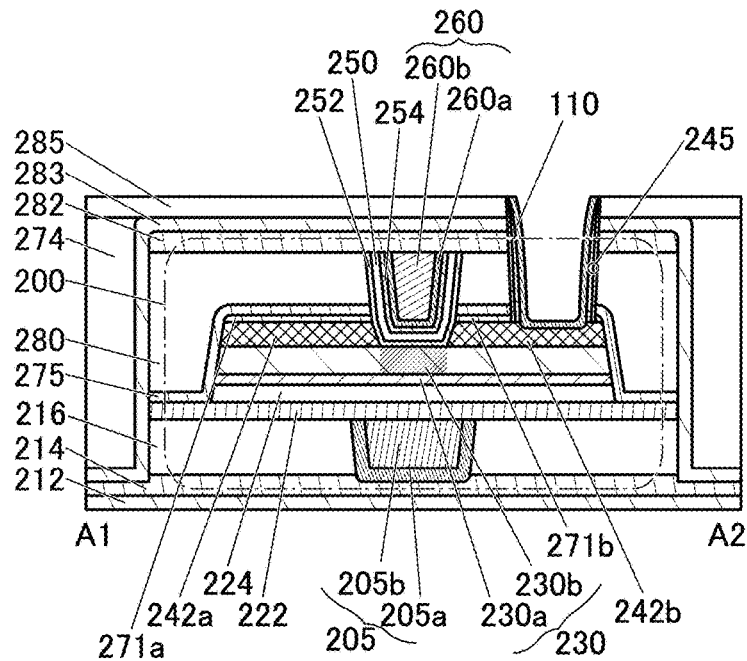
FIG. 23B to FIG. 23D are cross-sectional views illustrating a method for manufacturing a semiconductor device of one embodiment of the present invention.
Figure 23C:
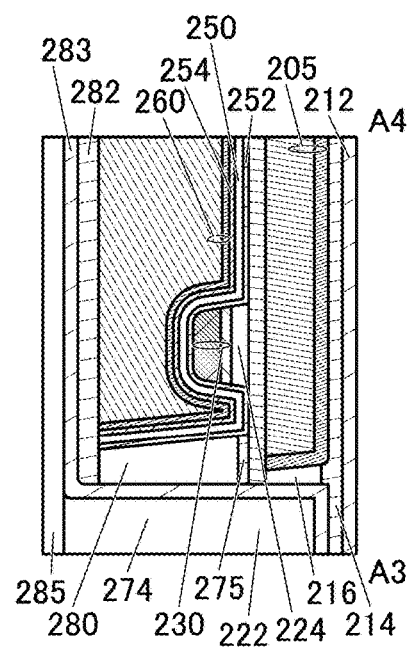
Figure 23D:
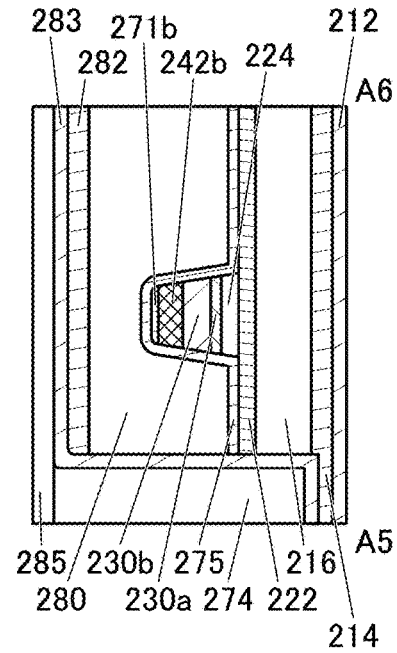
Figure 24A:
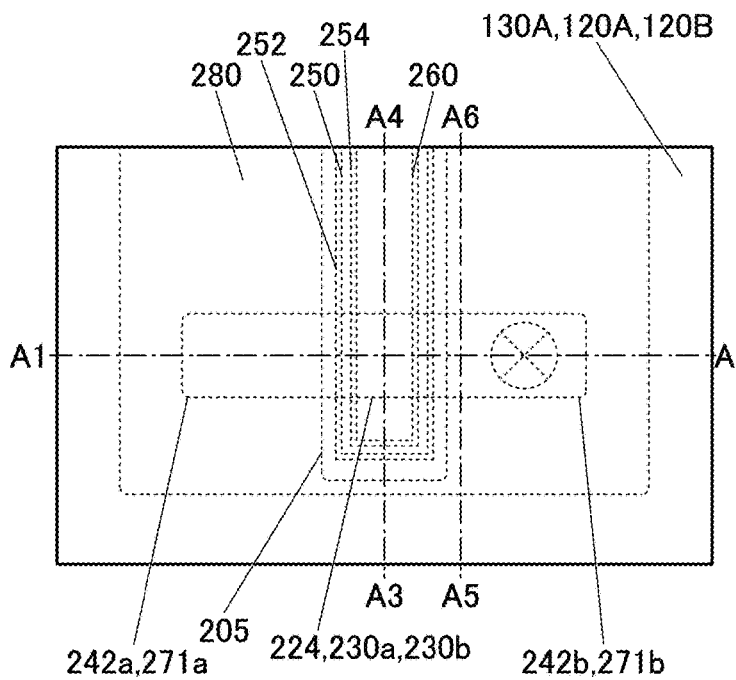
FIG. 24A is a top view illustrating a method for manufacturing a semiconductor device of one embodiment of the present invention.
Figure 24C:
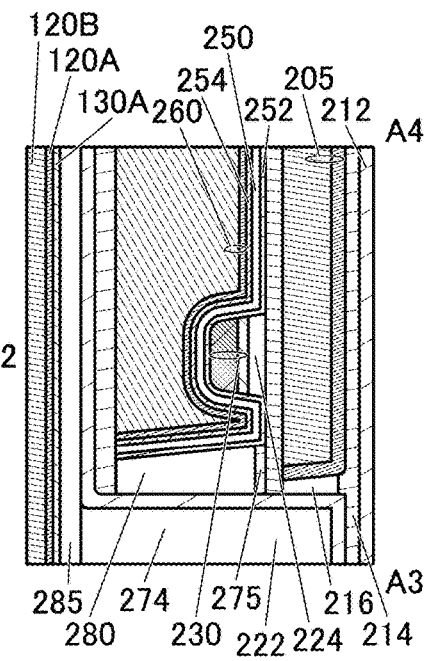
FIG. 24B to FIG. 24D are cross-sectional views illustrating a method for manufacturing a semiconductor device of one embodiment of the present invention.
Figure 24B:
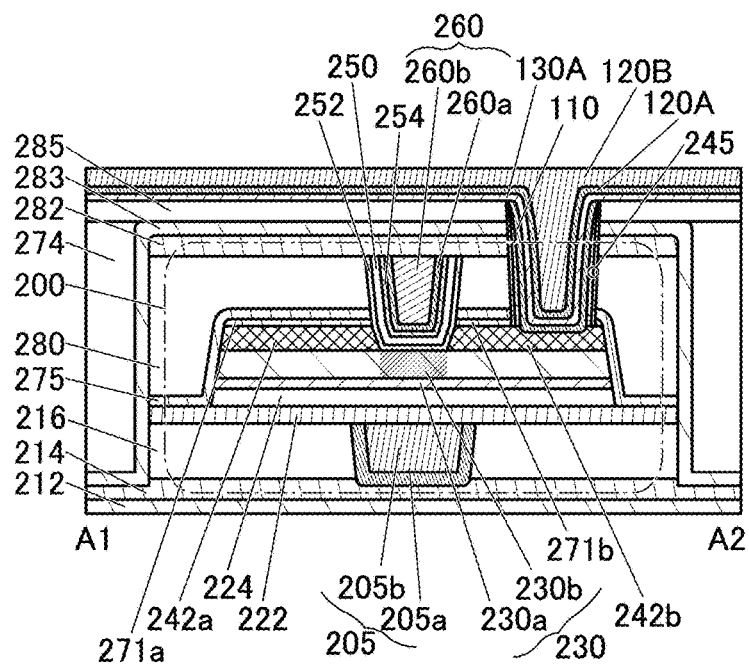
Figure 24D:
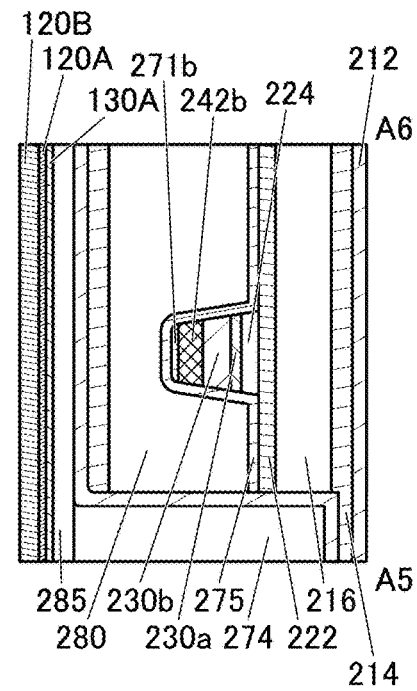

Next, the insulating film is subjected to anisotropic etching to form the insulator 245 in contact with the side surface of the opening 290 (see FIG. 20A to FIG. 20D). Here, at least part of the insulating film is removed, and at least part of the top surface of the conductor 242b is exposed. At this time, as illustrated in FIG. 20B, the top surface of the conductor 242b is partly removed in some cases. For the anisotropic etching, a dry etching method or the like is employed, for example. When a sidewall portion of the opening 290 has such a structure, passage of oxygen from the outside can be inhibited and oxidation of the conductor 110 to be formed next can be prevented. Furthermore, impurities such as water and hydrogen contained in the insulator 280 or the like can be prevented from diffusing into the conductor 110.

Next, a conductive film 110A is deposited to cover the insulator 285 and the opening 290 (see FIG. 21A to FIG. 21D). At this time, the conductive film 110A is preferably formed in contact with the side surface and the bottom surface of the opening 290 having a high aspect ratio. Thus, the conductive film 110A is preferably deposited by a deposition method that provides favorable coverage, such as an ALD method or a CVD method. For example, titanium nitride may be deposited by an ALD method.

Next, a filler 135 is formed over the conductive film 110A (see FIG. 21A to FIG. 21D). The filler 135 fills the openings 290 to the degree allowing CMP treatment in a later step to be performed. Thus, there may be a cavity or the like in the opening 290. For the filler 135, either an insulator or a conductor can be used. For the filler 135, for example, silicon oxide is deposited by an APCVD method.

Then, a layer above the insulator 285 is removed by CMP treatment, so that the conductor 110 is formed (see FIG. 22A to FIG. 22D). Here, the insulator 285 preferably functions as a stopper for the CMP treatment on the conductive film 110A. Note that the insulator 285 is partly removed by the CMP treatment in some cases.

Next, etching treatment is performed to remove the filler 135 in the opening 290 (see FIG. 23A to FIG. 23D). The etching treatment may be performed by a wet etching method or a dry etching method; the filler 135 in the opening 290 can be more easily removed by a wet etching method in some cases. When wet etching is employed, a hydrofluoric acid-based solution or the like can be used as an etchant.

Next, an insulating film 130A is deposited over the conductor 110 and the insulator 285 (see FIG. 24A to FIG. 24D). The insulating film 130A is preferably formed in contact with the conductor 110 that is provided inside the opening 290 having a high aspect ratio. Thus, the insulating film 130A is preferably deposited by a deposition method that provides favorable coverage, such as an ALD method or a CVD method. For the insulating film 130A, the above-described material that can have ferroelectricity is preferably used. For example, $HfZrO_x$ (x is a real number larger than 0) is deposited by a thermal ALD method.

When the insulating film 130A is deposited by a deposition method such as an ALD method to cover the conductor 110 favorably, a short circuit between the upper electrode and the lower electrode of the capacitor 100 can be prevented.

Next, a conductive film 120A is deposited over the insulating film 130A (see FIG. 24A to FIG. 24D). At least the conductive film 120A is preferably formed in contact with the insulating film 130A that is provided inside the opening 290 having a high aspect ratio. Thus, the conductive film 120A is preferably deposited by a deposition method that enables favorable embeddability, such as an ALD method or a CVD method; for example, titanium nitride is deposited by a thermal ALD method.

Here, the conductive film 120A is preferably deposited by a method in which deposition is performed while the substrate is heated, like a thermal ALD method. For example, the substrate temperature during the deposition is set to be higher than or equal to room temperature, preferably higher than or equal to 300° C., further preferably higher than or equal to 325° C., still further preferably higher than or equal to 350° C. Furthermore, for example, the substrate temperature during the deposition is set to be lower than or equal to 500° C., preferably lower than or equal to 450° C. For example, the substrate temperature is set at approximately 400° C.

When the conductive film 120A is deposited within the above-described temperature range, the insulator 130 can have increased ferroelectricity without high-temperature baking treatment after formation of the capacitor 100. In this manner, a ferroelectric capacitor can be formed easily and the productivity of semiconductor devices can be improved.

Next, a conductive film 120B is deposited over the conductive film 120A (see FIG. 24A to FIG. 24D). The conductive film 120B is preferably deposited to fill the opening 290. Thus, the conductive film 120B is preferably deposited by a deposition method that enables favorable embeddability, such as an ALD method or a CVD method; for example, tungsten is deposited by a metal CVD method.

The conductive film 120A and the conductive film 120B are deposited in the above-described manner, whereby the upper electrode of the capacitor 100 can be provided in the opening 290 with favorable embeddability, and thus the capacitor 100 can have increased capacitance.

Then, the conductive film 120A, the conductive film 120B, and the insulating film 130A are processed by a lithography method to form the conductor 120a, the conductor 120b, and the insulator 130 (see FIG. 3A to FIG. 3D). Note that it is also possible that the insulating film 130A is not processed into the insulator 130 and remains as it is. Alternatively, the conductor 120 may be formed so that a portion above the insulator 285 functions as a wiring, or a conductor functioning as a wiring may be formed in a layer above the conductor 120. By the above-described lithography method, the top surface of the insulator 285 becomes higher in a region where the insulator 285 overlaps with the insulator 130 than in a region where the insulator 285 does not overlap with the insulator 130, in some cases.

Through the above-described process, the semiconductor device including the transistor 200 and the capacitor 100 illustrated in FIG. 3A to FIG. 3D can be manufactured.

As illustrated in FIG. 9A to FIG. 20D, the transistor 200 can be manufactured in accordance with the method for manufacturing the semiconductor device described in this embodiment.

<Microwave Treatment Apparatus>

A microwave treatment apparatus that can be used for the above method for manufacturing the semiconductor device is described below.

First, a structure of a manufacturing apparatus that hardly allows entry of impurities in manufacturing a semiconductor device or the like is described with reference to FIG. 25 to FIG. 28.

Figure 25:
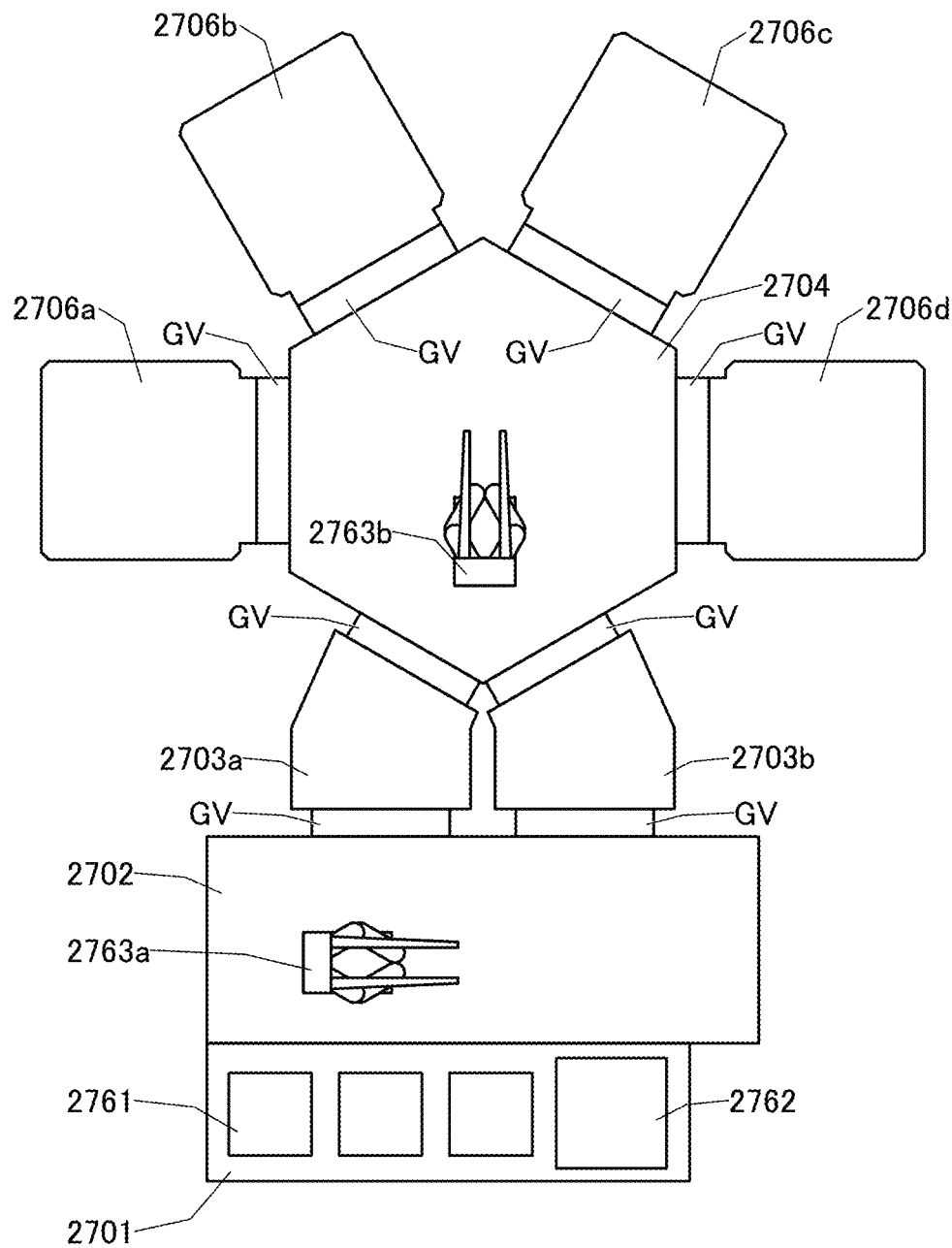
FIG. 25 is a top view illustrating a microwave treatment apparatus of one embodiment of the present invention.

FIG. 25 schematically illustrates a top view of a single wafer multi-chamber manufacturing apparatus 2700. The manufacturing apparatus 2700 includes an atmosphere-side substrate supply chamber 2701 including a cassette port 2761 for storing a substrate and an alignment port 2762 for performing alignment of a substrate; an atmosphere-side substrate transfer chamber 2702 for transferring a substrate from the atmosphere-side substrate supply chamber 2701; a load lock chamber 2703a for carrying in a substrate and switching the pressure inside the chamber from atmospheric pressure to reduced pressure or from reduced pressure to atmospheric pressure; an unload lock chamber 2703b for carrying out a substrate and switching the pressure inside the chamber from reduced pressure to atmospheric pressure or from atmospheric pressure to reduced pressure; a transfer chamber 2704 for transferring a substrate in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that the chambers other than the atmosphere-side substrate supply chamber 2701 and the atmosphere-side substrate transfer chamber 2702 can be each independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1 \times 10^{-4}$ Pa, preferably lower than or equal to $3 \times 10^{-5}$ Pa, further preferably lower than or equal to $1 \times 10^{-5}$ Pa. Furthermore, the partial pressure of a gas molecule (atom) having a mass-to-charge ratio (m/z) of 18 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa. Furthermore, the partial pressure of a gas molecule (atom) having m/z of 28 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa. Furthermore, the partial pressure of a gas molecule (atom) having m/z of 44 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is less than or equal to $3 \times 10^{-6}$ Pa·m$^3$/s, preferably less than or equal to $1 \times 10^{-6}$ Pa·m$^3$/s. Furthermore, for example, the leakage rate of a gas molecule (atom) having m/z of 18 is less than or equal to $1 \times 10^{-7}$ Pa·m$^3$/s, preferably less than or equal to $3 \times 10^{-8}$ Pa·m$^3$/s. Furthermore, for example, the leakage rate of a gas molecule (atom) having m/z of 28 is less than or equal to $1 \times 10^{-5}$ Pa·m$^3$/s, preferably less than or equal to $1 \times 10^{-6}$ Pa·m$^3$/s. Furthermore, for example, the leakage rate of a gas molecule (atom) having m/z of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the above-described mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of passive metal covered with iron fluoride, aluminum oxide, chromium oxide, or the like, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described metal, which releases a small amount of gas containing impurities, may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust velocity, it is important that the adsorbed substance present in the transfer chamber 2704 and each of the chambers be desorbed as much as possible and exhaust be performed in advance with the use of a pump having high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like at a temperature higher than or equal to 40° C. and lower than or equal to 400° C., preferably higher than or equal to 50° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the transfer chamber 2704 and each of the chambers are evacuated in the time range of 5 minutes to 300 minutes, preferably 10 minutes to 120 minutes.

Figure 26:
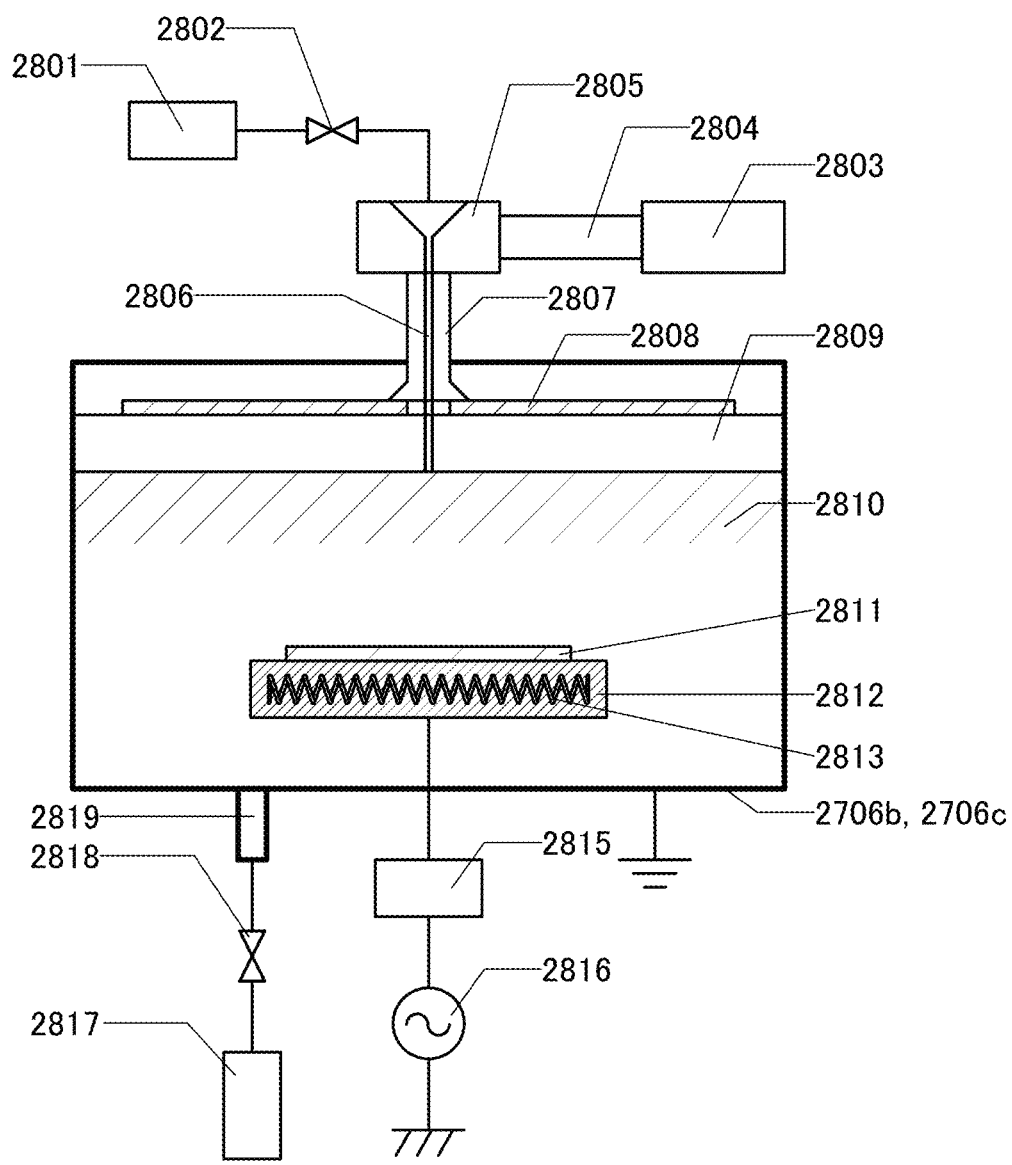
FIG. 26 is a cross-sectional view illustrating a microwave treatment apparatus of one embodiment of the present invention.

Next, the chamber 2706b and the chamber 2706c are described with reference to a schematic cross-sectional view illustrated in FIG. 26.

The chamber 2706b and the chamber 2706c are chambers in which microwave treatment can be performed on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is placed in contact with the dielectric plate 2809. Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function of an electrostatic chuck or a mechanical chuck for holding the substrate 2811. Furthermore, the substrate holder 2812 has a function of an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 may be a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be inhibited.

The high-frequency generator 2803 has a function of generating a microwave at, for example, higher than or equal to 0.3 GHz and lower than or equal to 3.0 GHz, higher than or equal to 0.7 GHz and lower than or equal to 1.1 GHz, or higher than or equal to 2.2 GHz and lower than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like may be used, for example. The application of a bias to the substrate side allows ions in the high-density plasma 2810 to efficiently reach a deep portion of an opening portion of the film or the like over the substrate 2811.

For example, in the chamber 2706*b* or the chamber 2706*c*, oxygen radical treatment using the high-density plasma 2810 can be performed by introducing oxygen from the gas supply source 2801.

Figure 27:
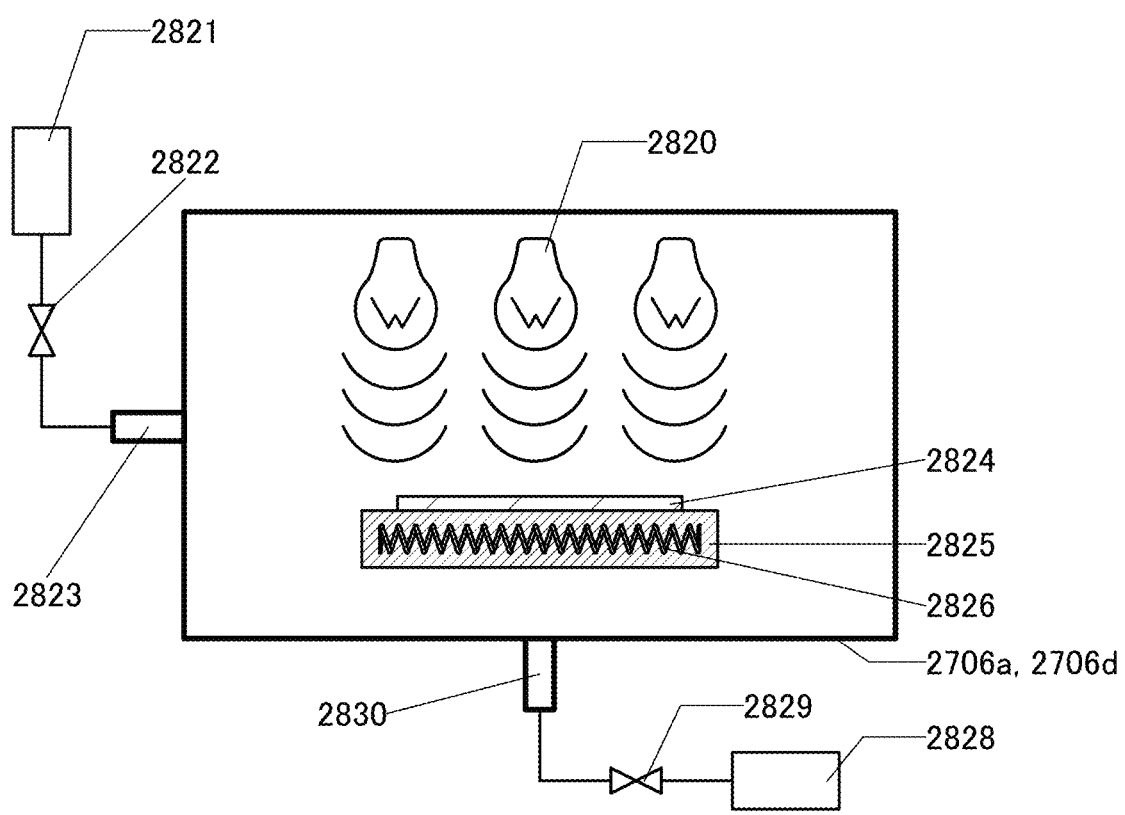
FIG. 27 is a cross-sectional view illustrating a microwave treatment apparatus of one embodiment of the present invention.
Figure 28:
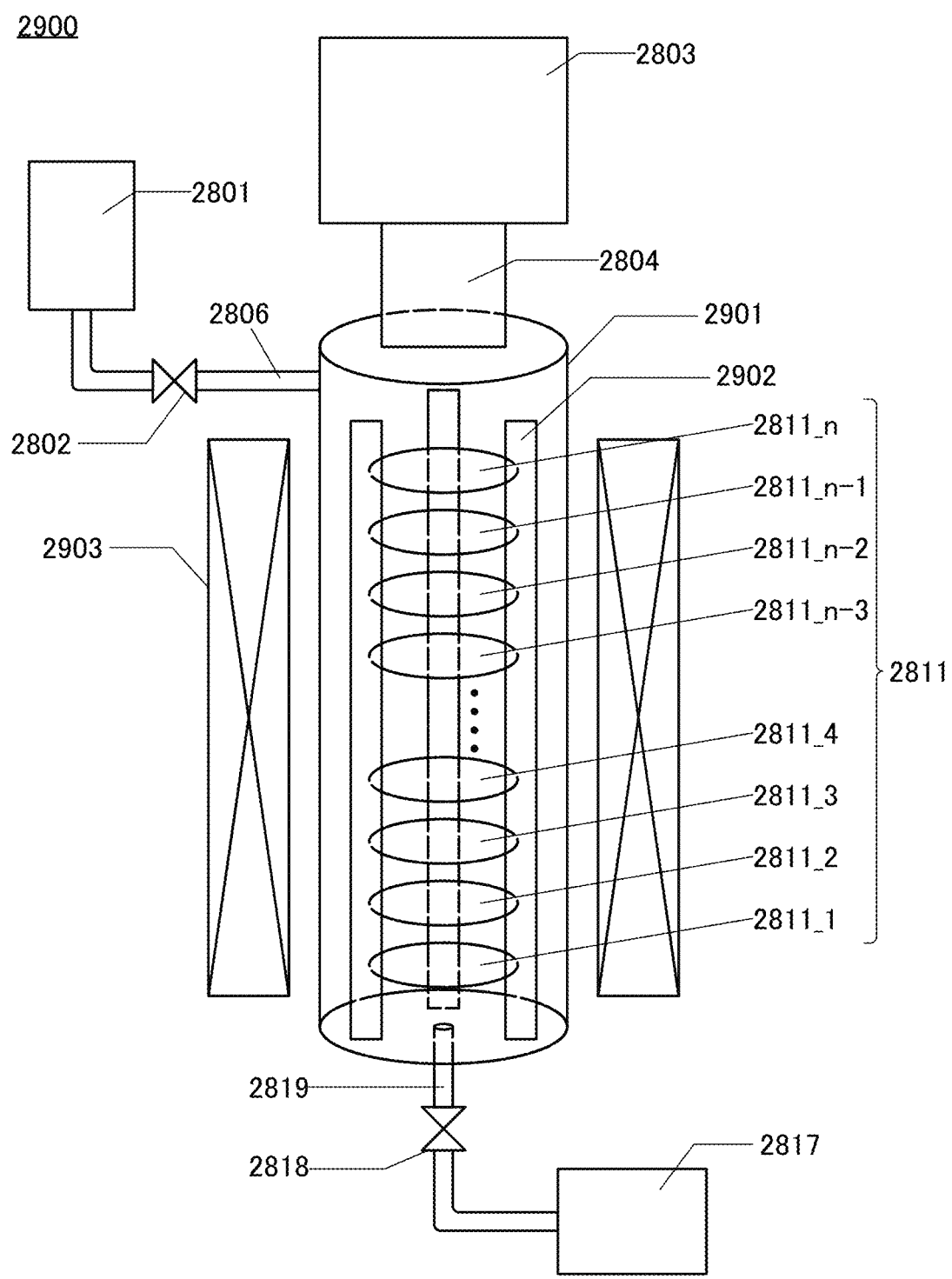
FIG. 28 is a cross-sectional view illustrating a microwave treatment apparatus of one embodiment of the present invention.

Next, the chamber 2706*a* and the chamber 2706*d* are described with reference to a schematic cross-sectional view illustrated in FIG. 27.

The chamber 2706*a* and the chamber 2706*d* are chambers in which an object can be irradiated with an electromagnetic wave, for example. Note that the chamber 2706*a* is different from the chamber 2706*d* only in the kind of the electromagnetic wave. The other structures have many common portions and thus are collectively described below.

The chamber 2706*a* and the chamber 2706*d* each include one or more lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak at a wavelength longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp can used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

A microwave treatment apparatus that can be used in this embodiment is not limited to the above. A microwave treatment apparatus 2900 illustrated in FIG. 28 can be used. The microwave treatment apparatus 2900 includes a quartz tube 2901, the exhaust port 2819, the gas supply source 2801, the valve 2802, the high-frequency generator 2803, the waveguide 2804, the gas pipe 2806, the vacuum pump 2817, and the valve 2818. Furthermore, the microwave treatment apparatus 2900 includes a substrate holder 2902 that holds a plurality of substrates 2811 (2811_1 to 2811_*n*, n is an integer greater than or equal to 2) in the quartz tube 2901. The microwave treatment apparatus 2900 may further include a heating means 2903 outside the quartz tube 2901.

The substrate provided in the quartz tube 2901 is irradiated with the microwave generated by the high-frequency generator 2803, through the waveguide 2804. The vacuum pump 2817 is connected to the exhaust port 2819 through the valve 2818 and can adjust the pressure inside the quartz tube 2901. The gas supply source 2801 is connected to the gas pipe 2806 through the valve 2802 and can introduce a desired gas into the quartz tube 2901. The heating means 2903 can heat the substrate 2811 in the quartz tube 2901 to a desired temperature. Alternatively, the heating means 2903 may heat the gas which is supplied from the gas supply source 2801. With the use of the microwave treatment apparatus 2900, the substrate 2811 can be subjected to heat treatment and microwave treatment at the same time. Alternatively, the substrate 2811 can be heated and then subjected to microwave treatment. Alternatively, the substrate 2811 can be subjected to microwave treatment and then heat treatment.

All of the substrate 2811_1 to the substrate 2811_*n* may be substrates to be treated where a semiconductor device or a storage device is to be formed, or some of the substrates may be dummy substrates. For example, the substrate 2811_1 and the substrate 2811_*n* may be dummy substrates and the substrate 2811_2 to the substrate 2811_*n*–1 may be substrates to be treated. Alternatively, the substrate 2811_1, the substrate 2811_2, the substrate 2811_*n*–1, and the substrate 2811_*n* may be dummy substrates and the substrate 2811_3 to the substrate 2811_*n*–2 may be substrates to be treated. A dummy substrate is preferably used, in which case a plurality of substrates to be treated can be uniformly treated at the time of microwave treatment or heat treatment and a variation between the substrates to be treated can be reduced. For example, a dummy substrate is preferably placed over the substrate to be treated which is the closest to the high-frequency generator 2803 and the waveguide 2804, in which case the substrate to be treated is inhibited from being directly exposed to a microwave.

With the use of the above-described manufacturing apparatus, the quality of a film or the like can be modified while the entry of impurities into an object is inhibited.

<Variation Example of Semiconductor Device>

Examples of the semiconductor device of one embodiment of the present invention are described below with reference to FIG. 6A to FIG. 8B.

A of each figure is a top view of the semiconductor device. Moreover, B of each figure is a cross-sectional view corresponding to a portion indicated by dashed-dotted line A1-A2 in A of each figure. Note that for clarity of the drawing, some components are omitted in the top view of A of each figure.

Note that in the semiconductor device illustrated in A and B of each figure, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

<Variation Example 1 of Semiconductor Device>

Figure 6A:
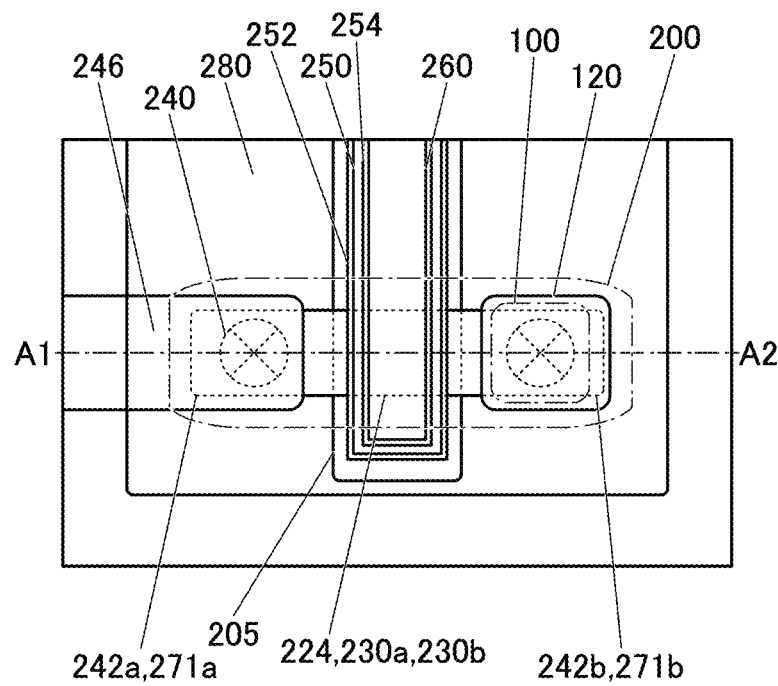
FIG. 6A is a top view of a semiconductor device of one embodiment of the present invention.
Figure 6B:
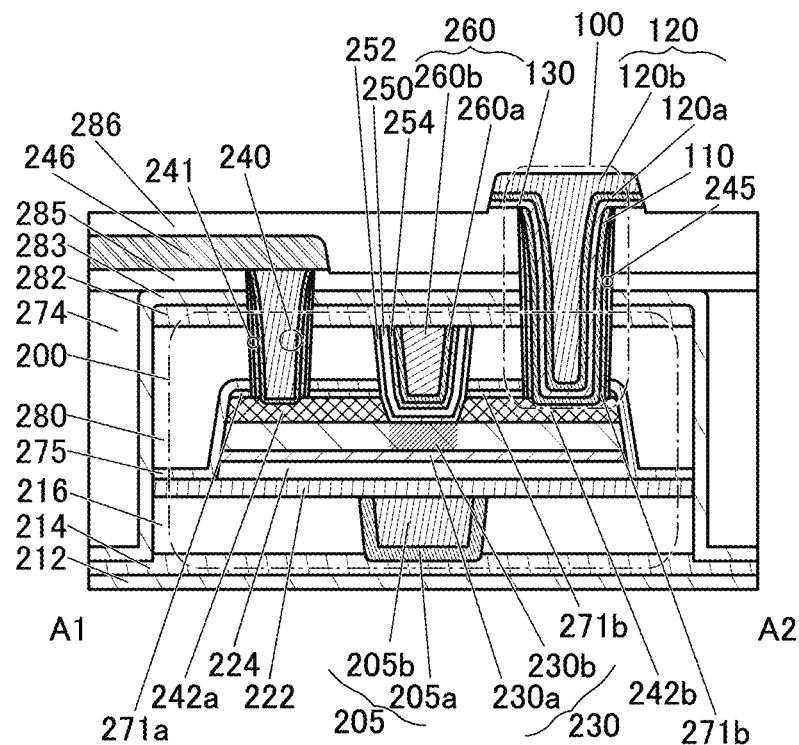
FIG. 6B is a cross-sectional view of the semiconductor device of one embodiment of the present invention.

A semiconductor device illustrated in FIG. 6A and FIG. 6B is a variation example of the semiconductor device illustrated in FIG. 3A to FIG. 3D. The semiconductor device illustrated in FIG. 6A and FIG. 6B is different from the semiconductor device illustrated in FIG. 3A to FIG. 3D in being provided with a conductor 240 and a conductor 246. Here, the conductor 240 functions as a plug electrically connected to one of the source and the drain of the transistor 200, and the conductor 246 functions as a wiring connected to the plug.

The conductor 240 is provided so as to be embedded in an opening formed in the insulator 271, the insulator 275, the insulator 280, the insulator 282, the insulator 283, and the insulator 285. The bottom surface of the conductor 240 is in contact with the top surface of the conductor 242*a*. For the conductor 240, a conductive material containing tungsten, copper, or aluminum as its main component is preferably used, for example. The conductor 240 may have a stacked-layer structure of a thin first conductor provided along the side surface and the bottom surface of the opening and a second conductor over the first conductor.

In the case where the conductor 240 has a stacked-layer structure, a conductive material having a function of inhibiting passage of impurities such as water and hydrogen is preferably used as the first conductor positioned in the vicinity of the insulator 285 and the insulator 280. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240. As the second conductor, the above-described conductive material containing tungsten, copper, or aluminum as its main component may be used, for example.

Although the conductor 240 illustrated in FIG. 6B is a stack of the first conductor and the second conductor, the present invention is not limited thereto. For example, the conductor 240 may be provided to have a single-layer structure or a stacked-layer structure of three or more layers.

The conductor 246 may be placed in contact with the top surface of the conductor 240. The conductor 246 is preferably formed using a conductive material containing tungsten, copper, or aluminum as its main component. The conductor 246 may have a stacked-layer structure; for example, stacked layers of titanium or titanium nitride and the above-described conductive material may be employed. As illustrated in FIG. 6B, the top surface of the insulator 285 is higher in a region where the insulator 285 overlaps with the conductor 246 than in a region where the insulator 285 does not overlap with the conductor 246, in some cases. The conductor 246 may be formed to be embedded in an opening provided in an insulator.

An insulator 241 functioning as a barrier insulating film is preferably provided between the conductor 240 and the insulator 280. The insulator 245 is preferably placed in contact with the side surface of the opening that is formed in the insulator 271, the insulator 275, the insulator 280, the insulator 282, the insulator 283, and the insulator 285. The insulator 241 preferably has a structure similar to that of the above-described insulator 245.

In this variation example, an insulator 286 covering the conductor 246 and the insulator 285 is provided. The insulator 286 may be formed using an insulating material that can be used for the insulator 285.

In this variation example, the capacitor 100 is formed after the conductor 240, the conductor 246, and the insulator 286 are formed. Thus, unlike the semiconductor device illustrated in FIG. 3A to FIG. 3D, part of the bottom surface of the insulator 130 and part of the side surface of the insulator 245 are in contact with the insulator 286. That is, the depth of the opening in which the capacitor 100 is embedded is increased in accordance with the thickness of the insulator 286. This can increase the capacitance of the capacitor 100 without increasing the area of the semiconductor device.

<Variation Example 2 of Semiconductor Device>

Figure 7A:
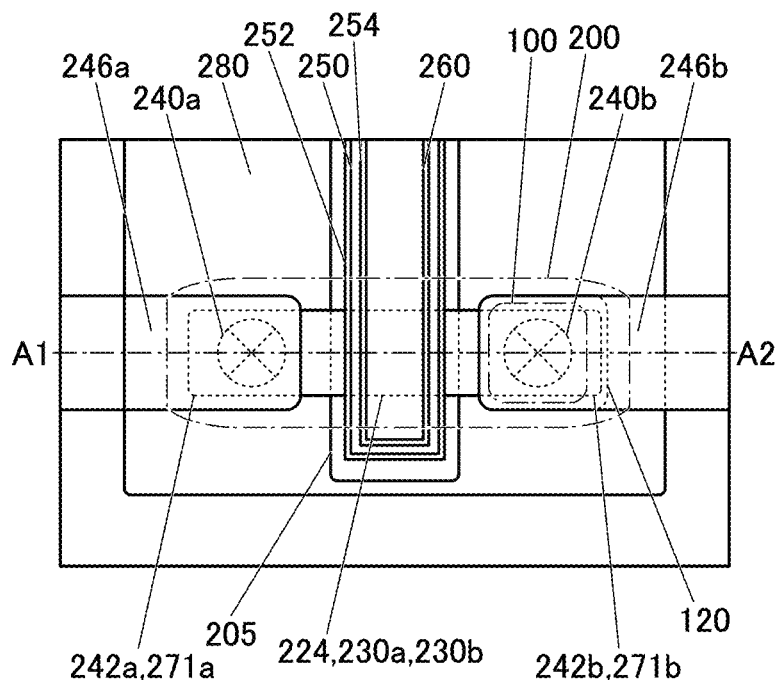
FIG. 7A is a top view of a semiconductor device of one embodiment of the present invention.
Figure 7B:
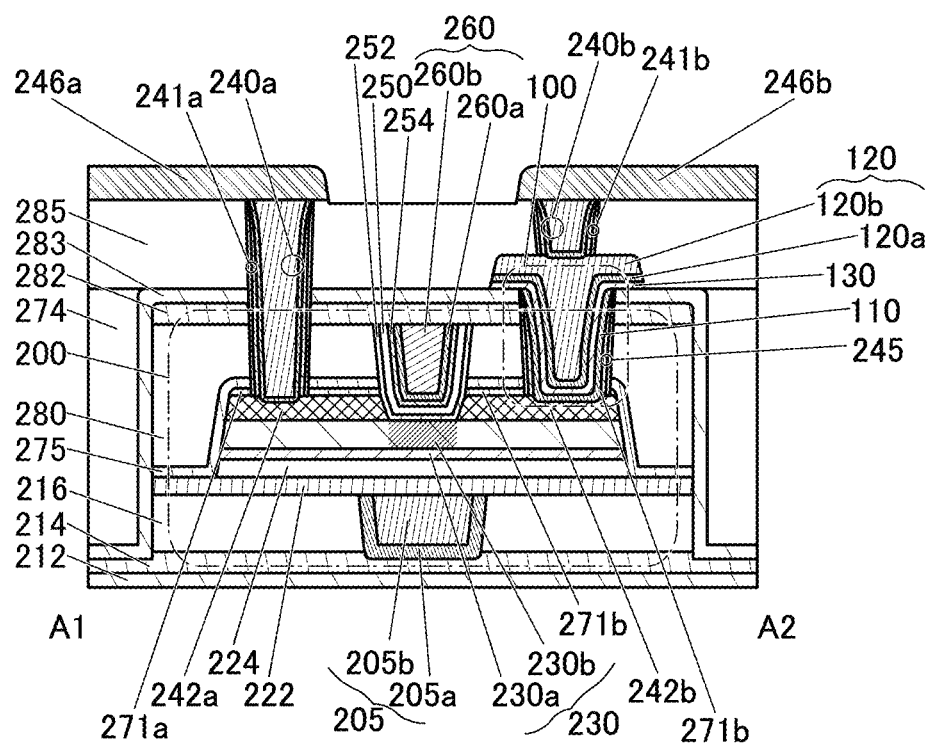
FIG. 7B is a cross-sectional view of the semiconductor device of one embodiment of the present invention.

A semiconductor device illustrated in FIG. 7A and FIG. 7B is a variation example of the semiconductor device illustrated in FIG. 6A and FIG. 6B. The semiconductor device illustrated in FIG. 7A and FIG. 7B includes an insulator 241a, a conductor 240a, and a conductor 246a over the conductor 242a in a manner similar to that of a semiconductor device illustrated in FIG. 6A and FIG. 6B. Furthermore, an insulator 241b, a conductor 240b, and a conductor 246b are included over the conductor 120. Here, the conductor 240b functions as a plug electrically connected to one of terminals of the capacitor 100, and the conductor 246b functions as a wiring connected to the plug.

Note that a conductive material similar to that for the above-described insulator 241 can be used for the insulator 241a and the insulator 241b. Furthermore, a conductive material similar to that for the above-described conductor 240 can be used for the conductor 240a and the conductor 240b. Furthermore, a conductive material similar to that for the above-described conductor 246 can be used for the conductor 246a and the conductor 246b.

Unlike the semiconductor device illustrated in FIG. 6A and FIG. 6B, the semiconductor device illustrated in FIG. 7A and FIG. 7B has a structure in which the conductor 240a and the conductor 240b are formed after the capacitor 100 is formed. Thus, the bottom surfaces of the conductor 246a and the conductor 246b are in contact with the top surface of the insulator 285 that is formed to cover the conductor 120.

Unlike the semiconductor device illustrated in FIG. 3A to FIG. 3D, the semiconductor device illustrated in FIG. 7A and FIG. 7B has a structure in which an interlayer insulating film is not provided between the insulator 283 and the insulator 130 and the bottom surface of the insulator 130 is in contact with the top surface of the insulator 283.

<Variation Example 3 of Semiconductor Device>

Figure 8A:
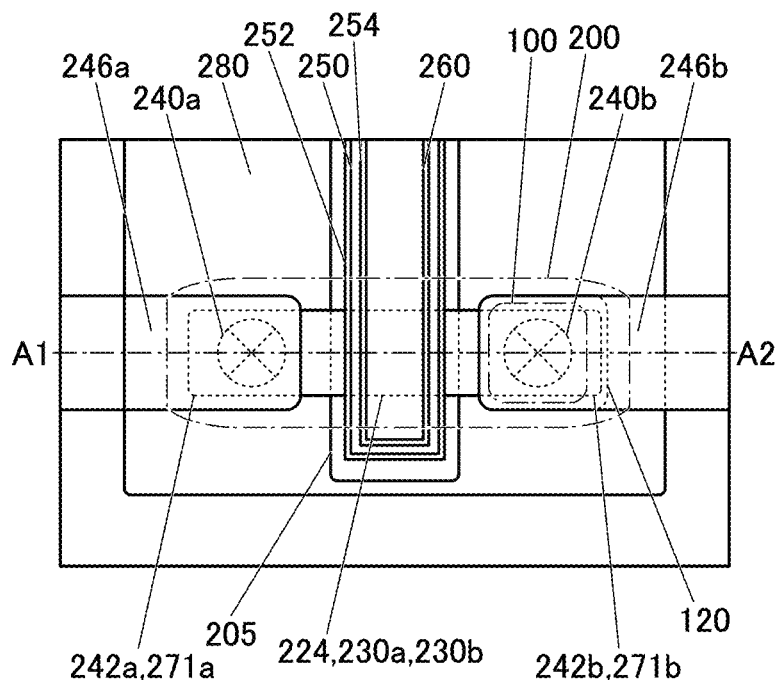
FIG. 8A is a top view of a semiconductor device of one embodiment of the present invention.
Figure 8B:
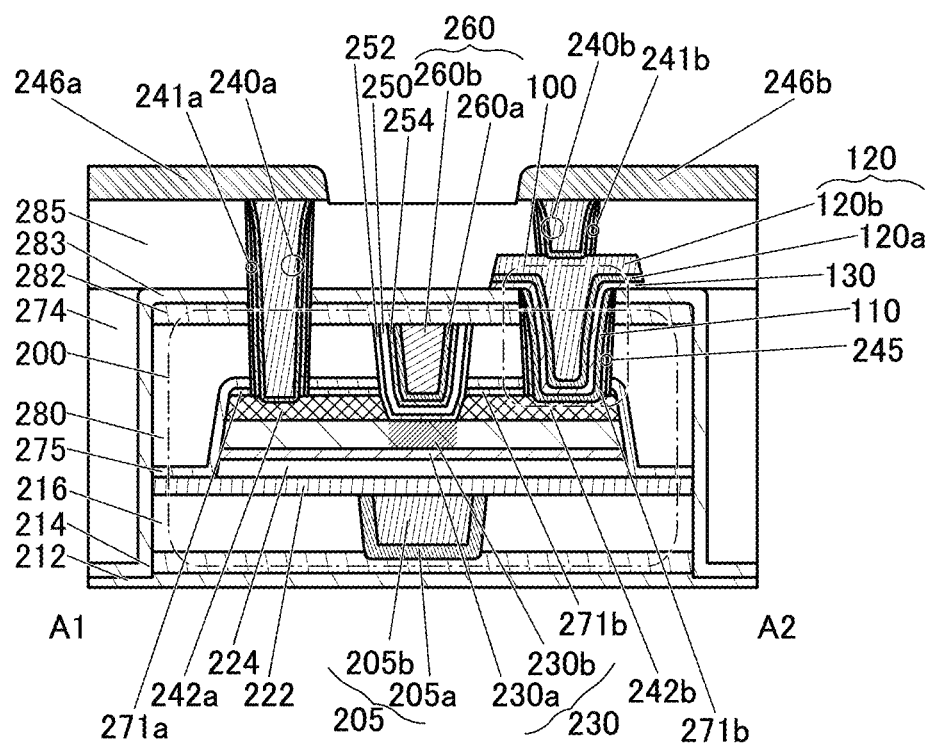
FIG. 8B is a cross-sectional view of the semiconductor device of one embodiment of the present invention.
Figure 9A:
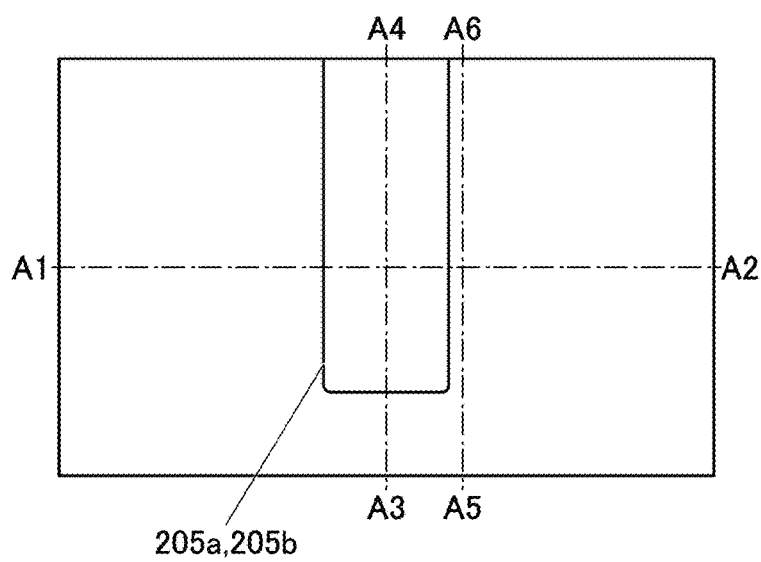
FIG. 9A is a top view illustrating a method for manufacturing a semiconductor device of one embodiment of the present invention.
Figure 9C:
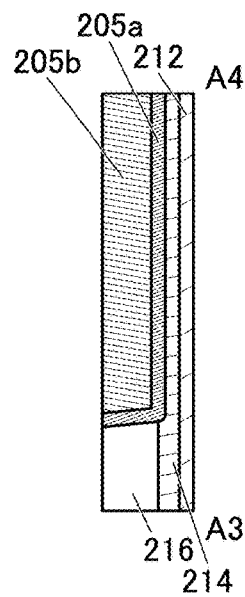
FIG. 9B to FIG. 9D are cross-sectional views illustrating the method for manufacturing a semiconductor device of one embodiment of the present invention.
Figure 9B:
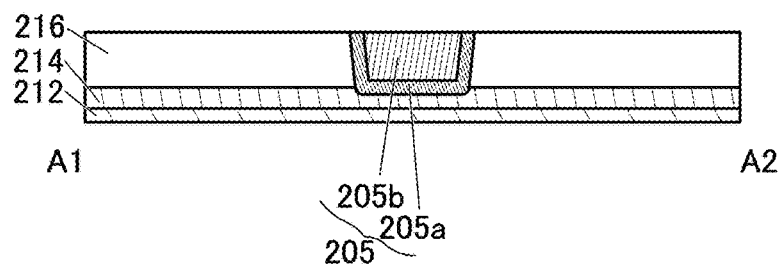
Figure 9D:
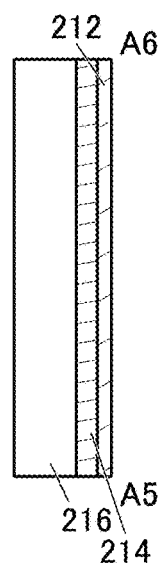
Figure 10A:
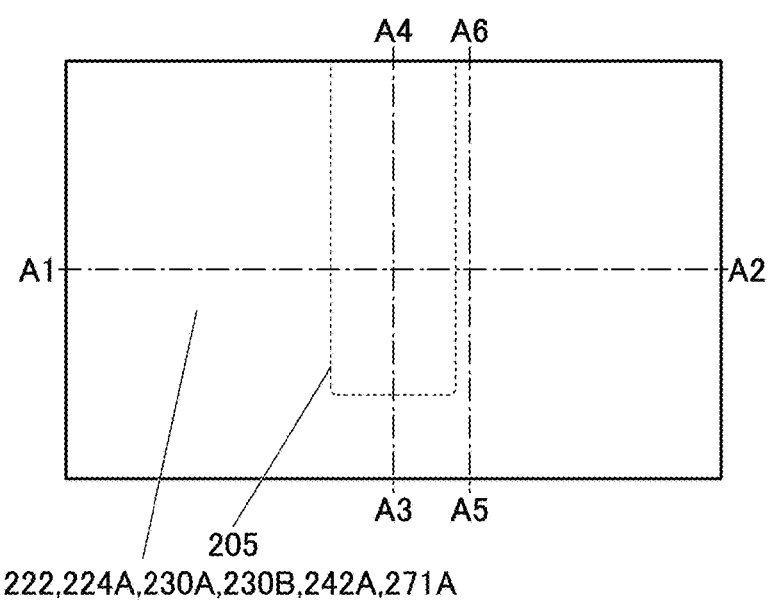
FIG. 10A is a top view illustrating a method for manufacturing a semiconductor device of one embodiment of the present invention.
Figure 10C:
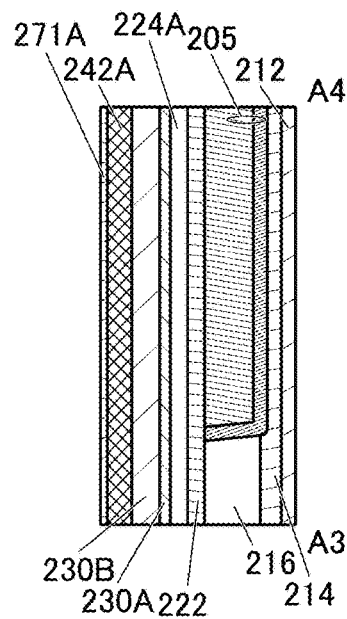
FIG. 10B to FIG. 10D are cross-sectional views illustrating a method for manufacturing a semiconductor device of one embodiment of the present invention.
Figure 10B:
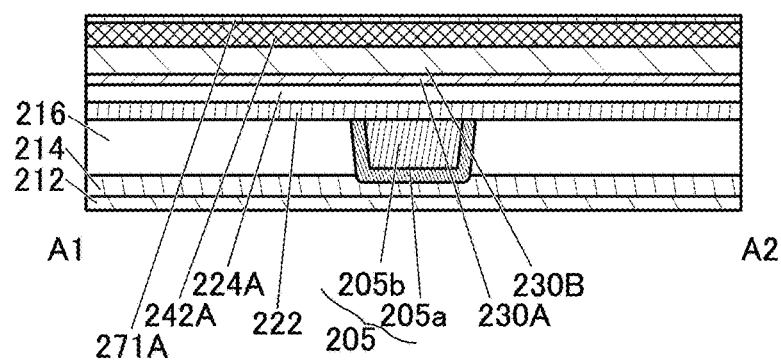
Figure 10D:
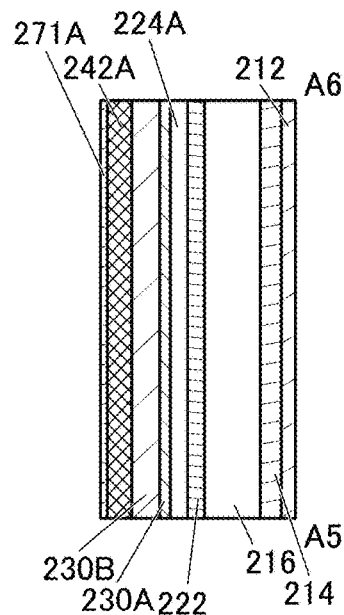

The semiconductor device illustrated in FIG. 8A and FIG. 8B is a variation example of the semiconductor device illustrated in FIG. 7A and FIG. 7B. The semiconductor device illustrated in FIG. 8A and FIG. 8B is different from the semiconductor device illustrated in FIG. 7A and FIG. 7B in that the insulator 283 is in contact with part of the top surface of the insulator 212. Accordingly, the transistor 200 is placed in a region sealed with the insulator 283 and the insulator 212. With the above structure, entry of hydrogen contained in a region outside the sealed region into the sealed region can be inhibited. Although FIG. 8A and FIG. 8B illustrate the transistor 200 having a structure in which the insulator 212 and the insulator 283 are each provided to have a single-layer structure, the present invention is not limited thereto. For example, the insulator 212 and the insulator 283 may each be provided to have a stacked-layer structure of two or more layers.

<Application Example of Semiconductor Device>

An example of the semiconductor device of one embodiment of the present invention will be described below with reference to FIG. 29.

Figure 29A:
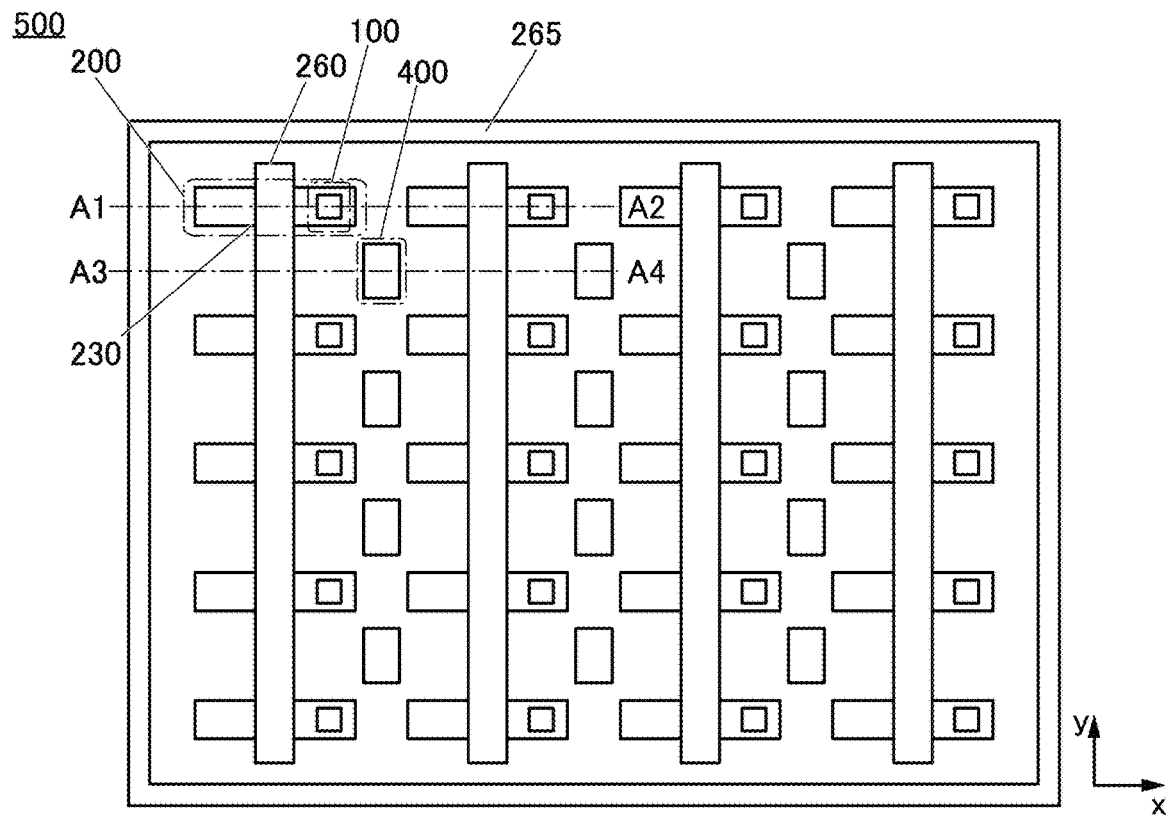
FIG. 29A is a plan view of a semiconductor device of one embodiment of the present invention.
Figure 29B:
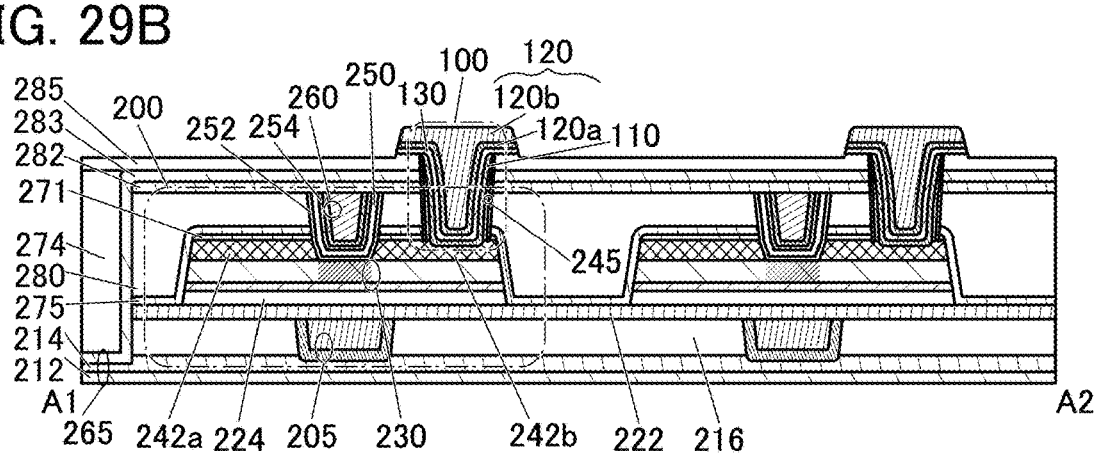
FIG. 29B and FIG. 29C are cross-sectional views of the semiconductor device of one embodiment of the present invention.
Figure 29C:
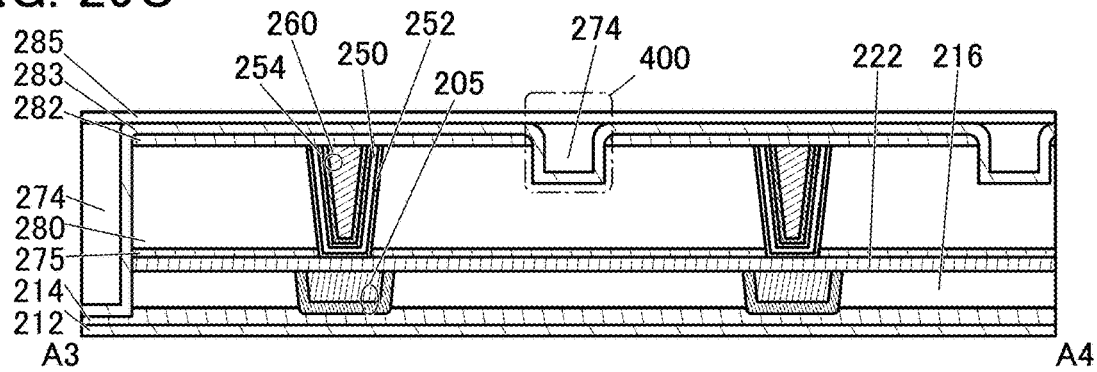

FIG. 29A is a top view of a semiconductor device 500. In FIG. 29A, the x-axis is parallel to the channel length direction of the transistor 200, and the y-axis is perpendicular to the x-axis. FIG. 29B is a cross-sectional view taken along the dashed-dotted line A1-A2 in FIG. 29A, which corresponds to a cross-sectional view in the channel length direction of the transistor 200. FIG. 29C is a cross-sectional view taken along the dashed-dotted line A3-A4 in FIG. 29A, which corresponds to a cross-sectional view of an opening region 400 and the vicinity thereof. Note that for clarity of the drawing, some components are omitted in the top view in FIG. 29A.

Note that in the semiconductor device illustrated in FIG. 29A to FIG. 29C, components having the same functions as the components in the semiconductor device described in <Structure example of semiconductor device> are denoted by the same reference numerals. Note that also in this section, the materials described in detail in <Structure example of semiconductor device> can be used as component materials of the semiconductor device.

The semiconductor device 500 illustrated in FIG. 29A to FIG. 29C is a variation example of the semiconductor device illustrated in FIG. 3A to FIG. 3D. The semiconductor device 500 illustrated in FIG. 29A to FIG. 29C is different from the semiconductor device in FIG. 3A to FIG. 3D in that the opening region 400 is formed in the insulator 282 and the insulator 280. Moreover, a sealing portion 265 is formed to surround a plurality of transistors 200 and a plurality of capacitors 100, which is a different point from the semiconductor device illustrated in FIG. 3A to FIG. 3D.

The semiconductor device 500 includes a plurality of transistors 200, a plurality of capacitors 100, and a plurality of opening regions 400 arranged in a matrix. In addition, a plurality of conductors 260 functioning as gate electrodes of the transistors 200 are provided to extend in the y-axis direction. The opening regions 400 are provided in regions not overlapping with the oxide 230 or the conductor 260. The sealing portion 265 is formed so as to surround the plurality of transistors 200, the plurality of capacitors 100, the plurality of conductors 260, and the plurality of opening regions 400. Note that the number, the position, and the size of the transistors 200, the capacitors 100, the conductors 260, and the opening regions 400 are not limited to those illustrated in FIG. 29 and may be set as appropriate in accordance with the design of the semiconductor device 500.

As illustrated in FIG. 29B and FIG. 29C, the sealing portion 265 is provided to surround the plurality of transistors 200 and the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with the top surface of the insulator 214. In the sealing portion 265, an insulator 274 is provided between the insulator 283 and the insulator 285. The top surface of the insulator 274 is substantially level with the uppermost surface of the insulator 283. As the insulator 274, an insulator similar to the insulator 280 can be used.

Such a structure enables the plurality of transistors 200 to be surrounded by the insulator 283, the insulator 214, and the insulator 212. One or more of the insulator 283, the insulator 214, and the insulator 212 preferably function as a barrier insulating film against hydrogen. Accordingly, entry of hydrogen contained in the region outside the sealing portion 265 into a region in the sealing portion 265 can be inhibited.

As illustrated in FIG. 29C, the insulator 282 in the opening region 400 has an opening portion. In the opening region 400, the insulator 280 may have a groove to overlap with the opening portion in the insulator 282. The depth of the groove portion of the insulator 280 is less than or equal to the depth at which the top surface of the insulator 275 is exposed and is, for example, approximately greater than or equal to ¼ and less than or equal to ½ of the maximum thickness of the insulator 280.

As illustrated in FIG. 29C, the insulator 283 inside the opening region 400 is in contact with the side surface of the insulator 282, the side surface of the insulator 280, and the top surface of the insulator 280. Part of the insulator 274 is formed in the opening region 400 to fill the depressed portion formed in the insulator 283, in some cases. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to diffuse outwardly from the opening region 400 while oxygen is supplied to the oxide 230. This enables oxygen to be sufficiently supplied to the region functioning as the channel formation region and its vicinity in the oxide semiconductor from the insulator 280 containing oxygen to be released by heating, and also prevents an excess amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and hydrogen contained in the insulator 280 can be prevented from entering the oxide 230.

In FIG. 29A, the shape of the opening region 400 in the top view is substantially rectangular; however, the present invention is not limited to the shape. For example, the shape of the opening region 400 in the top view can be a rectangular shape, an elliptical shape, a circular shape, a rhombus shape, or a shape obtained by combining any of the above shapes. The area and arrangement interval of the opening regions 400 can be set as appropriate in accordance with the design of the semiconductor device including the transistor 200. For example, in the region where the density of the transistors 200 is low, the area of the opening region 400 may be increased or the arrangement interval of the opening regions 400 may be narrowed. For example, in the region where the density of the transistors 200 is high, the area of the opening region 400 may be decreased, or the arrangement interval of the opening regions 400 may be increased.

According to one embodiment of the present invention, a novel transistor can be provided. According to another embodiment of the present invention, a semiconductor device with a small variation in transistor characteristics can be provided. According to another embodiment of the present invention, a semiconductor device with favorable electrical characteristics can be provided. According to another embodiment of the present invention, a highly reliable semiconductor device can be provided. According to another embodiment of the present invention, a semiconductor device with a high on-state current can be provided. According to another embodiment of the present invention, a semiconductor device with a high field-effect mobility can be provided. According to another embodiment of the present invention, a semiconductor device with high frequency characteristics can be provided. According to another embodiment of the present invention, a semiconductor device that can be miniaturized or highly integrated can be provided. According to another embodiment of the present invention, a semiconductor device with low power consumption can be provided.

With one embodiment of the present invention, a capacitor including a material that can have ferroelectricity can be provided. With one embodiment of the present invention, the above-described capacitor can be provided with favorable productivity. With one embodiment of the present invention, a semiconductor device including the above-described capacitor and a transistor can be provided. With one embodiment of the present invention, the above-described semiconductor device that can be miniaturized or highly integrated can be provided.

At least part of the structure, method, and the like described in this embodiment can be implemented in appropriate combination with any of those in the other embodiments and the other examples described in this specification.

Embodiment 2

In this embodiment, a method for manufacturing a capacitor of one embodiment of the present invention is described with reference to FIG. 1A to FIG. 1C.

As illustrated in FIG. 1A, the conductor 110 is deposited over a substrate (not shown). The conductor 110 can be deposited by a sputtering method, a CVD method, a MBE method, a PLD method, an ALD method, or the like. By using the ALD method, a conductive film with high planarity can easily be deposited as the conductor 110, in some cases. For example, titanium nitride may be deposited by a thermal ALD method. The conductor 110 may be formed into a pattern by a lithography method or the like as appropriate.

Figure 1B:
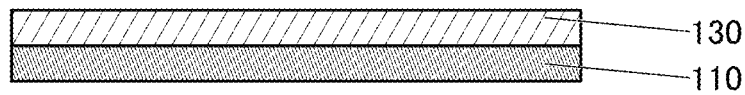

Next, as illustrated in FIG. 1B, the insulator 130 is deposited over the conductor 110. The insulator 130 can be deposited by a sputtering method, a CVD method, an ALD method, or the like. For example, the insulator 130 can be deposited over the conductor 110 with good coverage by using an ALD method. This can inhibit the occurrence of a leakage current between a upper electrode and a lower electrode of a capacitor 100.

The insulator 130 is preferably formed using a material that can have ferroelectricity. As examples of the material that can have ferroelectricity, hafnium oxide, zirconium oxide, $HfZrO_x$ (x is a real number greater than 0), a material obtained by adding an element J1 (the element J1 here is zirconium (Zr), silicon (Si), aluminum (Al), gadolinium (Gd), yttrium (Y), lanthanum (La), or strontium (Sr), for example) to hafnium oxide, and a material obtained by adding an element J2 (the element J2 here is hafnium (Hf), silicon (Si), aluminum (Al), gadolinium (Gd), yttrium (Y), lanthanum (La), or strontium (Sr), for example) to zirconium oxide can be given. As the material that can have ferroelectricity, a piezoelectric ceramic having a perovskite structure such as $PbTiO_x$, barium strontium titanate (BST), strontium titanate, lead zirconate titanate (PZT), strontium bismuth tantalate (SBT), bismuth ferrite (BFO), or barium titanate may be used. As the material that can have ferroelectricity, a mixture or compound containing a plurality of materials selected from the above-described materials can be used, for example. Alternatively, the insulator 130 can have a stacked-layer structure of a plurality of materials selected from the above-described materials.

Hafnium oxide or a material containing hafnium oxide and zirconium oxide is especially preferable as the material that can have ferroelectricity because of being able to have ferroelectricity even when processed into a several-nanometer-thick thin film. Here, the thickness of the insulator 130 can be less than or equal to 100 nm, preferably less than or equal to 50 nm, further preferably less than or equal to 20 nm, still further preferably less than or equal to nm (typically greater than or equal to 2 nm and less than or equal to 9 nm). The capacitor 100 with the thin insulator 130 can be combined with a miniaturized transistor 200 to form a semiconductor device.

Figure 2:
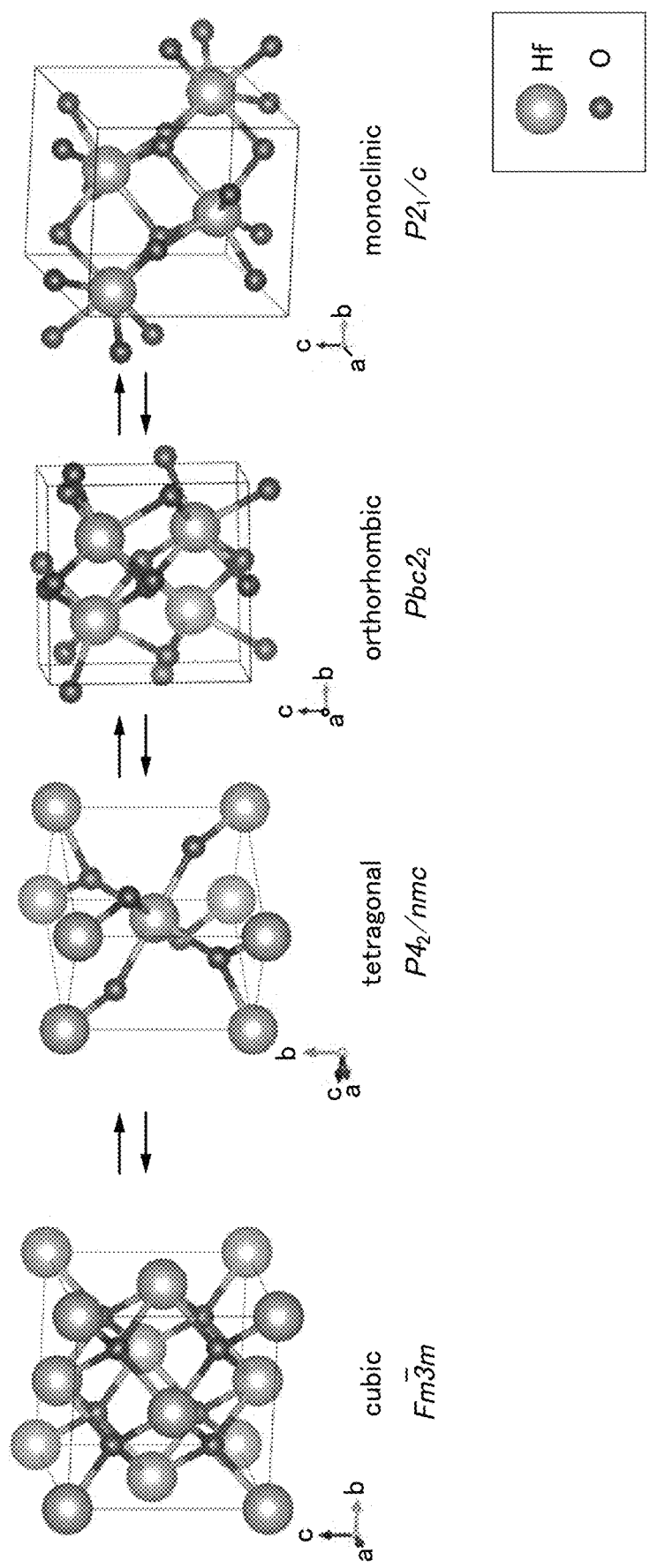
FIG. 2 is a model diagram illustrating crystal structures of hafnium oxide of one embodiment of the present invention.

Crystal structures of hafnium oxide, which is a material that can be used as the insulator 130, are described with reference to FIG. 2. FIG. 2 is a model diagram illustrating crystal structures of hafnium oxide ($HfO_2$ in this embodiment). Hafnium oxide is known to take on various crystal structures and, for example, can take on crystal structures illustrated in FIG. 2 such as cubic (space group: Fm-3m), tetragonal (space group: $P4_2$/nmc), orthorhombic (space group: $Pbc2_2$), and monoclinic (space group: $P2_1$/c) crystal structures. As illustrated in FIG. 2, phase transition can occur between the above-described crystal structures. For example, the crystal structure of hafnium oxide can be changed from a monoclinic crystal structure to an orthorhombic crystal structure when the hafnium oxide is doped with zirconium to form a composite material.

In the case where hafnium oxide and zirconium oxide are alternately deposited by an ALD method so as to achieve a composition ratio of hafnium oxide to zirconium oxide of 1:1 as the above-described composite material, the composite material has an orthorhombic crystal structure. Alternatively, the composite material has an amorphous structure, and the application of heat treatment or the like to the composite material can change the crystal structure from the amorphous structure to an orthorhombic crystal structure. In some cases, the orthorhombic crystal structure can change to a monoclinic crystal structure. To make the above-described composite material have ferroelectricity, an orthorhombic crystal structure is preferred to a monoclinic crystal structure.

Note that the crystal structure of the insulator 130 is not particularly limited. The insulator 130 may have any one or more of crystal structures selected from cubic, tetragonal, orthorhombic, and monoclinic crystal structures. The insulator 130 especially preferably has an orthorhombic crystal structure to exhibit ferroelectricity. Alternatively, the crystal structure of the insulator 130 may be an amorphous structure. Alternatively, the insulator 130 may have a composite structure of an amorphous structure and a crystal structure.

In the case where a material containing hafnium oxide and zirconium oxide ($HfZrO_x$) is used as the insulator 130, a thermal ALD method is preferably used for the deposition.

Furthermore, in the case where the insulator 130 is deposited by a thermal ALD method, a material that does not contain a hydrocarbon (also referred to as Hydro Carbon or HC) is suitably used as a precursor. In the case where one or both of hydrogen and carbon are contained in the insulator 130, crystallization of the insulator 130 might be inhibited. Thus, using a precursor that does not contain a hydrocarbon in the above-described manner is preferable in order to reduce the concentration of one or both of hydrogen and carbon in the insulator 130. For example, as the precursor that does not contain a hydrocarbon, a chlorine-based material can be given. Note that in the case where a material containing hafnium oxide and zirconium oxide ($HfZrO_x$) is used as the insulator 130, $HfCl_4$ and/or $ZrCl_4$ is preferably used as the precursor.

In the case where the insulator 130 is deposited by a thermal ALD method, $H_2O$ or $O_3$ can be used as an oxidizer. As the oxidizer in the thermal ALD method, $O_3$ is more suitably used than $H_2O$ to reduce the concentration of hydrogen in the film. However, the oxidizer in the thermal ALD method is not limited thereto. For example, the oxidizer in the thermal ALD method may contain any one or more selected from $O_2$, $O_3$, $N_2O$, $NO_2$, $H_2O$, and $H_2O_2$.

Figure 1C:
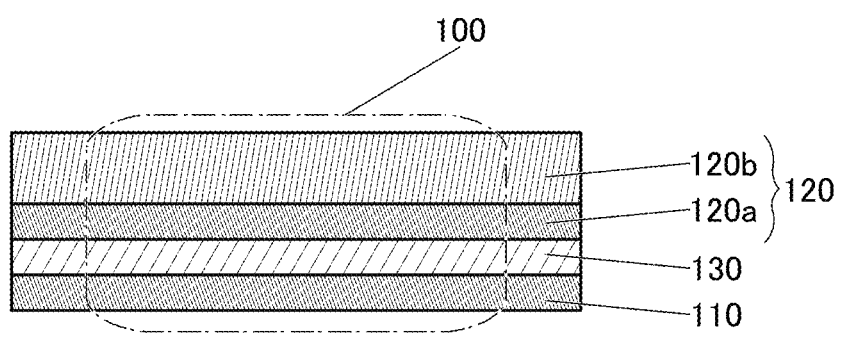

Next, as illustrated in FIG. 1C, the conductor 120 is deposited over the insulator 130. Here, the conductor 120 is placed so as to be separated from the conductor 110 with the insulator 130 positioned therebetween. As described in the above embodiment, the conductor 120 may have a stacked-layer structure of the conductor 120a provided on and in contact with the insulator 130 and the conductor 120b provided on and in contact with the conductor 120a.

The conductor 120a may be deposited by an ALD method, a CVD method, or the like. For example, titanium nitride may be deposited by a thermal ALD method. Here, the conductor 120a is preferably deposited while the substrate is heated, for example, by a thermal ALD method. For example, the substrate temperature during the deposition is higher than or equal to room temperature, preferably higher than or equal to 300° C., further preferably higher than or equal to 325° C., still further preferably higher than or equal to 350° C. Furthermore, the substrate temperature during the deposition is lower than or equal to 500° C., preferably lower than or equal to 450° C., for example. For example, the substrate temperature is approximately 400° C.

The deposition of the conductor 120a within the above-described temperature range enables the insulator 130 to have ferroelectricity even without high-temperature baking treatment (e.g., baking treatment at a heat treatment temperature of 400° C. or higher or 500° C. or higher) after the formation of the conductor 120a.

When the conductor 120a is deposited by an ALD method, which causes relatively little damage to a base, as described above, the crystal structure of the insulator 130 can be inhibited from being broken excessively, which leads to higher ferroelectricity of the insulator 130.

For example, in the case where the conductor 120a is formed by a sputtering method or the like, a base film, i.e., the insulator 130 here can be damaged. For example, in the case where a material containing hafnium oxide and zirconium oxide ($HfZrO_x$) is used as the insulator 130 and the conductor 120a is formed by a sputtering method, $HfZrO_x$, which is the base film, is damaged by a sputtering method and the crystal structure of $HfZrO_x$ (typically, an orthorhombic crystal structure or the like) can be broken. Therefore, the conductor 120a is preferably deposited by an ALD method, which causes relatively little damage to a base.

When heat treatment is performed after the conductor 120a is deposited by a sputtering method, the damage of the $HfZrO_x$ crystal structure can be fixed.

Here, in some cases, a dangling bond (e.g., O*) in $HfZrO_x$ is bonded to hydrogen contained in $HfZrO_x$, making it impossible to fix the damage of the $HfZrO_x$ crystal structure. The dangling bond in $HfZrO_x$ is formed, for example, by damage caused by deposition of the conductor 120a by a sputtering method.

Thus, a material that does not contain hydrogen or contains an extremely small amount of hydrogen is suitably used as the insulator 130, which is $HfZrO_x$ here. For example, the concentration of hydrogen contained in the insulator 130 is preferably less than or equal to $5 \times 10^{20}$ atoms/cm$^3$, further preferably less than or equal to $1 \times 10^{20}$ atoms/cm$^3$.

Furthermore, as described above, in order to reduce the concentration of hydrogen in the insulator 130, the material that does not contain a hydrocarbon is suitably used as the precursor. This may make the insulator 130 a film that does not contain a hydrocarbon as a main component or contains an extremely small amount of hydrocarbon. For example, the concentration of carbon of the hydrocarbon contained in the insulator 130 is preferably less than or equal to $5\times10^{20}$ atoms/cm$^3$, further preferably less than or equal to $1\times10^{20}$ atoms/cm$^3$.

Moreover, in the case where the material that does not contain a hydrocarbon is used as the precursor in depositing the insulator 130, the insulator 130 may be a film that does not contain carbon as a main component or contains an extremely small amount of carbon. For example, the concentration of carbon contained in the insulator 130 is preferably less than or equal to $5\times10^{20}$ atoms/cm$^3$, further preferably less than or equal to $1\times10^{20}$ atoms/cm$^3$.

As the insulator 130, a material that contains an extremely small amount of at least one or more of hydrogen, a hydrocarbon, and carbon is suitably used. Reducing the amount of hydrocarbon and carbon is especially important. Hydrocarbon molecules and carbon atoms, which are heavier than hydrogen, are difficult to remove in a subsequent step. Therefore, it is suitable to thoroughly remove a hydrocarbon and carbon when the insulator 130 is deposited.

By using a material that does not contain at least one or more of hydrogen, a hydrocarbon, and carbon or contains an extremely small amount of at least one or more of hydrogen, a hydrocarbon, and carbon as the insulator 130 as described above, the crystallinity of the insulator 130 can be increased and a structure with high ferroelectricity can be achieved.

When impurities in the film of the insulator 130, which are at least one or more of hydrogen, a hydrocarbon, and carbon here, are thoroughly removed in the above-described manner, a highly purified intrinsic film having ferroelectricity, which is a highly purified intrinsic capacitor here, can be formed. Note that the highly purified intrinsic capacitor having ferroelectricity and the highly purified intrinsic oxide semiconductor described in Embodiment 1 are highly compatible with each other in the manufacturing process. Thus, a method for manufacturing a semiconductor device with high productivity can be provided.

As described above, in one embodiment of the present invention, as the insulator 130, a ferroelectric material is formed by a thermal ALD method using a precursor that does not contain a hydrocarbon (typically, a chlorine-based precursor) and an oxidizer (typically $O_3$), for example. Then, the conductor 120a is formed by deposition by a thermal ALD method (typically, deposition at 400° C. or higher). Without performing annealing after the deposition, in other words, by utilizing the temperature during the deposition of the conductor 120a, the crystallinity or ferroelectricity of the insulator 130 can be increased. Note that increasing the crystallinity or ferroelectricity of the insulator 130 by utilizing the temperature during the deposition of the conductor 120a without performing annealing after the deposition of the conductor 120a is referred to as self-annealing, in some cases.

Note that the conductor 120b may be deposited by a sputtering method, an ALD method, a CVD method, or the like. For example, tungsten may be deposited by a metal CVD method.

In the above-described manner, the capacitor 100 illustrated in FIG. 1C, which includes the insulator 130 between the conductor 110 and the conductor 120, can be manufactured. As described above, in the capacitor 100 of this embodiment, the ferroelectricity of the insulator 130 can be increased even when high-temperature baking treatment is not performed after formation of the conductor 120a. Thus, the step of manufacturing a ferroelectric capacitor can be eliminated, which increases productivity of a ferroelectric capacitor and a semiconductor device including the ferroelectric capacitor.

With one embodiment of the present invention, a capacitor including a material that can have ferroelectricity can be provided. With one embodiment of the present invention, the above-described capacitor can be provided with favorable productivity. With one embodiment of the present invention, a capacitor that can be miniaturized or highly integrated can be provided.

At least part of the structure, method, and the like described in this embodiment can be implemented in appropriate combination with any of those in the other embodiments and the other examples described in this specification.

Embodiment 3

In this embodiment, one embodiment of a semiconductor device will be described with reference to FIG. 30.

[Structure Example of Storage Device]

Figure 30:
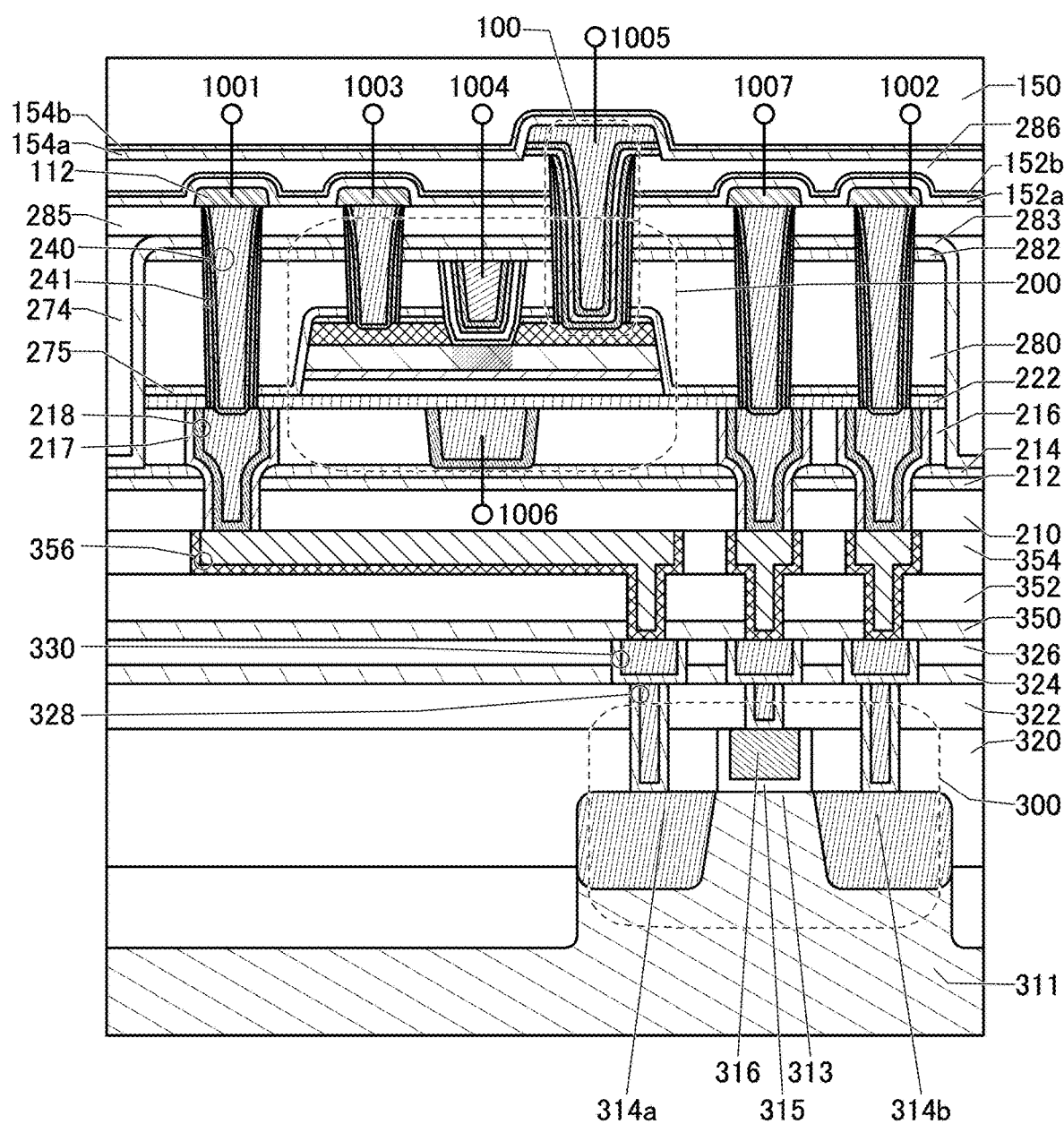
FIG. 30 is a cross-sectional view illustrating a structure of a storage device of one embodiment of the present invention.

FIG. 30 illustrates an example of a semiconductor device (storage device) of one embodiment of the present invention. In the semiconductor device of one embodiment of the present invention, the transistor 200 is provided above a transistor 300, and the capacitor 100 is provided above the transistor 300 and the transistor 200. Note that the transistor 200 described in the above embodiment can be used as the transistor 200. The capacitor 100 described in the above embodiment can be used as the capacitor 100. Although FIG. 30 illustrates an example in which the capacitor 100 and the transistor 200 illustrated in FIG. 6 are used, the present invention is not limited thereto; the capacitor 100 and the transistor 200 can be selected as appropriate.

A material that can have ferroelectricity, in which polarization internally occurs by being supplied with an electric field from the outside and the polarization remains even when the electric field is reduced to zero, is used in the capacitor 100. Thus, a nonvolatile storage element can be formed using the capacitor 100. In other words, a one-transistor one-capacitor ferroelectric memory can be formed using the capacitor functioning as a ferroelectric capacitor and the transistor 200.

The transistor 200 is a transistor in which a channel is formed in a semiconductor layer including an oxide semiconductor. The transistor 200 has a feature of high withstand voltage. Accordingly, high voltage can be applied to the transistor 200 formed using an oxide semiconductor even when the transistor 200 is miniaturized. The miniaturization of the transistor 200 can reduce the area occupied by the semiconductor device.

In the semiconductor device illustrated in FIG. 30, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, a wiring 1005 is electrically connected to one electrode of the capacitor 100, a wiring 1006 is electrically connected to a second gate of the transistor 200, and a wiring 1007 is electrically connected to a gate of the transistor 300.

When the storage devices each of which is illustrated in FIG. 30 are arranged in a matrix, a memory cell array can be formed.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 30, the semiconductor region 313 (part of the substrate 311) in which a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 30 is an example and the structure is not limited thereto; an appropriate transistor is used in accordance with a circuit structure or a driving method.

<Wiring Layer>

Wiring layers provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 30, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor included in the transistor 200 (a back gate of the transistor 200), and the like are embedded in an insulator 210, the insulator 212, the insulator 214, and the insulator 216. Note that the conductor 218 has a function of a plug or a wiring that is electrically connected to the capacitor 100 or the transistor 300.

Here, like the insulator 241 described in the above embodiment, an insulator 217 is provided in contact with the side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and each of the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used, for example. Since the insulator 217 is provided in contact with the insulator 210, the insulator 212, the insulator 214, and the insulator 222, entry of impurities such as water and hydrogen into the oxide 230 through the conductor 218 from the insulator 210, the insulator 216, or the like can be inhibited. In particular, silicon nitride is suitable because of its high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride can be deposited by a PEALD method and an opening reaching the conductor 356 can be formed by anisotropic etching.

Above the transistor 200, a conductor 112 is provided over the insulator 285 and the conductor 240. Note that the conductor 112 functions as a plug or a wiring that is electrically connected to the transistor 200 or the transistor 300. The insulator 286 is provided to cover the insulator 285 and the conductor 112. An insulator 150 is provided to cover the insulator 286 and the capacitor 100.

In addition, a barrier insulating film against hydrogen may be provided to cover the insulator 285 and the conductor 112. As illustrated in FIG. 30, as barrier insulating films against hydrogen, an insulator 152a covering the insulator 285 and the conductor 112 and an insulator 152b over the insulator 152a are preferably provided. As the insulator 152a and the insulator 152b, a barrier insulating film that can be used for the above-described insulator 283 or the like may be used. With the insulator 152a and the insulator 152b provided in the above manner, impurities such as hydrogen which are contained in the insulator 286 and the like can be inhibited from diffusing to the transistor 200 through the conductor 112 and the conductor 240

The insulator 152a is deposited by a sputtering method. For example, silicon nitride deposited by a sputtering method can be used as the insulator 152a. A deposition gas in a sputtering method need not include molecules containing hydrogen, and therefore the hydrogen concentration of the insulator 152a can be reduced. Since the hydrogen concentration of the insulator 152a in contact with the conductor 112 and the insulator 285 is reduced in this manner, hydrogen can be inhibited from diffusing from the insulator 152a to the conductor 112 and the insulator 285.

The insulator 152b is preferably deposited by an ALD method, particularly a PEALD method. For example, silicon nitride deposited by a PEALD method can be used as the insulator 152b. Thus, the insulator 152b can be deposited with good coverage; therefore, even when a pinhole, disconnection, or the like is generated in the insulator 152a owing to unevenness of the base, the insulator 152b covers it, whereby hydrogen can be inhibited from diffusing to the conductor 112 and the insulator 285.

Note that the methods for depositing the insulator 152a and the insulator 152b are not limited only to a sputtering method and an ALD method; a CVD method, an MBE method, a PLD method, or the like can also be used as appropriate. Although the two-layer structure of the insulator 152a and the insulator 152b is described above, the present invention is not limited thereto; a single-layer structure or a stacked-layer structure of three or more layers may be used.

The insulator 283 and the insulator 212 may be a barrier insulating film with a stacked-layer structure, as in the case of the insulator 152a and the insulator 152b.

Furthermore, similarly, a barrier insulating film against hydrogen may be provided to cover the insulator 286 and the capacitor 100. As illustrated in FIG. 30, an insulator 154a covering the insulator 286 and the capacitor 100 and an insulator 154b over the insulator 154a are preferably provided as barrier insulating films against hydrogen. A barrier insulating film similar to the insulator 152a and a barrier insulating film similar to the insulator 152b can be used as the insulator 154a and the insulator 154b, respectively. Providing the insulator 154a and the insulator 154b in this manner can inhibit impurities such as hydrogen contained in the insulator 150 and the like from diffusing to the transistor 200 through the capacitor 100.

Examples of an insulator that can be used as an interlayer film include insulating oxide, insulating nitride, insulating oxynitride, insulating nitride oxide, insulating metal oxide, insulating metal oxynitride, and insulating metal nitride oxide.

For example, when a material having a low relative permittivity is used for the insulator functioning as an interlayer film, parasitic capacitance generated between wirings can be reduced. Thus, a material is preferably selected depending on the function of an insulator.

For example, as the insulator 150, the insulator 210, the insulator 352, the insulator 354, and the like, an insulator having a low relative permittivity is preferably included. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance. Furthermore, as described in the above embodiment, the conductor 120a in the capacitor 100 is deposited by a method with substrate heating, such as a thermal ALD method, whereby the ferroelectricity of the insulator 130 can be enhanced even without performing high-temperature baking after the formation. Therefore, since the semiconductor device can be manufactured without performing high-temperature baking, it is possible to use a low-resistance conductive material with a low melting point, such as copper.

<Wiring or Plug in Layer Including Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 224 and the insulator 280 that contain excess oxygen in FIG. 30. Since the insulator 241 is provided in contact with the insulator 222, the insulator 282, and the insulator 283, the insulator 224 and the transistor 200 can be sealed with the insulators having a barrier property.

That is, the insulator 241 can inhibit excess oxygen contained in the insulator 224 and the insulator 280 from being absorbed by the conductor 240. In addition, providing the insulator 241 can inhibit diffusion of hydrogen, which is an impurity, into the transistor 200 through the conductor 240.

For the insulator 241, an insulating material having a function of inhibiting diffusion of oxygen and impurities such as water and hydrogen is preferably used. For example, silicon nitride, silicon nitride oxide, aluminum oxide, hafnium oxide, or the like is preferably used. In particular, silicon nitride is preferable because of its high blocking property against hydrogen. Alternatively, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 274, the insulator 285, the insulator 150, and the like into the insulator 280 and the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside. Note that although one transistor 200 is illustrated in the region sealed with the insulator 212, the insulator 283, and the like in FIG. 30, the structure is not limited thereto; a plurality of transistors 200 can be provided in the sealed region.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 30, a region in which the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of a memory cell including the plurality of transistors 200.

That is, in the opening provided in the insulator 282, the insulator 280, the insulator 275, the insulator 222, and the insulator 216, the insulator 214 is in contact with the insulator 283.

For example, an opening may be provided in the insulator 282, the insulator 280, the insulator 275, the insulator 222, the insulator 216, and the insulator 214. With such a structure, in the opening provided in the insulator 282, the insulator 280, the insulator 275, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate into the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

<Variation Example 1 of Storage Device>

Figure 31:
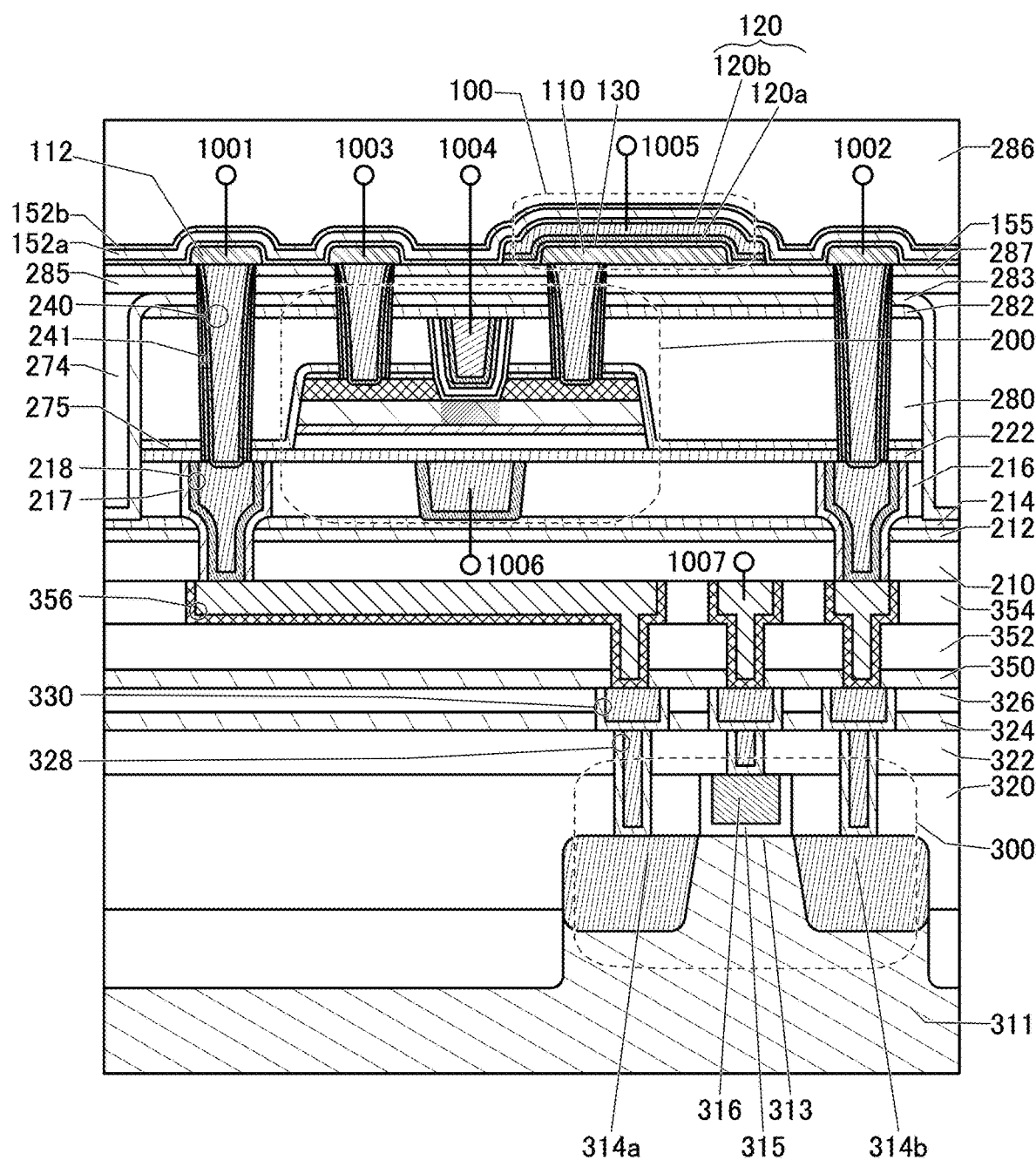
FIG. 31 is a cross-sectional view illustrating a structure of a storage device of one embodiment of the present invention.

Although the capacitor 100 is formed so as to be embedded in the insulator 285, the insulator 280, and the like in the storage device illustrated in FIG. 30, the present invention is not limited thereto. As illustrated in FIG. 31, a planar capacitor 100 may be provided over the insulator 285.

The capacitor 100 includes the conductor 110, the insulator 130 covering the conductor 110, and the conductor 120 (the conductor 120a and the conductor 120b) covering the insulator 130. Here, the insulator 130 preferably covers the top surface and the side surface of the conductor 110 to separate the conductor 110 and the conductor 120. The descriptions of [Structure example of storage device] and the above embodiments can be referred to for the details of the conductor 110, the insulator 130, and the conductor 120.

The conductor 110 is formed in the same layer as the conductor 112 and is in contact with the top surface of the conductor 240. The conductor 110 is electrically connected to one of the source and the drain of the transistor 200 through the conductor 240.

An insulator 155 is preferably provided to cover the conductor 120, the insulator 130, and the conductor 112. As the insulator 155, an insulator that can be used as the insulator 214, the insulator 282, or the like and has a function of capturing and fixing hydrogen is preferably used. For example, aluminum oxide or the like is preferably used. Providing the insulator 155 covering the capacitor 100 in this manner makes it possible to capture and fix hydrogen contained in the insulator 130 of the capacitor 100 to reduce the hydrogen concentration in the insulator 130. In that case, the ferroelectricity of the insulator 130 can be enhanced. Moreover, leakage current between the conductor 110 and the conductor 120 can be reduced. Note that the structure is not limited thereto, and the insulator 155 may be omitted.

As in the storage device illustrated in FIG. 30, the insulator 152a and the insulator 152b that function as barrier insulating films against hydrogen are preferably provided over the conductor 112 and the conductor 120. The insulator 152a and the insulator 152b are provided over the insulator 155. Providing the insulator 152a and the insulator 152b in this manner can inhibit impurities such as hydrogen contained in the insulator 286 over the insulator 152b from diffusing to the transistor 200 through the capacitor 100, the conductor 112, and the conductor 240.

As illustrated in FIG. 31, an insulator 287 functioning as a barrier insulating film against hydrogen is preferably provided over the insulator 285. The conductor 112, the conductor 110, and the insulator 155 are provided on and in contact with the insulator 287. Here, as the insulator 287, a barrier insulating film similar to the insulator 283 can be used.

With such a structure, the insulator 155 and the insulator 287 are in contact with each other in a region not overlapping with the capacitor 100. That is, the capacitor 100 is sealed with the insulator 155, the insulator 152a, the insulator 152b, and the insulator 287. Note that in the case where the insulator 155 is not used, the insulator 287 and the insulator 152a are in contact with each other in a region not overlapping with the capacitor 100, and the capacitor 100 is sealed with the insulator 152a, the insulator 152b, and the insulator 287. Thus, diffusion of hydrogen to the capacitor 100 from the outside of the insulator 152b and the insulator 287 can be inhibited to reduce the hydrogen concentration of the capacitor 100. Therefore, the ferroelectricity of the insulator 130 can be enhanced.

Furthermore, as illustrated in FIG. 31, the transistor 200 is also sealed with the insulator 283, the insulator 214, and the insulator 212 that function as barrier insulating films against hydrogen. Accordingly, diffusion of hydrogen to the transistor 200 from the outside of the insulator 283 and the insulator 212 can be inhibited to reduce the hydrogen concentration of the oxide semiconductor film included in the transistor 200. Therefore, the electrical characteristics and reliability of the transistor 200 can be improved.

<Variation Example 2 of Storage Device>

Figure 32:
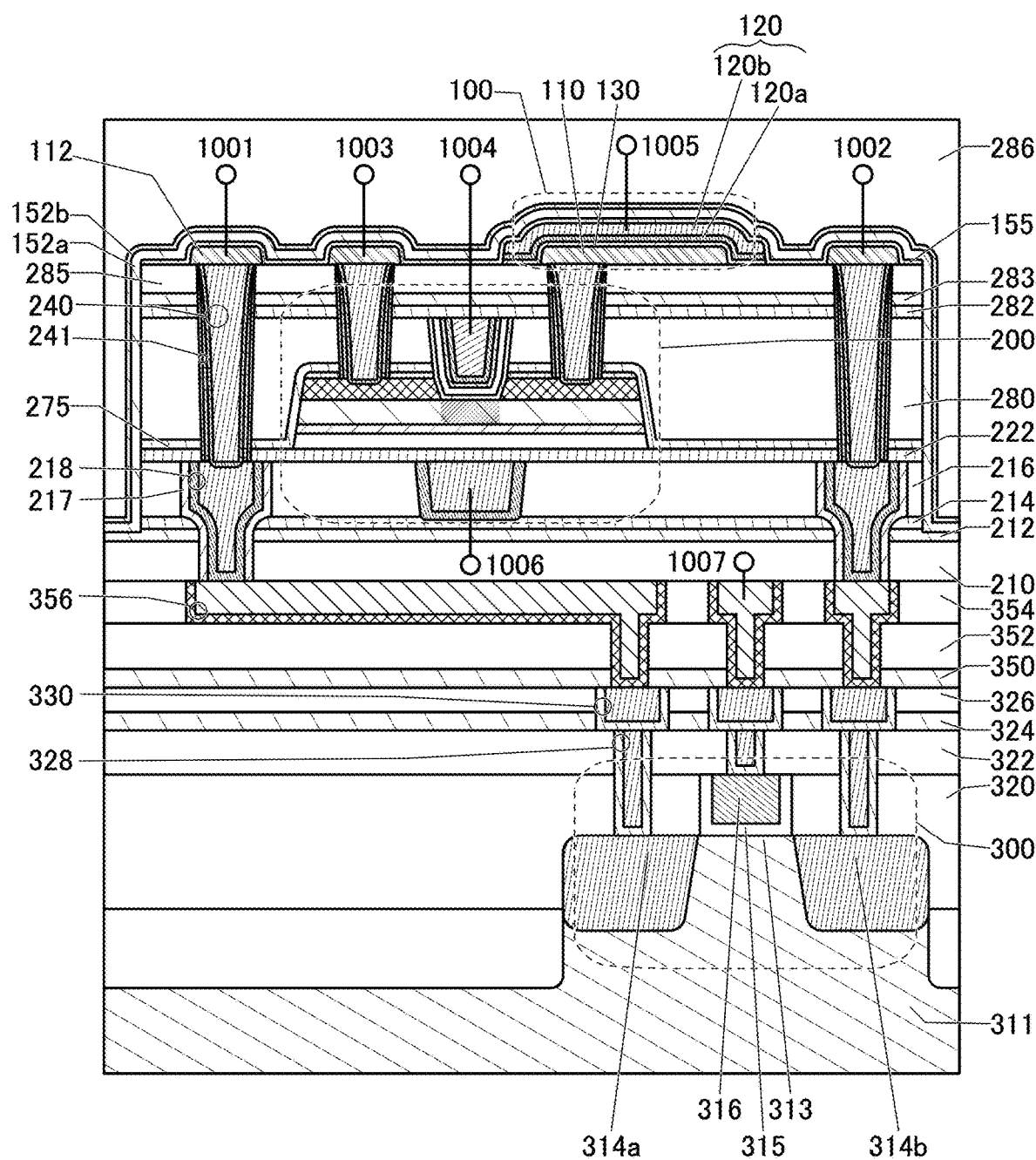
FIG. 32 is a cross-sectional view illustrating a structure of a storage device of one embodiment of the present invention.

Although the transistor 200 and the capacitor 100 are individually sealed with the barrier insulating films against hydrogen in the storage device illustrated in FIG. 31, the present invention is not limited thereto. As illustrated in FIG. 32, the transistor 200 and the capacitor 100 may be collectively sealed with the barrier insulating films against hydrogen (the insulator 212, the insulator 152a, and the insulator 152b).

In the storage device illustrated in FIG. 32, an opening reaching the insulator 212 is formed in the insulator 214, the insulator 216, the insulator 222, the insulator 275, the insulator 280, the insulator 282, the insulator 283, the insulator 285, and the insulator 155. The insulator 152a and the insulator 152b over the insulator 155 are formed along the side surface and the bottom surface of the opening. The insulator 152a is in contact with the top surface of the insulator 212 at the bottom surface of the opening.

With such a structure, the transistor 200 and the capacitor 100 can be collectively sealed with the insulator 212, the insulator 152a, and the insulator 152b. Thus, diffusion of hydrogen to the capacitor 100 and the transistor 200 from the outside of the insulator 212 and the insulator 152b can be inhibited to reduce the hydrogen concentration of the insulator 130 of the capacitor 100 and the oxide semiconductor film of the transistor 200. Therefore, the ferroelectricity of the insulator 130 can be enhanced and the electrical characteristics and reliability of the transistor 200 can be improved.

<Variation Example 3 of Storage Device>

Figure 33:
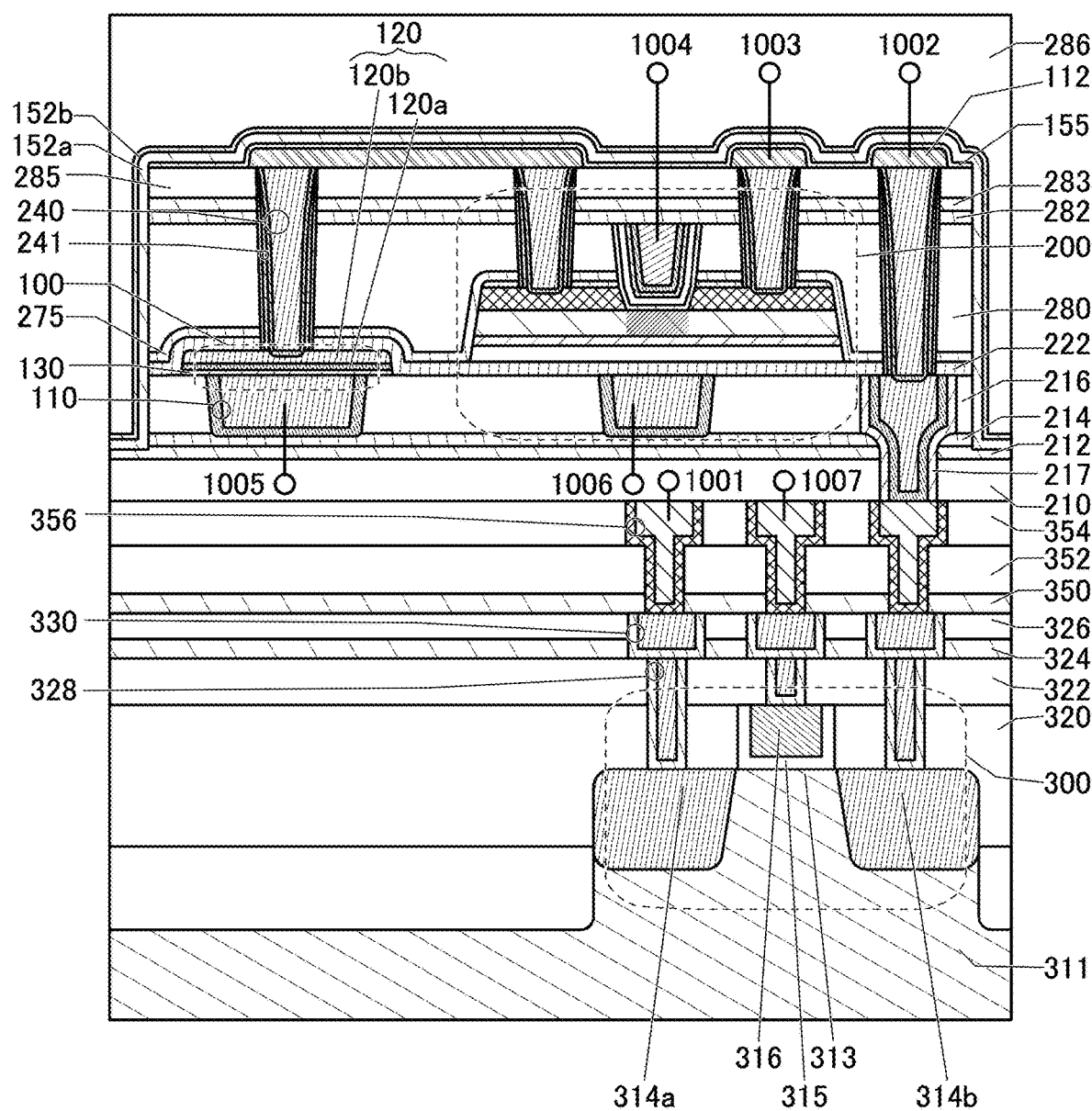
FIG. 33 is a cross-sectional view illustrating a structure of a storage device of one embodiment of the present invention.

Although the capacitor 100 is provided over the transistor 200 in the storage device illustrated in FIG. 32, the present invention is not limited thereto. As illustrated in FIG. 33, the capacitor 100 may be provided in the same layer as the transistor 200.

As illustrated in FIG. 33, the conductor 110 functioning as the lower electrode of the capacitor 100 is preferably formed using a conductor in the same layer as the conductor 205 functioning as the back gate of the transistor 200. The insulator 130 is positioned over the conductor 110, and the conductor 120 (the conductor 120a and the conductor 120b) is positioned over the insulator 130. Here, the insulator 130 preferably covers the top surface of the conductor 110 and separates the conductor 110 and the conductor 120. Note that the structures of the insulator 130 and the conductor 120 can be made similar to those illustrated in FIG. 31 and the like, and the description of [Structure example of storage device] and the above embodiments can be referred to for the details. The insulator 222 is provided to cover the insulator 130 and the conductor 120.

The conductor 240 is provided in contact with the top surface of the conductor 120b, and the conductor 112 is provided in contact with the top surface of the conductor 240. The conductor 112 is in contact with the conductor 240 electrically connected to one of the source and the drain of the transistor 200. In other words, the conductor 120 functioning as the upper electrode of the capacitor 100 illustrated in FIG. 33 is electrically connected to the one of the source and the drain of the transistor 200. Furthermore, the conductor 110 functioning as the lower electrode of the capacitor 100 is electrically connected to the wiring 1005.

As in the storage device illustrated in FIG. 32, the transistor 200 and the capacitor 100 can be collectively sealed with the insulator 212, the insulator 152a, and the insulator 152b. Thus, diffusion of hydrogen to the capacitor 100 and the transistor 200 from the outside of the insulator 212 and the insulator 152b can be inhibited to reduce the hydrogen concentration of the insulator 130 of the capacitor 100 and the oxide semiconductor film of the transistor 200. Therefore, the ferroelectricity of the insulator 130 can be enhanced and the electrical characteristics and reliability of the transistor 200 can be improved.

<Variation Example 4 of Storage Device>

Figure 34A:
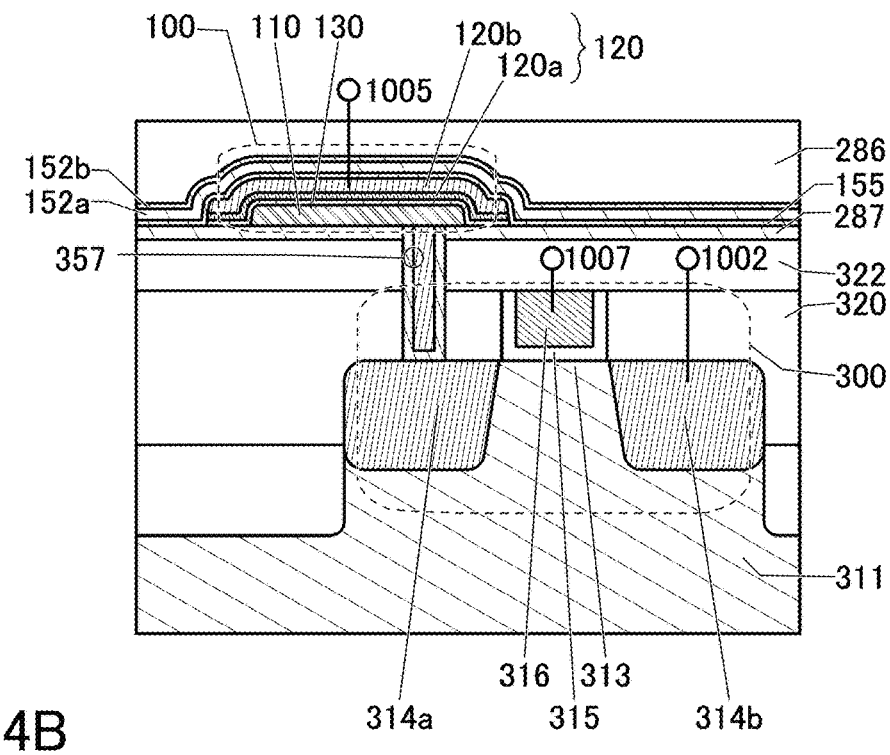
FIG. 34A and FIG. 34B are cross-sectional views each illustrating a structure of a storage device of one embodiment of the present invention.

Although the transistor 200 is provided over the transistor 300 and the capacitor 100 is connected to the transistor 200 in the storage device illustrated in FIG. 31 or the like, the present invention is not limited thereto. As illustrated in FIG. 34A, the capacitor 100 may be connected to the transistor 300 without providing the transistor 200.

As illustrated in FIG. 34A, an opening reaching the low-resistance region 314a of the transistor 300 is formed in the insulator 320, the insulator 322, and the insulator 287, and a conductor 357 is formed to be embedded in the opening. As the conductor 357, a conductor similar to the conductor 328 and the like can be used. The top surface of the conductor 357 is in contact with the bottom surface of the conductor 110 of the capacitor 100. In this manner, the conductor 110 functioning as the lower electrode of the capacitor 100 and the low-resistance region 314a functioning as one of the source and the drain of the transistor 300 are connected to each other through the conductor 357. Note that the structures of the transistor 300, the capacitor 100, and the layers including them are similar to those in the structure illustrated in FIG. 31, and therefore the description of the structure in FIG. 31 can be referred to.

Furthermore, in the storage device illustrated in FIG. 34A, the capacitor 100 can be sealed with the insulator 287, the insulator 152a, and the insulator 152b as in the storage device illustrated in FIG. 31. Accordingly, diffusion of hydrogen to the capacitor 100 from the outside of the insulator 287 and the insulator 152b can be inhibited to reduce the hydrogen concentration of the oxide semiconductor film of the insulator 130 of the capacitor 100. Therefore, the ferroelectricity of the insulator 130 can be enhanced.

Figure 34B:
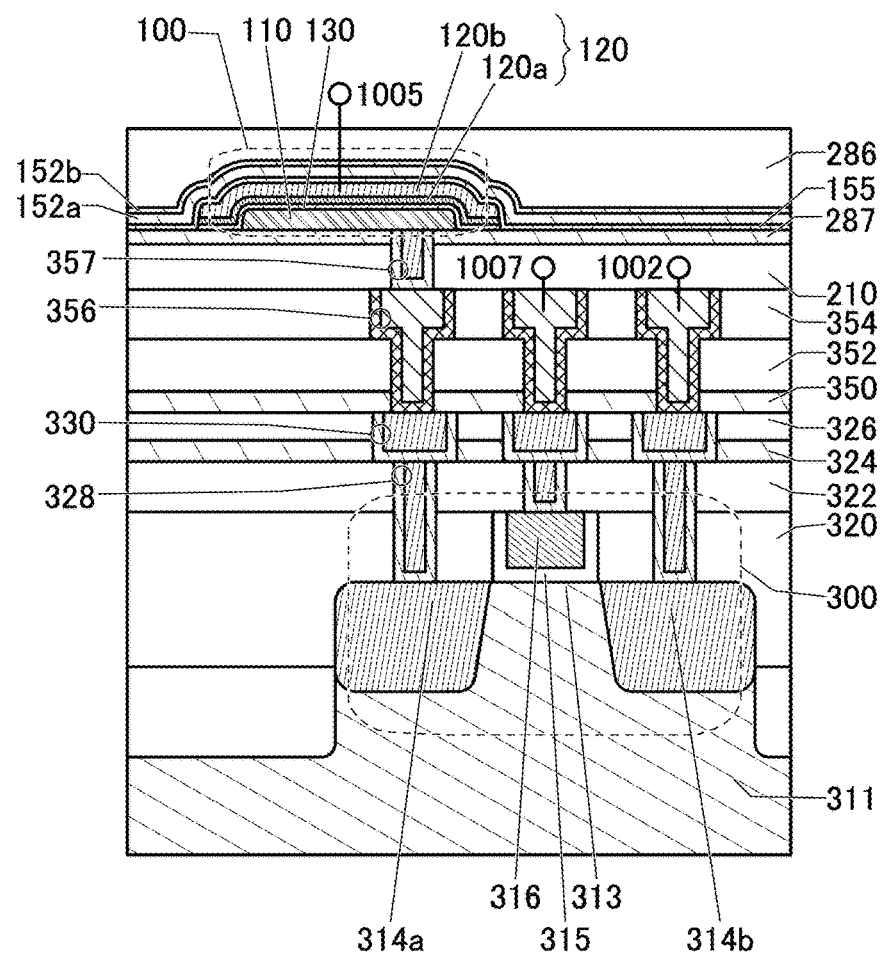

Although the low-resistance region 314a of the transistor 300 and the conductor 110 of the capacitor 100 are directly connected to each other with the conductor 357 in the structure illustrated in FIG. 34A, the present invention is not limited thereto. The plurality of wiring layers illustrated in FIG. 31 and the like may be provided between the capacitor 100 and the transistor 300. For example, as illustrated in FIG. 34B, the conductor 328 may be formed over the transistor 300, the conductor 330 may be formed over the conductor 328, the conductor 356 may be formed over the conductor 330, and the conductor 357 may be formed over the conductor 356. The low-resistance region 314a of the transistor 300 and the conductor 110 of the capacitor 100 are electrically connected to each other with the conductor 328, the conductor 330, the conductor 356, and the conductor 357. Note that the description of [Structure example of storage device] can be referred to for the conductor 328, the conductor 330, the conductor 356, and the wiring layers including them.

<Variation Example of Transistor>

Although the transistor 200 is connected to the capacitor 100 including the material that can have ferroelectricity in the structure illustrated FIG. 31 and the like, the present invention is not limited thereto. For example, a material that can have ferroelectricity may be used for the transistor 200 and an insulator provided in the vicinity thereof. The transistor with such a structure is described with reference to FIG. 35A to FIG. 35C. Note that each of the transistors 200 illustrated in FIG. 35A to FIG. 35C is the one in which the conductor 240a, the conductor 240b, the conductor 246a, the conductor 246b, the insulator 241a, and the insulator 241b are provided in the transistor 200 illustrated in FIG. 3 instead of the capacitor 100.

Figure 35A:
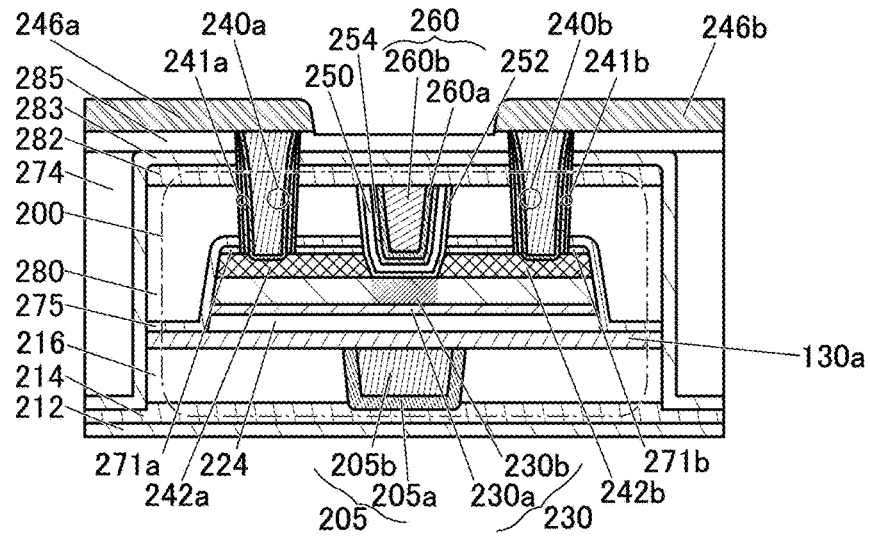
FIG. 35A to FIG. 35C are cross-sectional views of a semiconductor device of one embodiment of the present invention.

In the transistor 200 illustrated in FIG. 35A, an insulator 130a is used instead of the insulator 222. A material similar to that of the insulator 130, which can have ferroelectricity, can be used for the insulator 130a. That is, a material that can have ferroelectricity is used for the second gate insulator in the transistor 200 illustrated in FIG. 35A.

Figure 35B:
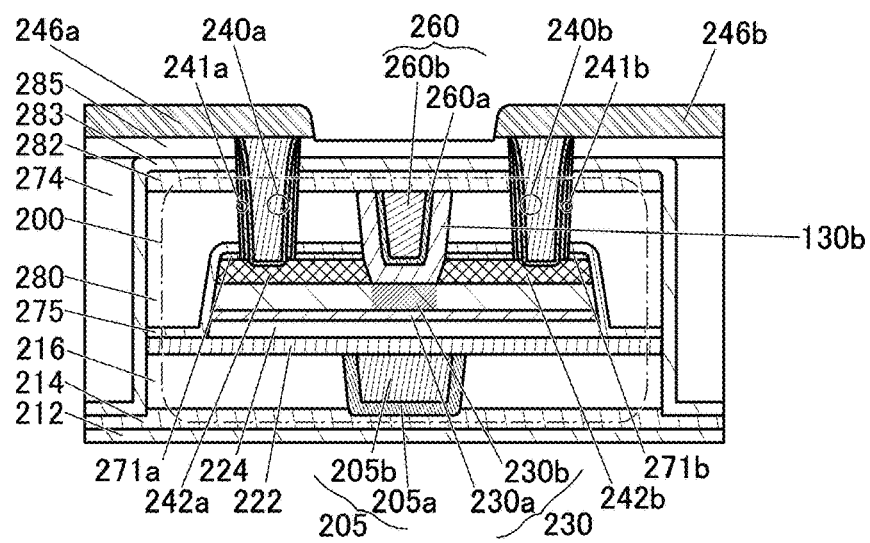

In the transistor 200 illustrated in FIG. 35B, an insulator 130b is used instead of the insulator 252, the insulator 250, and the insulator 254. A material similar to that of the insulator 130, which can have ferroelectricity, can be used for the insulator 130b. That is, a material that can have ferroelectricity is used for the first gate insulator in the transistor 200 illustrated in FIG. 35B. Note that although the whole first gate insulator is formed with a ferroelectric material in FIG. 35B, the present invention is not limited thereto. For example, a material that can have ferroelectricity may be used for one or more of the insulator 252, the insulator 250a, the insulator 250b, and the insulator 254, which are illustrated in FIG. 4B.

Figure 35C:
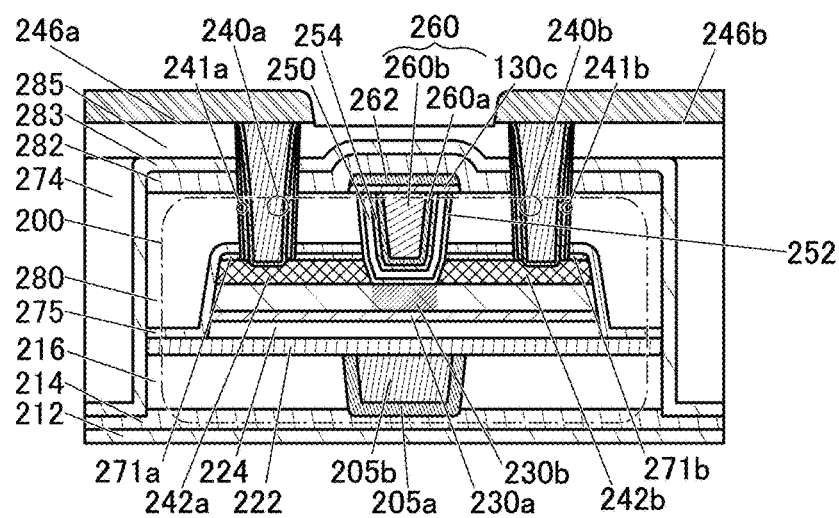

In the transistor 200 illustrated in FIG. 35C, an insulator 130c is provided over the conductor 260, and the conductor 262 is provided over the insulator 130c. A material similar to that of the insulator 130, which can have ferroelectricity, can be used for the insulator 130c. The conductive material that can be used for the conductor 260 can be used for the conductor 262. The insulator 282 is provided to cover the insulator 130c and the conductor 262. The semiconductor device illustrated in FIG. 35C can also be regarded as the semiconductor device in which the gate electrode of the transistor 200 is provided with one terminal of the ferroelectric capacitor.

At least part of the structure, method, and the like described in this embodiment can be implemented in appropriate combination with any of those in the other embodiments and the other examples described in this specification.

Embodiment 4

In this embodiment, a storage device of one embodiment of the present invention, which includes a transistor in which oxide is used for a semiconductor (hereinafter referred to as an OS transistor in some cases) and a ferroelectric capacitor, will be described with reference to FIG. 36A and FIG. 36B.

The device of this embodiment is a storage device that includes at least a capacitor and an OS transistor controlling charging and discharging of the capacitor. The device of this embodiment functions as a one-transistor one-capacitor ferroelectric memory that includes a ferroelectric capacitor.

<Structure Example of Storage Device>

Figure 36A:
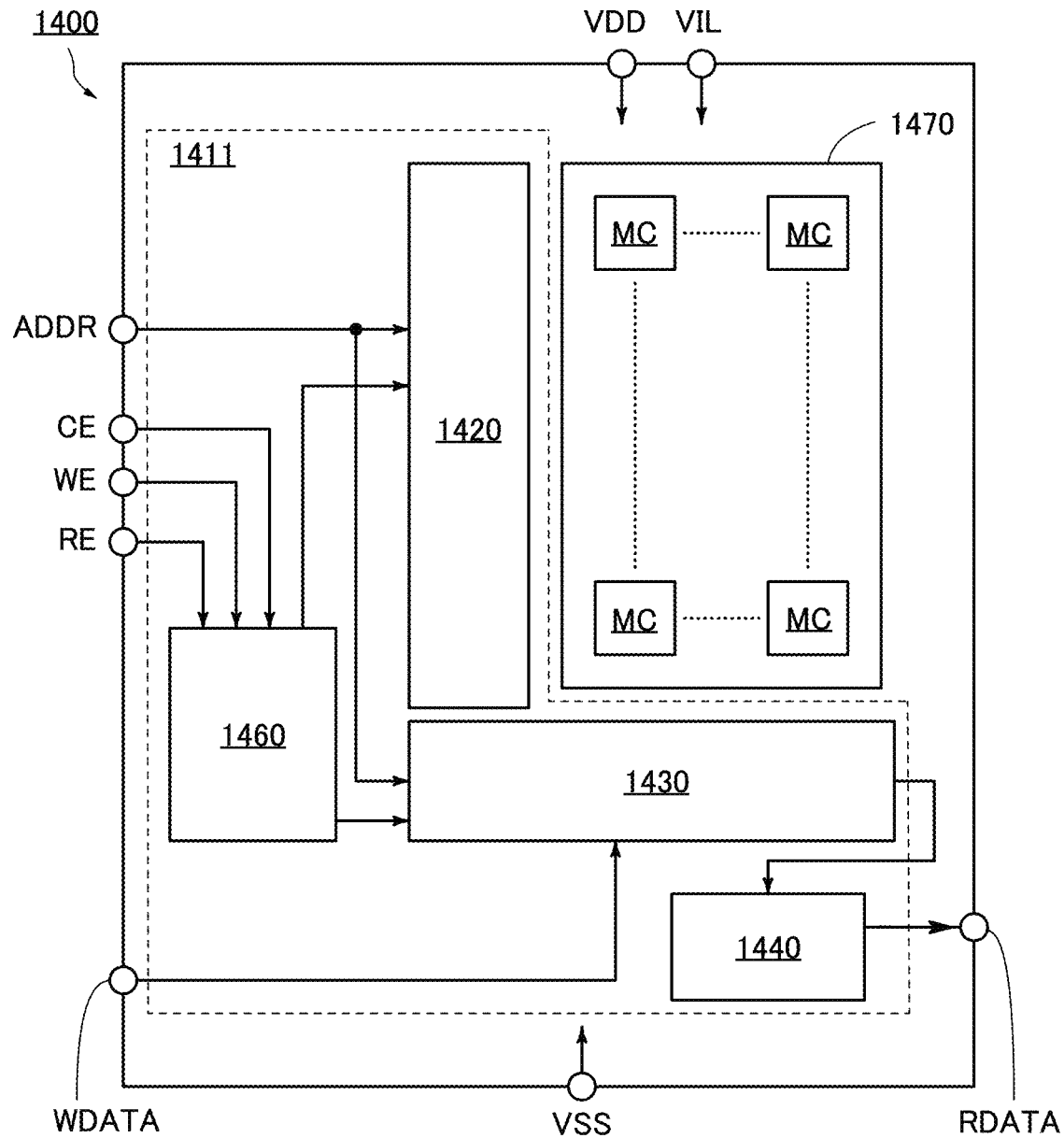
FIG. 36A is a block diagram of a structure example of a storage device of one embodiment of the present invention.
Figure 36B:
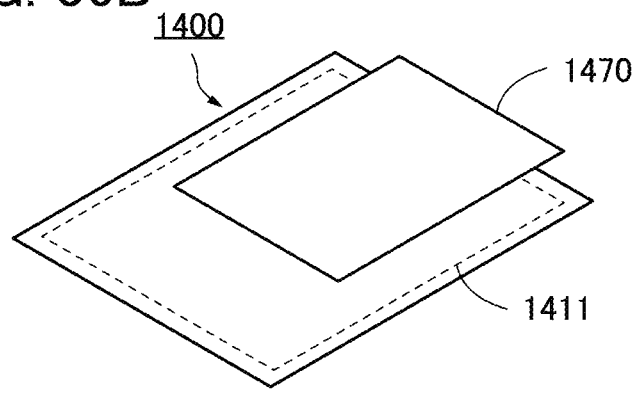
FIG. 36B is a perspective view illustrating a structure example of a storage device of one embodiment of the present invention.

FIG. 36A illustrates a structure example of a storage device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a bit line driver circuit, a precharge circuit, a sense amplifier, a write circuit, and the like. The precharge circuit has a function of precharging wirings. The sense amplifier has a function of amplifying a data signal read from a memory cell. Note that the wirings are connected to memory cells included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 and the row circuit 1420 depends on the structure of the memory cell MC, the number of memory cells MC in a column, and the like. The number of wirings that connect the memory cell array 1470 and the column circuit 1430 depends on the structure of the memory cell MC, the number of memory cells MC in a row, and the like.

Note that FIG. 36A illustrates an example in which the peripheral circuit 1411 and the memory cell array 1470 are formed on the same plane; however, this embodiment is not limited thereto. For example, as illustrated in FIG. 36B, the memory cell array 1470 may be provided to overlap with part of the peripheral circuit 1411. For example, the sense amplifier may be provided below the memory cell array 1470 so that they overlap with each other.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed. The storage device of one embodiment of the present invention operates fast and can retain data for a long time.

<Structure Example of Memory Cell>

Figure 37A:
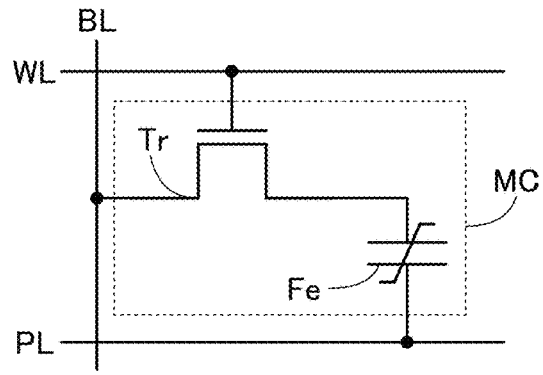
FIG. 37A is a circuit diagram illustrating a structure example of a memory cell.

The circuit diagram in FIG. 37A shows a structure example of the memory cell MC described above. The memory cell MC includes a transistor Tr and a capacitor Fe. Here, as the memory cell MC, the semiconductor device including the transistor 200 and the capacitor 100, which is described in the above embodiment, can be used, for example. In this case, the transistor Tr and the capacitor Fe correspond to the transistor 200 and the capacitor 100, respectively. Note that the transistor Tr may have a back gate in addition to the gate or may have no back gate. The transistor Tr is illustrated as an n-channel transistor in FIG. 37A, but may be a p-channel transistor.

One of a source and a drain of the transistor Tr is electrically connected to a wiring BL. The other of the source and the drain of the transistor Tr is electrically connected to one electrode of the capacitor Fe. The gate of the transistor Tr is electrically connected to a wiring WL. The other electrode of the capacitor Fe is electrically connected to a wiring PL.

The wiring WL has a function of a word line and can control on/off of the transistor Tr by controlling the potential of the wiring WL. For example, setting the potential of the wiring WL to a high potential can turn on the transistor Tr; setting the potential of the wiring WL to a low potential can turn off the transistor Tr. The wiring WL is electrically connected to the word line driver circuit included in the row circuit 1420, and the potential of the wiring WL can be controlled by the word line driver circuit.

The wiring BL has a function of a bit line. When the transistor Tr is in an on state, a potential corresponding to the potential of the wiring BL is supplied to the one electrode of the capacitor Fe. The wiring BL is electrically connected to the bit line driver circuit of the column circuit 1430. The bit line driver circuit has a function of generating data to be written to the memory cell MC. Furthermore, the bit line driver circuit has a function of reading data output from the memory cell MC. Specifically, the sense amplifier is provided in the bit line driver circuit, and data output from the memory cell MC can be read using the sense amplifier.

The wiring PL has a function of a plate line, and the potential of the wiring PL can be set to the potential of the other electrode of the capacitor Fe.

An OS transistor is preferably used as the transistor Tr. An OS transistor has a feature of high withstand voltage. Thus, the transistor Tr is an OS transistor, whereby high voltage can be applied to the transistor Tr even when the transistor Tr is miniaturized. The miniaturization of the transistor Tr can reduce the area occupied by the memory cell MC. For example, the area occupied by one memory cell MC illustrated in FIG. 37A can be ⅓ to ⅙ of the area occupied by one SRAM cell. Accordingly, the memory cells MC can be arranged at high density.

Therefore, the storage device of one embodiment of the present invention can have large storage capacity.

The capacitor Fe includes a material that can have ferroelectricity as a dielectric layer between the two electrodes. The dielectric layer included in the capacitor Fe is referred to as a ferroelectric layer in the following description.

As the material that can have ferroelectricity, the above-described material that can be used for the insulator 130 is used. In particular, hafnium oxide or a material including hafnium oxide and zirconium oxide is preferable as the material that can have ferroelectricity because they can have ferroelectricity when processed into a several-nanometer-thick thin film. With the ferroelectric layer that can be made to be a thin film, the storage device combined with a miniaturized transistor can be obtained.

Figure 37B:
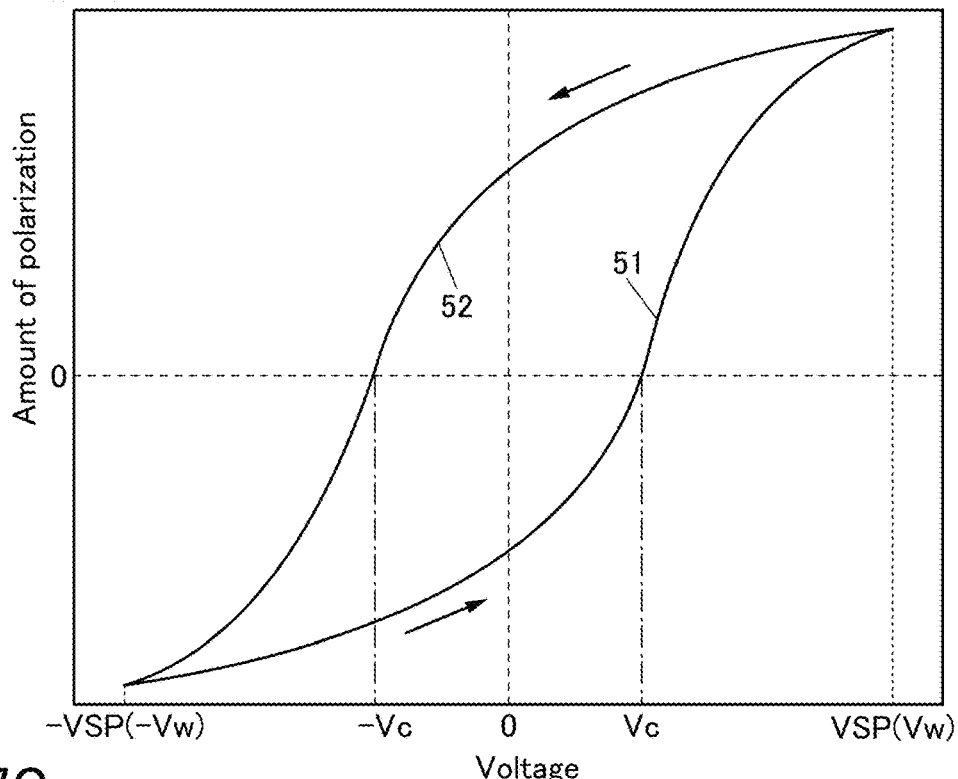
FIG. 37B is a graph showing an example of hysteresis characteristics of a ferroelectric layer.

The ferroelectric layer has hysteresis characteristics. FIG. 37B is a graph showing an example of the hysteresis characteristics. The horizontal axis in FIG. 37B represents voltage applied to the ferroelectric layer. The voltage can be a difference between the potential of one electrode of the capacitor Fe and the potential of the other electrode of the capacitor Fe, for example.

The vertical axis in FIG. 37B represents the amount of polarization of the ferroelectric layer and shows that negative charge is biased to the one electrode of the capacitor Fe and positive charge is biased to the other electrode of the capacitor Fe when the amount of polarization has a positive value. In contrast, when the amount of polarization has a negative value, it shows that negative charge is biased to the other electrode of the capacitor Fe and positive charge is biased to the one electrode of the capacitor Fe.

Note that the voltage represented by the horizontal axis of the graph of FIG. 37B may be a difference between the potential of the other electrode of the capacitor Fe and the potential of the one electrode of the capacitor Fe. Moreover, the amount of polarization represented by the vertical axis of the graph of FIG. 37B may have a positive value when negative charge is biased to the other electrode of the capacitor Fe and positive charge is biased to the one electrode of the capacitor Fe, and may have a negative value when negative charge is biased to the one electrode of the capacitor Fe and positive charge is biased to the other electrode of the capacitor Fe.

As shown in FIG. 37B, the hysteresis characteristics of the ferroelectric layer can be represented by a curve 51 and a curve 52. Voltages at intersection points of the curve 51 and the curve 52 are referred to as VSP and −VSP. VSP and −VSP have different polarities.

After a voltage lower than or equal to −VSP is applied to the ferroelectric layer, the voltage applied to the ferroelectric layer is increased, so that the amount of polarization of the ferroelectric layer is increased according to the curve 51. In contrast, after a voltage higher than or equal to VSP is applied to the ferroelectric layer, the voltage applied to the ferroelectric layer is reduced, so that the amount of polarization of the ferroelectric layer is decreased according to the curve 52. Therefore, VSP and −VSP can be referred to as saturated polarization voltages. For example, VSP and −VSP may be called a first saturated polarization voltage and a second saturated polarization voltage, respectively. Although the absolute value of the first saturated polarization voltage and the absolute value of the second saturated polarization voltage are equal to each other in FIG. 37B, they may be different from each other.

Here, in the case where the amount of polarization of the ferroelectric layer is varied according to the curve 51, the voltage applied to the ferroelectric layer at the time when the amount of polarization of the ferroelectric layer is 0 is referred to as Vc. When the amount of polarization of the ferroelectric layer is varied according to the curve 52, the voltage applied to the ferroelectric layer at the time when the amount of polarization of the ferroelectric layer is 0 is referred to as −Vc. Vc and −Vc can be referred to as coercive voltages. The value of Vc and the value of −Vc can be values between −VSP and VSP. Note that Vc and −Vc may be called a first coercive voltage and a second coercive voltage, respectively. Although the absolute value of the first coercive voltage and the absolute value of the second coercive voltage are equal to each other in FIG. 37B, they may be different from each other.

As described above, the voltage applied to the ferroelectric layer included in the capacitor Fe can be represented by the difference between the potential of the one electrode of the capacitor Fe and the potential of the other electrode of the capacitor Fe. In addition, as described above, the other electrode of the capacitor Fe is electrically connected to the wiring PL. Thus, it is possible to control the voltage applied to the ferroelectric layer included in the capacitor Fe by controlling the potential of the wiring PL.

<Example of Method for Driving Memory Cell>

An example of a method for driving the memory cell MC illustrated in FIG. 37A will be described below. In the following description, the voltage applied to the ferroelectric layer of the capacitor Fe represents a difference between the potential of one electrode of the capacitor Fe and the potential of the other electrode of the capacitor Fe (the wiring PL). The transistor Tr is an n-channel transistor.

Figure 37C:
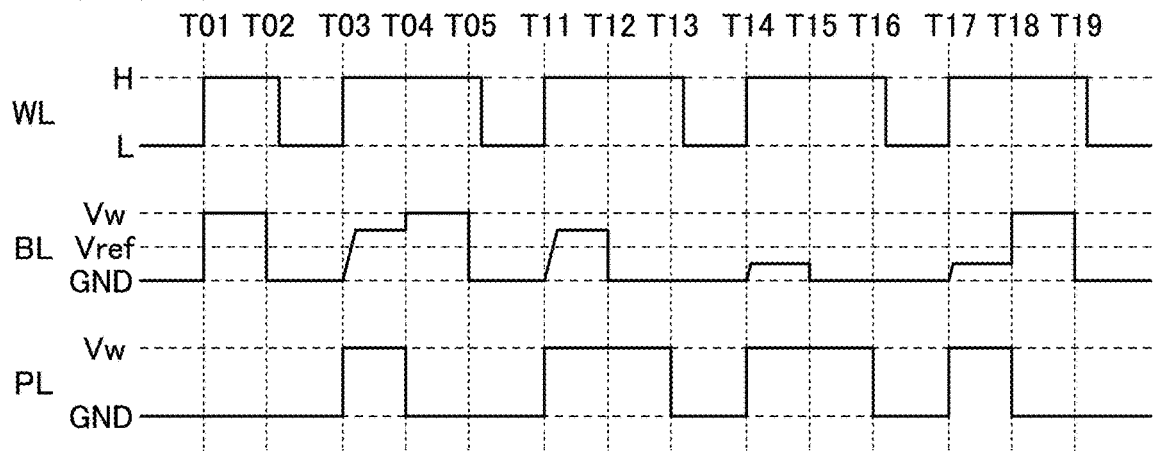
FIG. 37C is a timing chart showing an example of a method for driving the memory cell.

FIG. 37C is a timing chart showing an example of a method for driving the memory cell MC in FIG. 37A. In the example shown in FIG. 37C, binary digital data is written to and read from the memory cell MC. Specifically, in the example shown in FIG. 37C, data "1" is written to the memory cell MC in a period from Time T01 to Time T02, reading and rewriting are performed in a period from Time T03 to Time T05, reading and writing of data "0" to the memory cell MC are performed in a period from Time T11 to Time T13, reading and rewriting are performed in a period from Tim T14 to Time T16, and reading and writing of data "1" to the memory cell MC are performed in a period from Time T17 to Time T19.

The sense amplifier electrically connected to the wiring BL is supplied with Vref as a reference potential. In the reading operation shown in FIG. 37C and the like, when the potential of the wiring BL is higher than Vref, data "1" is read by the bit line driver circuit. On the other hand, when the potential of the wiring BL is lower than Vref, data "0" is read by the bit line driver circuit.

In the period from Time T01 to Time T02, the potential of the wiring WL is set to a high potential. Thus, the transistor Tr is turned on. In addition, the potential of the wiring BL is set to Vw. Since the transistor Tr is in an on state, the potential of the one electrode of the capacitor Fe becomes Vw. Furthermore, the potential of the wiring PL is set to GND. Thus, the voltage applied to the ferroelectric layer of the capacitor Fe becomes "Vw–GND". Accordingly, data "1" can be written to the memory cell MC. Consequently, the period from Time T01 to Time T02 can be referred to as a write operation period.

Here, Vw is preferably VSP or higher, for example, preferably equal to VSP. GND can be set to a ground potential, for example; however, GND is not necessarily a ground potential as long as the memory cell MC can be driven enough to achieve an object of one embodiment of the present invention. For example, when the absolute value of the first saturated polarization voltage and the absolute value of the second saturated polarization voltage are different from each other and the absolute value of the first coercive voltage and the absolute value of the second coercive voltage are different from each other, GND can be a potential other than a ground potential.

In the period from Time T02 to Time T03, the potential of the wiring BL and the potential of the wiring PL are each set to GND. Accordingly, the voltage applied to the ferroelectric layer of the capacitor Fe becomes 0 V. Since the voltage "Vw–GND" applied to the ferroelectric layer of the capacitor Fe can be higher than or equal to VSP in the period from Time T01 to Time T02, the amount of polarization of the ferroelectric layer of the capacitor Fe is varied according to the curve 52 shown in FIG. 37B in the period from Time T02 to Time T03. Thus, no polarization inversion occurs in the ferroelectric layer of the capacitor Fe in the period from Time T02 to Time T03.

After the potential of the wiring BL and the potential of the wiring PL are set to GND, the potential of the wiring WL is set to a low potential. Accordingly, the transistor Tr is turned off. Thus, the writing operation is completed and data "1" is retained in the memory cell MC. Note that the potentials of the wiring BL and the wiring PL can each be any potential as long as no polarization inversion occurs in the ferroelectric layer of the capacitor Fe, i.e., the voltage applied to the ferroelectric layer of the capacitor Fe is higher than or equal to –Vc that is the second coercive voltage.

In the period from Time T03 to Time T04, the potential of the wiring WL is set to a high potential. Thus, the transistor Tr is turned on. Furthermore, the potential of the wiring PL is set to Vw. With the potential of the wiring PL set to Vw, the potential applied to the ferroelectric layer of the capacitor Fe becomes "GND–Vw". As described above, the voltage applied to the ferroelectric layer of the capacitor Fe is "Vw–GND" in the period from Time T01 to Time T02. Accordingly, polarization inversion occurs in the ferroelectric layer of the capacitor Fe. In the polarization inversion, current flows through the wiring BL, whereby the potential of the wiring BL becomes higher than Vref. Thus, the bit line driver circuit can read the data "1" retained in the memory cell MC. Therefore, the period from Time T03 to Time T04 can be referred to as a read operation period. Note that although Vref is higher than GND and lower than Vw, Vref may be higher than Vw, for example.

Since the above-described reading is destructive reading, the data "1" retained in the memory cell MC is lost. Thus, the potential of the wiring BL is set to Vw and the potential of the wiring PL is set to GND in the period from Time T04 to Time T05. Thus, data "1" is rewritten to the memory cell MC. Consequently, the period from Time T04 to Time T05 can be referred to as a rewrite operation period.

The potential of the wiring BL and the potential of the wiring PL are set to GND in a period from Time T05 to Time T11. After that, the potential of the wiring WL is set to a low potential. Thus, the rewrite operation is completed, and the data "1" is retained in the memory cell MC.

The potential of the wiring WL is set to a high potential and the potential of the wiring PL is set to Vw in a period from Time T11 to Time T12. Since the data "1" is retained in the memory cell MC, the potential of the wiring BL becomes higher than Vref, and the data "1" retained in the memory cell MC is read. Accordingly, the period from Time T11 to Time T12 can be referred to as a read operation period.

The potential of the wiring BL is set to GND in a period from Time T12 to Time T13. Since the transistor Tr is in an on state, the potential of the one electrode of the capacitor Fe is GND. In addition, the potential of the wiring PL is Vw. Accordingly, the voltage applied to the ferroelectric layer of the capacitor Fe becomes "GND–Vw". Thus, data "0" can be written to the memory cell MC. Consequently, the period from Time T12 to Time T13 can be referred to as a write operation period.

In the period from Time T13 to Time T14, the potential of the wiring BL and the potential of the wiring PL are each set to GND. Accordingly, the voltage applied to the ferroelectric layer of the capacitor Fe becomes 0 V. Since the voltage "GND–Vw" applied to the ferroelectric layer of the capacitor Fe can be lower than or equal to –VSP in the period from Time T12 to Time T13, the amount of polarization of the ferroelectric layer of the capacitor Fe is varied according to the curve 51 shown in FIG. 37B in the period from Time T13 to Time T14. Thus, no polarization inversion occurs in the ferroelectric layer of the capacitor Fe in the period from Time T13 to Time T14.

After the potential of the wiring BL and the potential of the wiring PL are set to GND, the potential of the wiring WL is set to a low potential. Accordingly, the transistor Tr is turned off. Thus, the writing operation is completed and data "0" is retained in the memory cell MC. Note that the potentials of the wiring BL and the wiring PL can each be any potential as long as no polarization inversion occurs in the ferroelectric layer of the capacitor Fe, i.e., the voltage applied to the ferroelectric layer of the capacitor Fe is lower than or equal to Vc that is the first coercive voltage.

In a period Time from T14 to Time T15, the potential of the wiring WL is set to a high potential. Thus, the transistor Tr is turned on. Furthermore, the potential of the wiring PL is set to Vw. With the potential of the wiring PL set to Vw, the potential applied to the ferroelectric layer of the capacitor Fe becomes "GND−Vw". As described above, the voltage applied to the ferroelectric layer of the capacitor Fe is "GND−Vw" in the period from Time T12 to Time T13. Accordingly, no polarization inversion occurs in the ferroelectric layer of the capacitor Fe. Thus, the amount of current flowing through the wiring BL is smaller than that in the case where polarization inversion occurs in the ferroelectric layer of the capacitor Fe. Accordingly, an increase in the potential of the wiring BL is smaller than that in the case where polarization inversion occurs in the ferroelectric layer of the capacitor Fe; specifically, the potential of the wiring BL becomes lower than or equal to Vref. Consequently, the bit line driver circuit can read the data "0" retained in the memory cell MC. Therefore, the period from Time T14 to Time T15 can be referred to as a read operation period.

The potential of the wiring BL is set to GND and the potential of the wiring PL is Vw in a period from Time T15 to Time T16. Thus, data "0" is rewritten to the memory cell MC. Therefore, the period from Time T15 to Time T16 can be referred to as a rewrite operation period.

The potential of the wiring BL and the potential of the wiring PL are set to GND in a period from Time T16 to Time T17. After that, the potential of the wiring WL is set to a low potential. Thus, the rewrite operation is completed, and the data "0" is retained in the memory cell MC.

The potential of the wiring WL is set to a high potential and the potential of the wiring PL is set to Vw in a period from Time T17 to Time T18. Since the data "0" is retained in the memory cell MC, the potential of the wiring BL becomes lower than Vref, and the data "0" retained in the memory cell MC is read. Therefore, the period from Time T17 to Time T18 can be referred to as a read operation period.

The potential of the wiring BL is set to Vw in a period from Time T18 to Time T19. Since the transistor Tr is in an on state, the potential of the one electrode of the capacitor Fe becomes Vw. In addition, the potential of the wiring PL is set to GND. Accordingly, the voltage applied to the ferroelectric layer of the capacitor Fe becomes "Vw-GND". Thus, data "1" can be written to the memory cell MC. Therefore, the period from Time T18 to Time T19 can be referred to as a write operation period.

From Time T19, the potential of the wiring BL and the potential of the wiring PL are set to GND. Then, the potential of the wiring WL is set to a low potential. Thus, the write operation is completed, and the data "1" is retained in the memory cell MC.

The structure, method, and the like described in this embodiment can be used in an appropriate combination with any of other structures, methods, and the like described in this embodiment or the other embodiments.

Embodiment 5

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 38A to FIG. 38E schematically illustrate some structure examples of removable storage devices. The semiconductor device described in the above embodiment is processed into a packaged memory chip and used in a variety of storage devices and removable memories, for example.

Figure 38A:
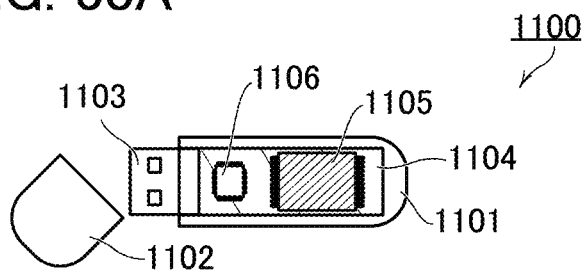
FIG. 38A to FIG. 38E are schematic views of storage devices of one embodiment of the present invention.

FIG. 38A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like. Therefore, the storage capacity of the USB memory 1100 can be further increased.

Figure 38B:
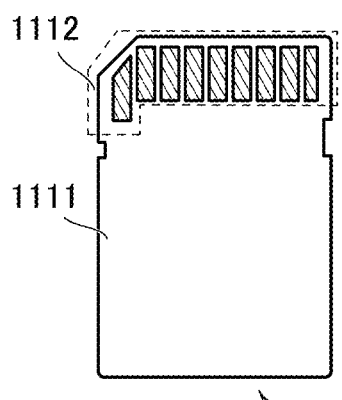
Figure 38C:
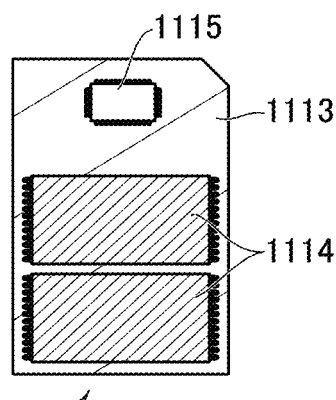

FIG. 38B is a schematic external view of an SD card, and FIG. 38C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like. Therefore, the storage capacity of the SD card 1110 can be further increased.

Figure 38D:
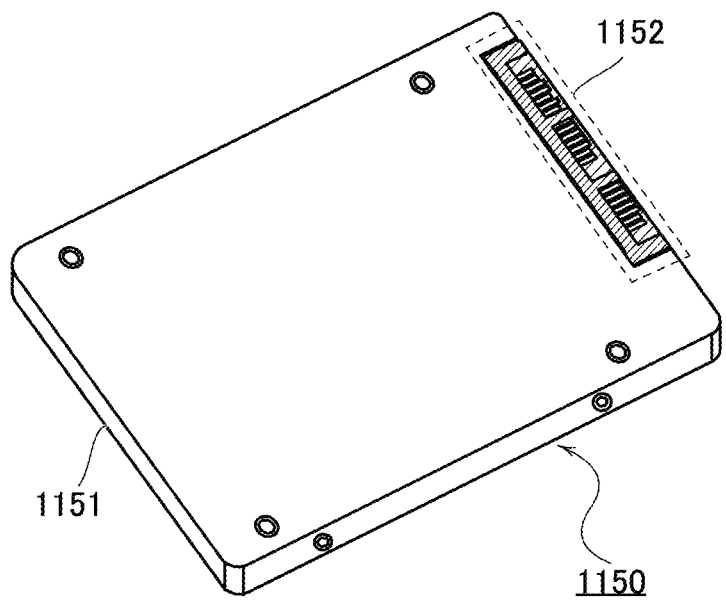
Figure 38E:
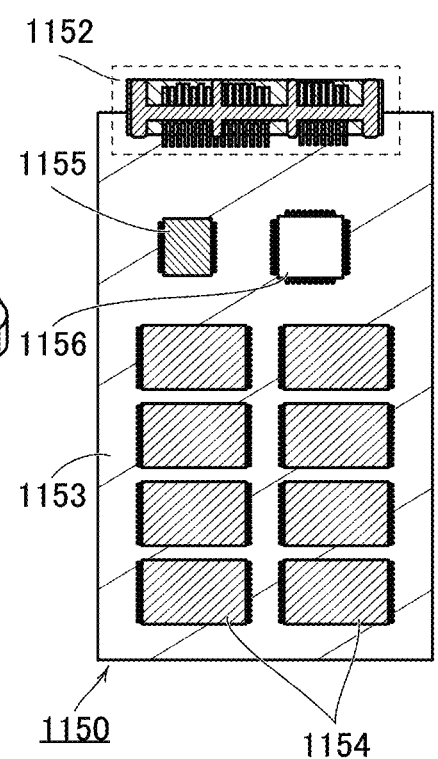

FIG. 38D is a schematic external view of an SSD, and FIG. 38E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like. Therefore, the storage capacity of the SSD 1150 can be further increased.

At least part of the structure, method, and the like described in this embodiment can be implemented in appropriate combination with any of those in the other embodiments and the other examples described in this specification.

Embodiment 6

The semiconductor device of one embodiment of the present invention can be used for processors such as CPUs or GPUs, or chips. When the semiconductor device described in the above embodiment is used for processors such as CPUs or GPUs, or chips, their sizes can be reduced and their storage capacities can be increased. FIG. 39A to FIG. 39H illustrate specific examples of electronic devices each including a processor such as a CPU or a GPU or a chip of one embodiment of the present invention.

<Electronic Devices and Systems>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 39A to FIG. 39H illustrate examples of electronic devices.

[Information Terminal]

Figure 39A:
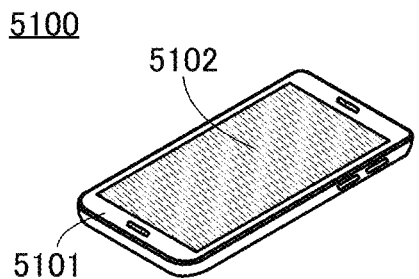
FIG. 39A to FIG. 39H are diagrams illustrating electronic devices of one embodiment of the present invention.

FIG. 39A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 39B:
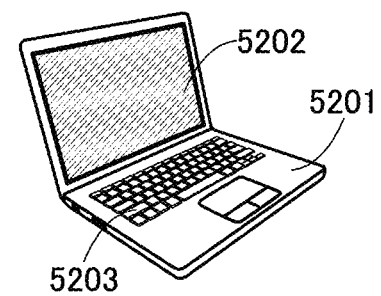

FIG. 39B illustrates a notebook information terminal 5200. The notebook information terminal 5200 includes a main body 5201 of the information terminal, a display portion 5202, and a keyboard 5203.

When the chip of one embodiment of the present invention is applied to the notebook information terminal 5200, the notebook information terminal 5200 can execute an application utilizing artificial intelligence like the information terminal 5100 described above. Examples of the application utilizing artificial intelligence include design-support software, text correction software, and software for automatic menu generation. Furthermore, with the use of the notebook information terminal 5200, novel artificial intelligence can be developed.

Note that although FIG. 39A and FIG. 39B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 39C:
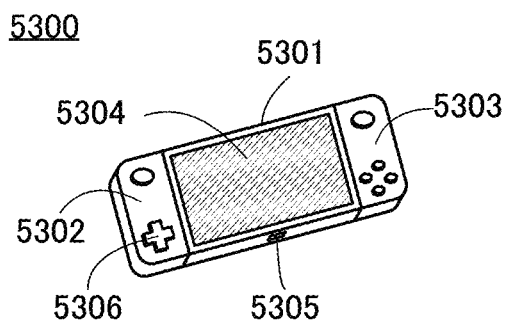

FIG. 39C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 39D:
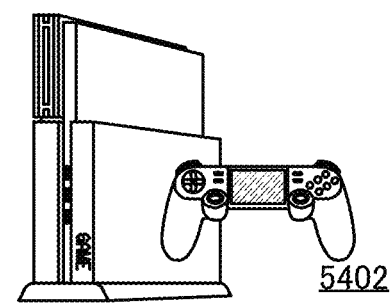

FIG. 39D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit itself, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 39C and FIG. 39D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 39E:
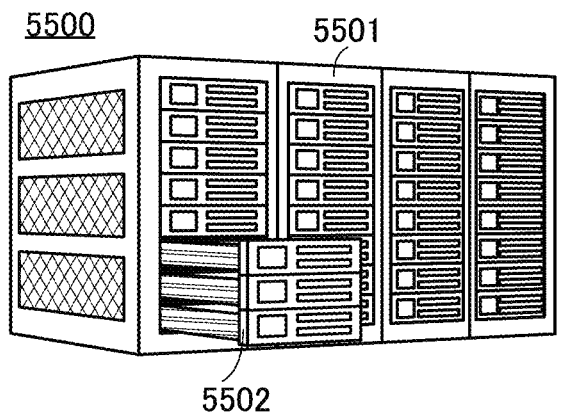
Figure 39F:
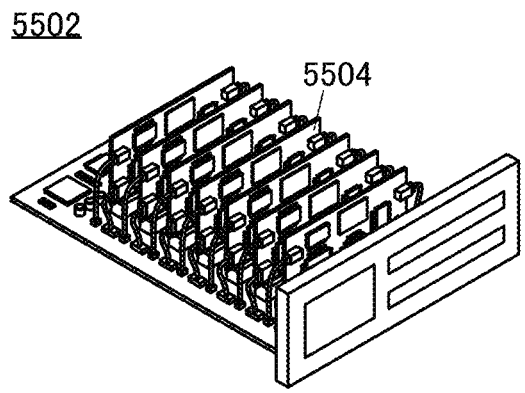

FIG. 39E illustrates a supercomputer 5500 as an example of a large computer. FIG. 39F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit itself, a peripheral circuit, and a module can be reduced.

Although a supercomputer is illustrated as an example of a large computer in FIG. 39E and FIG. 39F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 39G:
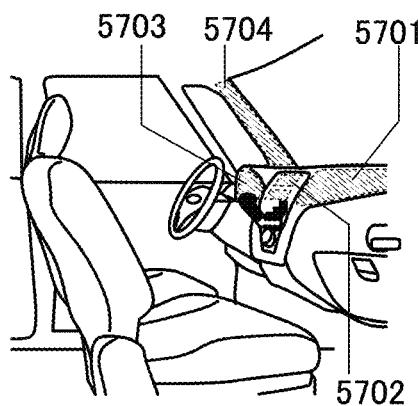

FIG. 39G illustrates an area around a windshield inside an automobile, which is an example of a moving vehicle. FIG. 39G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. Display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 39H:
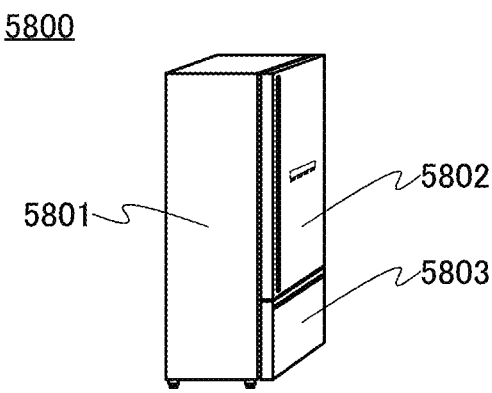

FIG. 39H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of those in the other embodiments and the other examples described in this specification.

Example 1

In this example, hafnium zirconium oxide ($HfZrO_x$) is formed as an insulator exhibiting ferroelectricity and measurement results of voltage-polarization characteristics, fatigue characteristics, and the like of the insulator are described.

<Sample Structure>

Figure 40A:
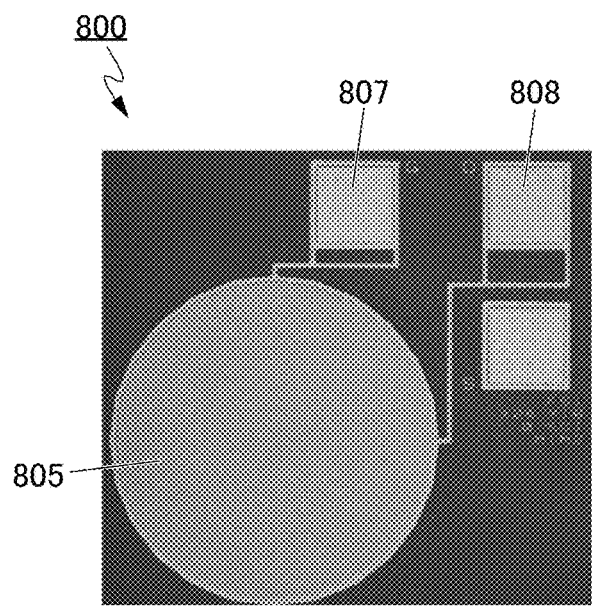
FIG. 40A is an optical micrograph showing the appearance of a sample.
Figure 40B:
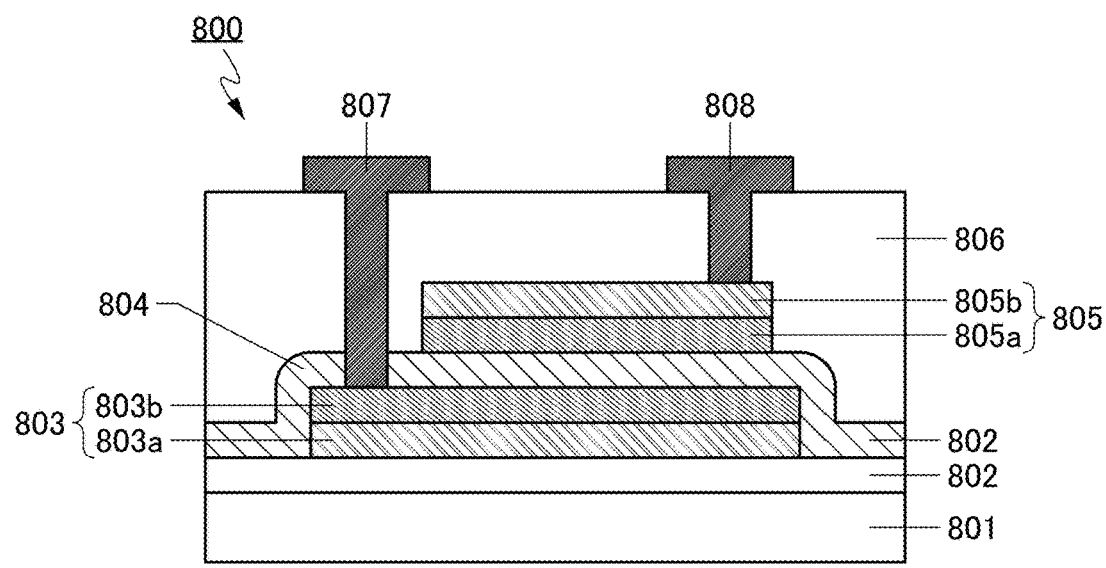
FIG. 40B is a schematic cross-sectional view of the sample.

FIG. 40A is an optical micrograph showing the appearance of a sample 800 used for measurement. FIG. 40B is a schematic cross-sectional view of the sample 800.

The sample 800 was formed with the use of single crystal silicon as a substrate 801. Specifically, a 100-nm-thick thermal oxide film was formed as an insulator 802 on the substrate 801, a conductor 803 (a conductor 803a and a conductor 803b) functioning as a lower electrode was formed over the insulator 802, an insulator 804 was formed over the conductor 803, and a conductor 805 (a conductor 805a and a conductor 805b) functioning as an upper electrode was formed over the insulator 804.

Furthermore, an insulator 806 was formed over the conductor 803, the insulator 804, and the conductor 805. A conductor 807 electrically connected to the conductor 803, and a conductor 808 electrically connected to the conductor 805 were formed over the insulator 806. The conductor 807 and the conductor 808 function as electrodes to which measurement signals are input.

Note that formation of the conductor 803, the conductor 805, the conductor 807, and the conductor 808, formation of a contact hole provided in the insulator 806 and the insulator 804, and the like were performed by a known photolithography method and a known etching method.

Three samples 800 (a sample 800A, a sample 800B, and a sample 800C) which differed in conditions of formation of the conductor 805 functioning as an upper electrode and conditions of heat treatment after the formation of the upper electrode were fabricated.

Table 1 shows deposition conditions of the conductor 803a (W), the conductor 803b (TiN$_x$), the insulator 804 (HfZrO$_x$), the conductor 805a (TiN$_x$), and the conductor 805b(W), which are provided in each of the sample 800A, the sample 800B, and the sample nt:0.

Although not shown in Table 1, 200-nm-thick silicon oxynitride was deposited as the insulator 806 by a PECVD method. Furthermore, a stacked-layer film of three layers of 50-nm-thick Ti, 200-nm-thick Al, and 50-nm-thick Ti was deposited as the conductor 807 and the conductor 808 by a sputtering (SP) method.

The conductor 805a of each of the sample 800A and the sample 800B was deposited by a sputtering (SP) method, and the conductor 805a of the sample 800C was deposited by a metal CVD (MCVD) method. In addition, after being fabricated, the sample 800B was subjected to heat treatment by an RTA method. Table 1 also shows conditions of the heat treatment.

TABLE 1

| Sample name | 800A | 800B | 800C |
| --- | --- | --- | --- |
| Conditions of heat treatment after sample fabrication | — | Heat treatment method: RTA<br>Heat treatment temperature: 500° C.<br>Heating atmosphere: nitrogen<br>Heating time: 60 sec. | — |
| 805b | | Deposition method: SP method, Composition: W, Thickness: 20 nm<br>Deposition temperature: 130° C. | Deposition method: SP method<br>Composition: W, Thickness: 20 nm<br>Deposition temperature 130° C. |
| 805a | | Deposition method: SP method, Composition: TiN$_x$, Thickness: 10 nm<br>Deposition temperature: room temperature (no heating) | Deposition method: MCVD method<br>Composition: TiN$_x$, Thickness: 10 nm<br>Deposition temperature: 400° C. |
| 804 | | Deposition method: ALD method, Composition: HfZrO$_x$, Thickness: 10 nm<br>Precursor: chloride-based precursor, Oxidizer: H$_2$O, Deposition temperature: 300° C. | |
| 803b | | Deposition method: MCVD method, Composition: TiN$_x$, Thickness: 10 nm<br>Deposition temperature: 400° C. | |
| 803a | | Deposition method: SP method, Composition: W, Thickness: 30 nm<br>Deposition temperature: 130° C. | |

<Measurement and Analysis>

Figure 40C:
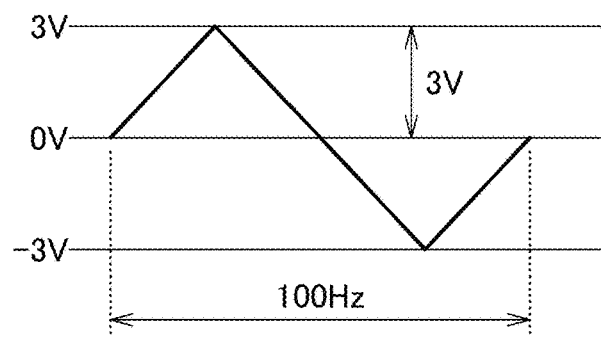
FIG. 40C is a graph showing an input voltage waveform.

A triangular wave with a voltage amplitude of 3 V and a frequency of 100 Hz was applied between the conductor 807 and the conductor 803, and a change in spontaneous polarization (P-E characteristics) of the insulator 804 was measured. FIG. 40C shows a waveform of the input voltage. In addition, the crystal state of the HfZrO$_x$ film corresponding to the insulator 804 of each of the sample 800A, the sample 800B, and the sample 800C was investigated using grazing incident X-ray diffraction (GIXD), which is a kind of XRD analysis method.

Figure 41A:
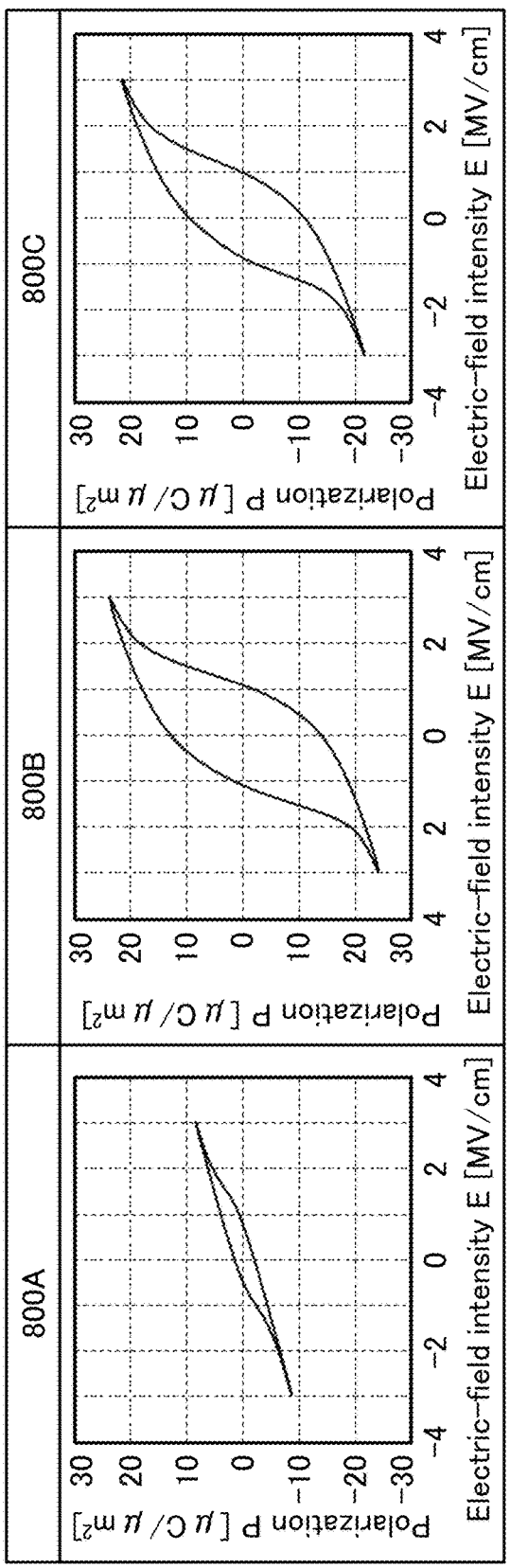
FIG. 41A is graphs showing measurement results of P-E characteristics.
Figure 41B:
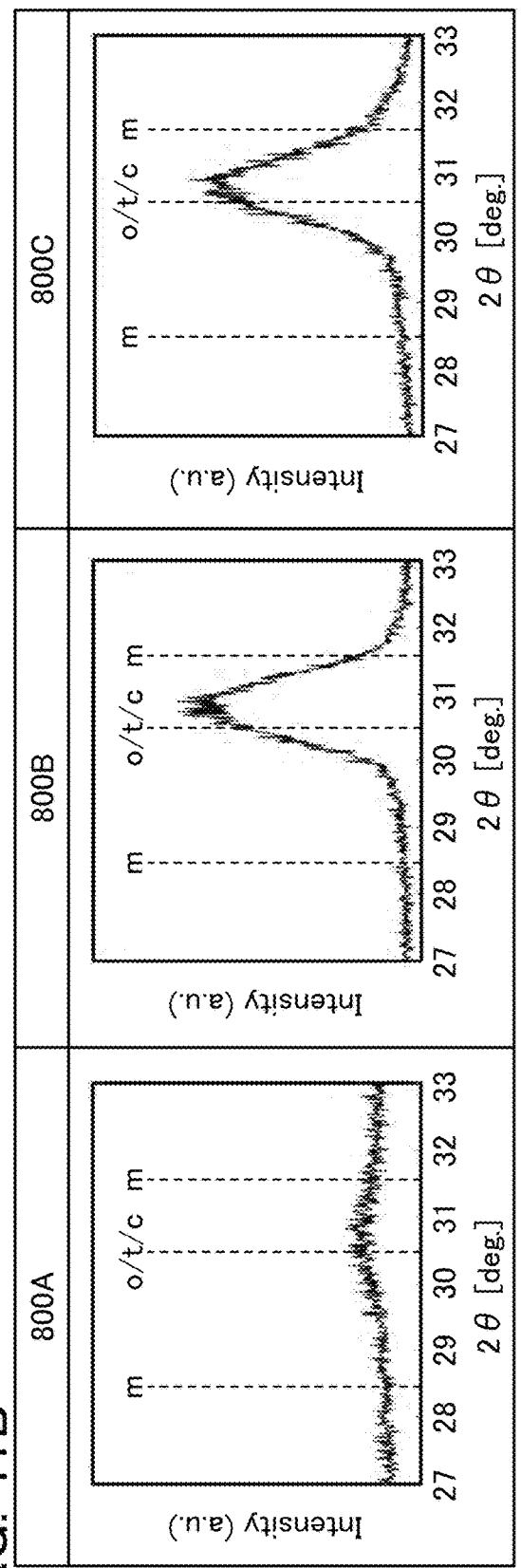
FIG. 41B are graphs showing GIXD measurement results.

FIG. 41A shows measurement results of the P-E characteristics. In FIG. 41A, the relationship between electric-field intensity E applied to the insulator 804 and polarization P is shown for each sample. FIG. 41B shows GIXD measurement results. In FIG. 41B, the relationship between a diffraction angle (2θ) of X-ray and detected signal intensity is shown for each sample.

It is found from FIG. 41A that hysteresis characteristics are obtained in the three samples (the sample 800A, the sample 800B, and the sample 800C), and the three samples function as ferroelectrics. Note that the amount of polarization (the difference between the maximum polarization and the minimum polarization at the time when the electric-field intensity E is 0 in the P-E characteristics) of the sample 800A is smaller than those of the sample 800B and the sample 800C, which indicates that the sample 800A is close to a paraelectric.

It is found from FIG. 41B that in each of the three samples, no signal intensity peak is detected in the vicinity of a diffraction angle at which monoclinic crystal (m) is detected, and a signal intensity peak is observed in the vicinity of a diffraction angle indicating an orthorhombic crystal (o), a tetragonal crystal (t), or a cubit crystal (c). When the measurement results shown in FIG. 41A are taken into consideration, an orthorhombic crystal functioning as a ferroelectric is presumed to be detected. Furthermore, it is also found from FIG. 41B that the sample 800A is closer to a paraelectric than the sample 800B and the sample 800C are.

In general, a larger amount of polarization (hysteresis characteristics) is preferred in a ferroelectric. A comparison between the sample 800A and the sample 800B, in each of which the conductor 805a was deposited by a sputtering method, shows that the sample 800A not subjected to heat treatment after the fabrication does not have large hysteresis characteristics. Meanwhile, the sample 800C, in which the conductor 805a was deposited by a metal CVD method, has an amount of polarization (hysteresis characteristics) equivalent to that of the sample 800B that was subjected to heat treatment, even though heat treatment was not performed on the sample 800C after the fabrication. Deposition of the conductor 805a by a metal CVD method enables a reduction in the number of steps for fabricating the sample.

Next, the hydrogen (H) concentration and the carbon (C) concentration in the insulator 804 of each of the sample 800A, the sample 800B, and the sample 800C were measured by secondary ion mass spectrometry.

Figure 42:
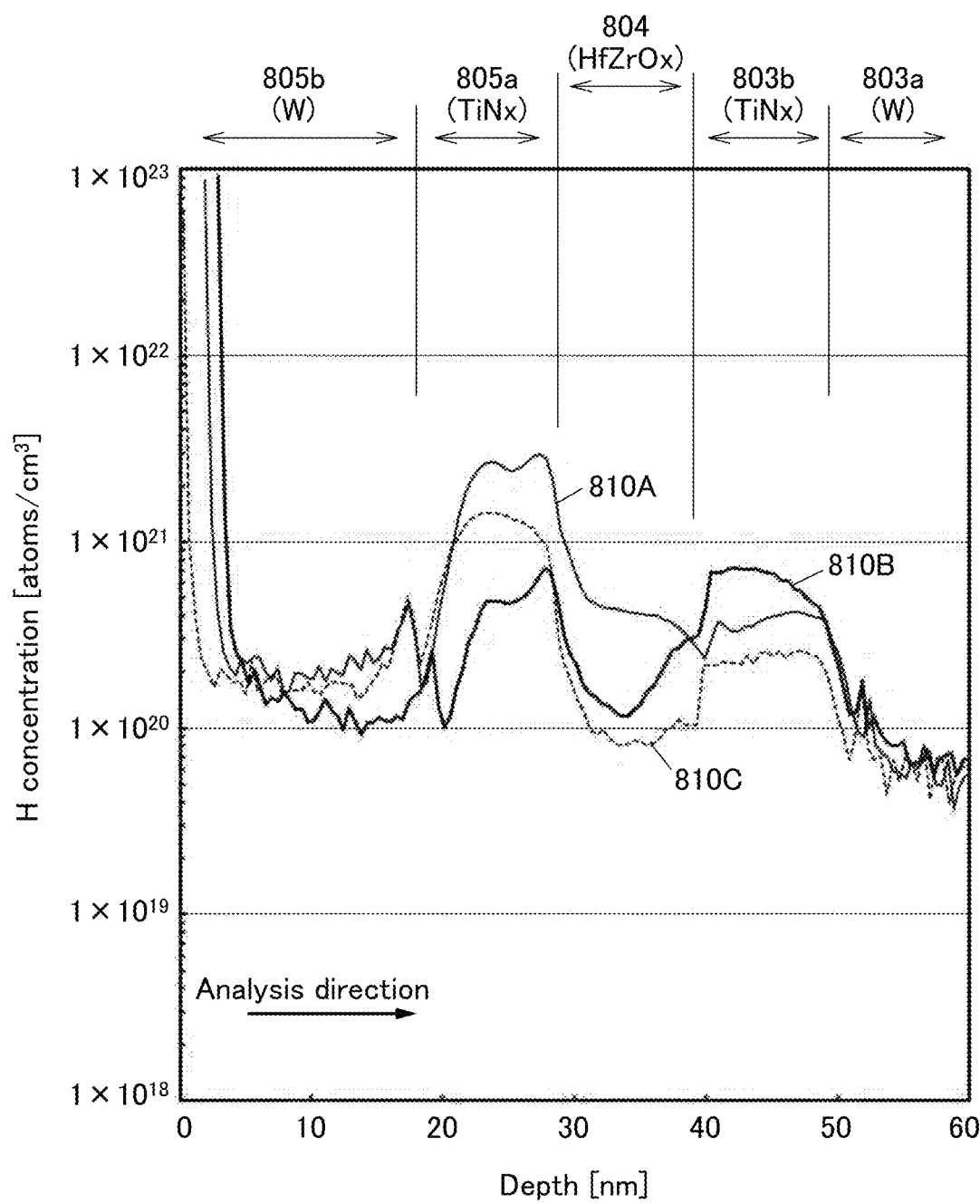
FIG. 42 is a graph showing SIMS analysis results.
Figure 43:
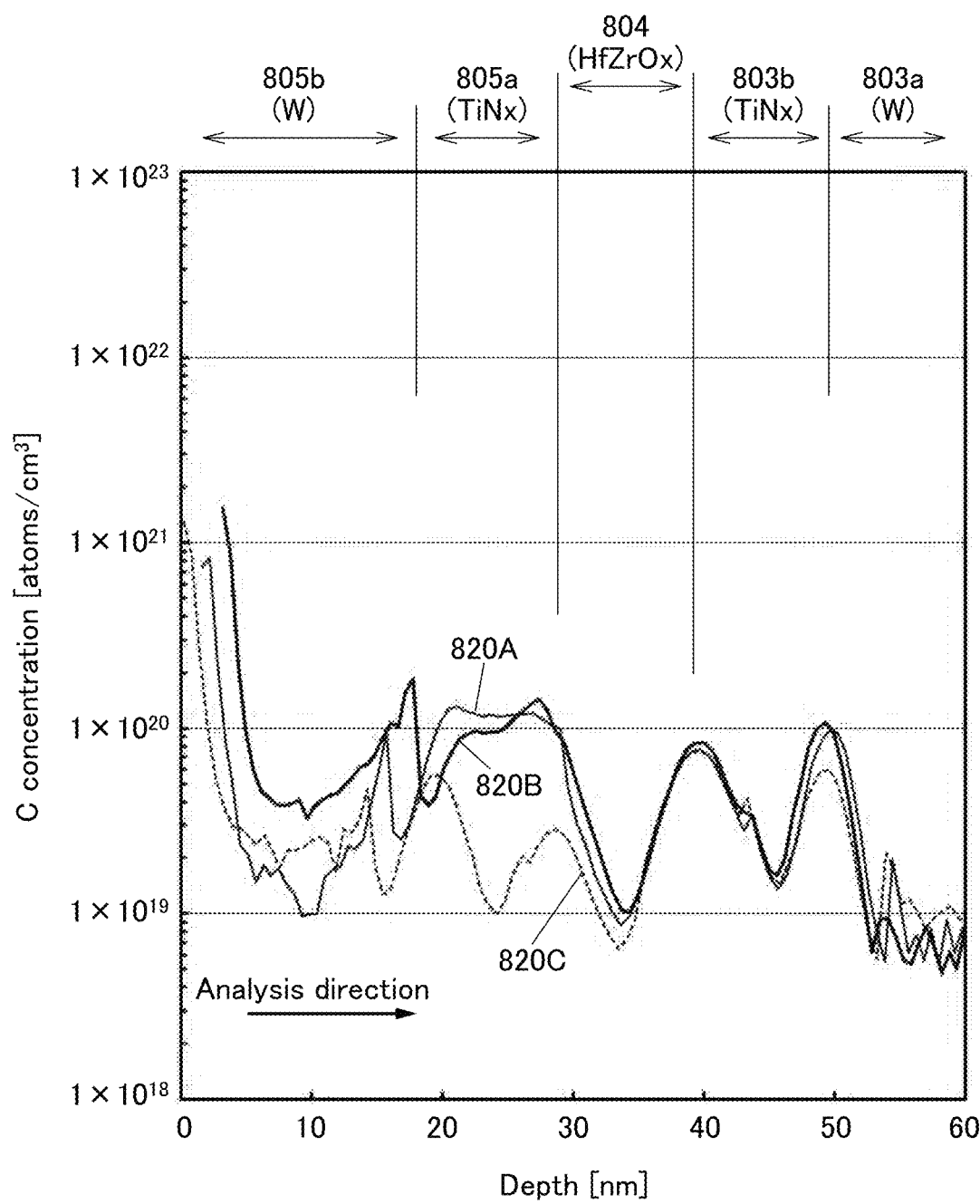
FIG. 43 is a graph showing SIMS analysis results.

The SIMS analysis was conducted from the conductor 805b toward the conductor 803a. FIG. 42 and FIG. 43 show SIMS analysis results. The horizontal axes in FIG. 42 and FIG. 43 each represent the depth from the surface of the conductor 805b, the vertical axis in FIG. 42 represents the hydrogen concentration in the insulator 804, and the vertical axis in FIG. 43 represents the carbon concentration in the insulator 804. Furthermore, the positions of the conductor 805b, the conductor 805a, the insulator 804, the conductor 803b, and the conductor 803a in the depth direction, which were specified from the thicknesses and the SIMS profiles, are shown in FIG. 42 and FIG. 43.

In FIG. 42, a curve 810A represents SIMS analysis results of the sample 800A, a curve 810B represents SIMS analysis results of the sample 800B, and a curve 810C represents SIMS analysis results of the sample 800C. The hydrogen concentration in the insulator 804 was approximately $4 \times 10^{20}$ atoms/cm$^3$ in the sample 800A, approximately $2 \times 10^{20}$ m atoms/cm$^3$ in the sample 800B, and approximately $9 \times 10^{19}$ atoms/cm$^3$ in the sample 800C.

In FIG. 43, a curve 820A represents SIMS analysis results of the sample 800A, a curve 820B represents SIMS analysis results of the sample 800B, and a curve 820C represents SIMS analysis results of the sample 800C. The carbon concentration in the insulator 804 was approximately $9 \times 10^{18}$ atoms/cm$^3$ in the sample 800A, approximately $1 \times 10^{19}$ atoms/cm$^3$ in the sample 800B, and approximately $6 \times 10^{18}$ atoms/cm$^3$ in the sample 800C.

It is found from FIG. 42 and FIG. 43 that both the hydrogen concentration in the insulator 804 and the carbon concentration in the insulator 804 are the smallest in the sample 800C, in which the conductor 805a was deposited by a metal CVD (MCVD) method.

The hydrogen concentration in the insulator 804 is preferably lower than or equal to $5 \times 10^{20}$ atoms/cm$^3$, further preferably lower than or equal to $1 \times 10^{20}$ atoms/cm$^3$. The carbon concentration in the insulator 804 is preferably lower than or equal to $5 \times 10^{19}$ atoms/cm$^3$, further preferably lower than or equal to $1 \times 10^{19}$ atoms/cm$^3$.

Example 2

In this example, results of fatigue characteristic measurement performed on the sample 800B and the sample 800C described in Example 1 will be described. The measurement of fatigue characteristics was performed on two samples 800B (a sample 800B_1 and a sample 800B_2) and two samples 800C (a sample 800C_1 and a sample 800_C2).

Figure 44A:
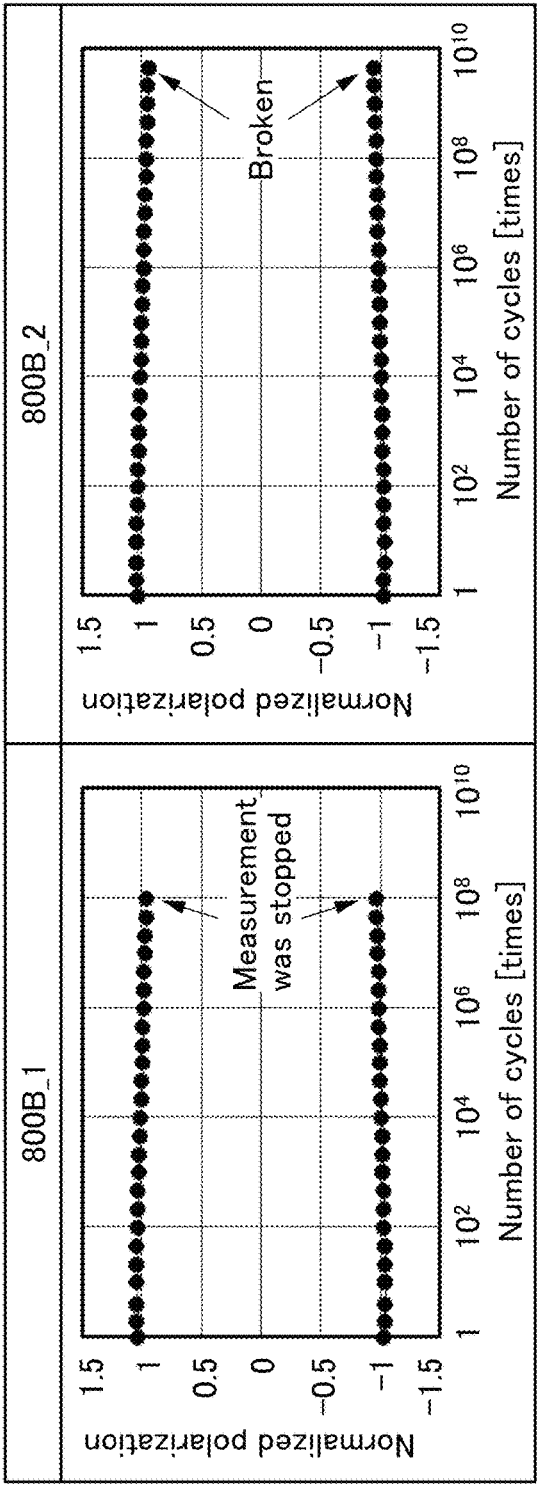
FIG. 44A and FIG. 44B are graphs showing measurement results of fatigue characteristics.
Figure 44B:
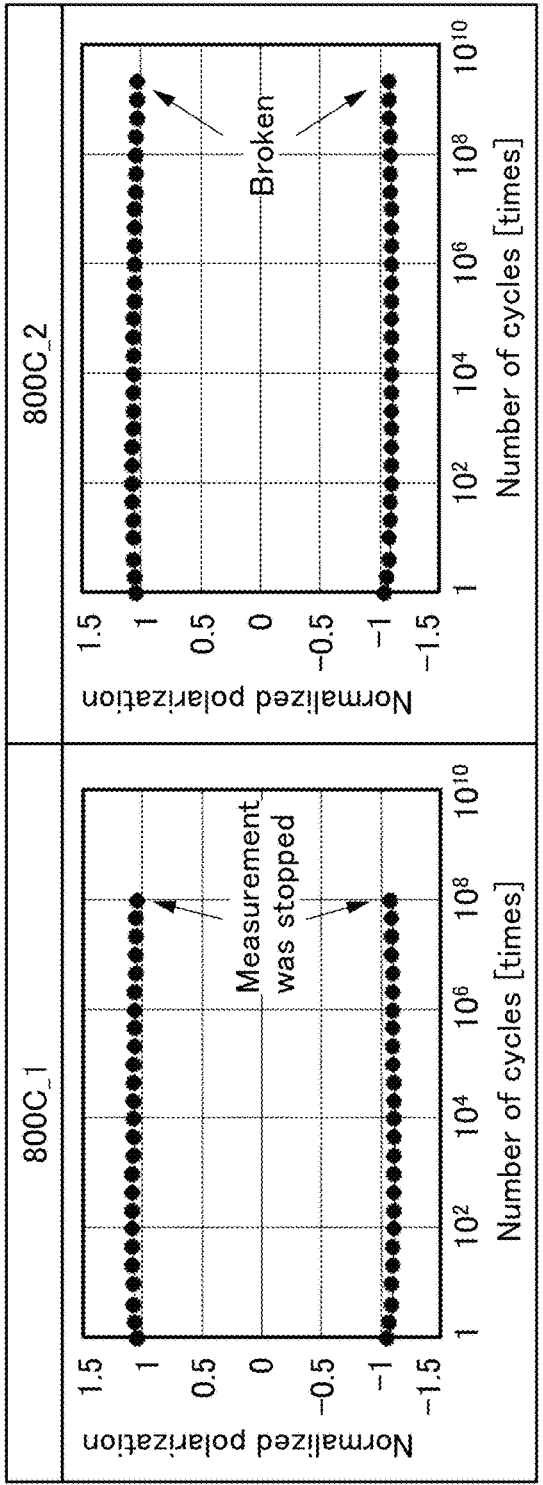

FIG. 44A shows the measurement results of the fatigue characteristics of the sample 800B_1 and the sample 800B_2. FIG. 44B shows the measurement results of the fatigue characteristics of the sample 800C_1 and the sample 800C_2. In FIG. 44A and FIG. 44B, the horizontal axis represents the number of cycles and the vertical axis represents normalized polarization.

Specifically, with application of a one-cycle rectangular wave with a voltage amplitude of 3 V and a frequency of 100 Hz regarded as one cycle, P-E characteristics were measured at each prescribed number of cycles using the triangular wave described in Example 1 to obtain the minimum polarization and the maximum polarization at the time when the electric-field intensity was 0.

In FIG. 44A and FIG. 44B, the ratio of the minimum polarization obtained at each prescribed number of cycles to the minimum polarization of the initial P-E characteristics, and the ratio of the maximum polarization obtained at each prescribed number of cycles to the maximum polarization of the initial P-E characteristics are shown as normalized polarization. Accordingly, the minimum polarization and the maximum polarization at the time when the electric-field intensity E of the initial P-E characteristics is 0 are −1 and 1, respectively.

The measurement was stopped after $1 \times 10^8$ cycles in the sample 800B_1 and the sample 800C_1. The measurement was kept performed even after $1 \times 10^8$ cycles in the sample 800B_2 and the sample 800C_2. The sample 800B_2 was broken after the completion of 2.1×10⁹ cycles. The sample 800C_2 was broken after the completion of 4.6×10⁹ cycles. Fatigue characteristics of 1×10⁹ cycles or more were verified from FIG. 44A and FIG. 44B.

Example 3

In this example, measurement results of P-E characteristics with the voltage amplitude of a triangular wave varied will be described with the use of the sample 800B described in Example 1.

Figure 45:
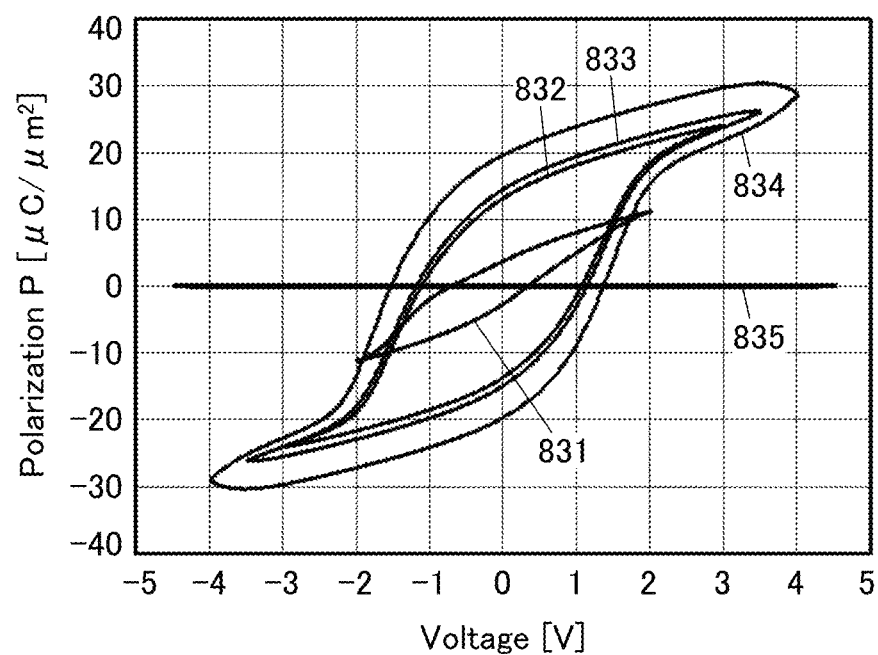
FIG. 45 is a graph showing P-E characteristics at each voltage amplitude of a triangular wave.

FIG. 45 shows the measurement results of the P-E characteristics. In FIG. 45, the horizontal axis represents voltage and the vertical axis represents polarization P. Furthermore, in FIG. 45, a curve 831 represents P-E characteristics at a voltage amplitude of a triangular wave of 2.0 V, a curve 832 represents P-E characteristics at a voltage amplitude of a triangular wave of 3.0 V, a curve 833 represents P-E characteristics at a voltage amplitude of a triangular wave of 3.5 V, a curve 834 represents P-E characteristics at a voltage amplitude of a triangular wave of 4.0 V, and a curve 835 represents P-E characteristics at a voltage amplitude of a triangular wave of 4.5 V It is found from FIG. 45 that as the voltage amplitude of the triangular wave is increased, the hysteresis characteristics become more noticeable and the amount of polarization (the difference between the maximum polarization and the minimum polarization at the time when the electric-field intensity E is 0 in the P-E characteristics) becomes large. Note that in the case where the voltage amplitude was 4.5 V (the curve 835), no hysteresis characteristic was observed. With the voltage amplitude set to 4.5 V, the sample was presumed to be broken.

REFERENCE NUMERALS

51: curve, 52: curve, 100: capacitor, 110: conductor, 110A: conductive film, 112: conductor, 120: conductor, 120a: conductor, 120A: conductive film, 120b: conductor, 120B: conductive film, 130: insulator, 130a: insulator, 130A: insulating film, 130b: insulator, 130c: insulator, 135: filler, 150: insulator, 152a: insulator, 152b: insulator, 154a: insulator, 154b: insulator, 155: insulator, 200: transistor, 205: conductor, 205a: conductor, 205b: conductor, 210: insulator, 212: insulator, 214: insulator, 216: insulator, 217: insulator, 218: conductor, 222: insulator, 224: insulator, 224A: insulating film, 230: oxide, 230a: oxide, 230A: oxide film, 230b: oxide, 230B: oxide film, 230ba: region, 230bb: region, 230bc: region, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 245: insulator, 246: conductor, 246a: conductor, 246b: conductor, 250: insulator, 250a: insulator, 250A: insulating film, 250b: insulator, 252: insulator, 252A: insulating film, 254: insulator, 254A: insulating film, 260: conductor, 260a: conductor, 260b: conductor, 262: conductor, 265: sealing portion, 271: insulator, 271a: insulator, 271A: insulating film, 271b: insulator, 271B: insulating layer, 274: insulator, 275: insulator, 280: insulator, 282: insulator, 283: insulator, 285: insulator, 286: insulator, 287: insulator, 290: opening, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 357: conductor, 400: opening region, 500: semiconductor device, 800: sample, 800A: sample, 800B: sample, 800B_1: sample, 800B_2: sample, 800C: sample, 800C_1: sample, 800C_2: sample, 801: substrate, 802: insulator, 803: conductor, 803a: conductor, 803b: conductor, 804: insulator, 805: conductor, 805a: conductor, 805b: conductor, 806: insulator, 807: conductor, 808: conductor, 810A: curve, 810B: curve, 810C: curve, 820A: curve, 820B: curve, 820C: curve, 831: curve, 832: curve, 833: curve, 834: curve, 835: curve, 1001: wiring, 1002: wiring, 1003: wiring, 1004: wiring, 1005: wiring, 1006: wiring, 1007: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: storage device, 1411: peripheral circuit, 1420: row circuit, 1430: column circuit, 1440: output circuit, 1460: control logic circuit, 1470: memory cell array, 2700: manufacturing apparatus, 2701: atmosphere-side substrate supply chamber, 2702: atmosphere-side substrate transfer chamber, 2703a: load lock chamber, 2703b: unload lock chamber, 2704: transfer chamber, 2706a: chamber, 2706b: chamber, 2706c: chamber, 2706d: chamber, 2761: cassette port, 2762: alignment port, 2763a: transfer robot, 2763b: transfer robot, 2801: gas supply source, 2802: valve, 2803: high-frequency generator, 2804: waveguide, 2805: mode converter, 2806: gas pipe, 2807: waveguide, 2808: slot antenna plate, 2809: dielectric plate, 2810: high-density plasma, 2811: substrate, 2811_n: substrate, 2811_n−1: substrate, 2811_n−2: substrate, 2811_1: substrate, 2811_2: substrate, 2811_3: substrate, 2812: substrate holder, 2813: heating mechanism, 2815: matching box, 2816: high-frequency power source, 2817: vacuum pump, 2818: valve, 2819: exhaust port, 2820: lamp, 2821: gas supply source, 2822: valve, 2823: gas inlet, 2824: substrate, 2825: substrate holder, 2826: heating mechanism, 2828: vacuum pump, 2829: valve, 2830: exhaust port, 2900: microwave treatment apparatus, 2901: quartz tube, 2902: substrate holder, 2903: heating means, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: type game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A method for manufacturing a capacitor, comprising:
   forming a first conductor over a substrate;
   forming an insulating film over the first conductor;
   forming a conductive film over the insulating film while substrate heating is performed; and
   processing the conductive film and the insulating film by a lithography method to form a second conductor and an insulator, wherein the insulator comprises hafnium oxide and zirconium oxide, and wherein the insulator comprises ferroelectricity.

2. The method for manufacturing a capacitor, according to claim 1, wherein the insulating film is deposited by a thermal atomic layer deposition method, and wherein a heat treatment at 500° C. or higher is not performed after the formation of the conductive film.

3. The method for manufacturing a capacitor, according to claim 2, wherein a precursor used in the deposition of the insulating film comprises no hydrocarbon.

4. The method for manufacturing a capacitor, according to claim 1, wherein the conductive film is deposited by a thermal atomic layer deposition method.

5. The method for manufacturing a capacitor, according to claim 4, wherein a precursor used in the deposition of the conductive film comprises no hydrocarbon.

6. The method for manufacturing a capacitor, according to claim 1, wherein a temperature of the substrate heating is set to be higher than or equal to 350° C. and lower than or equal to 450° C.

7. A semiconductor device, comprising:

a capacitor; and a transistor electrically connected to the capacitor, wherein the capacitor comprises a first conductor, a second conductor, and a ferroelectric layer, wherein the ferroelectric layer is provided between the first conductor and the second conductor, wherein each of the ferroelectric layer and the second conductor comprises an end portion outside the first conductor, wherein the ferroelectric layer comprises hafnium oxide and zirconium oxide, and wherein the transistor comprises an oxide semiconductor in a channel formation region.

8. The semiconductor device, according to claim 7, wherein a concentration of at least one of hydrogen and carbon contained in the ferroelectric layer is lower than or equal to $5 \times 10^{20}$ atoms/cm$^3$.

9. The semiconductor device, according to claim 7, wherein a concentration of at least one of hydrogen and carbon contained in the ferroelectric layer is lower than or equal to $1 \times 10^{20}$ atoms/cm$^3$.

10. The semiconductor device, according to claim 7, wherein the first conductor is electrically connected to one of a source and a drain of the transistor.

11. The semiconductor device, according to claim 7, wherein a thickness of the ferroelectric layer is less than or equal to 10 nm.

12. The semiconductor device, according to claim 7, wherein the capacitor is positioned above the transistor.

13. The semiconductor device, according to claim 12, wherein a first insulator is positioned below the capacitor, wherein a second insulator is positioned to cover the capacitor, wherein the first insulator is in contact with a bottom surface of the second insulator in a region not overlapping with the capacitor, and wherein the first insulator and the second insulator each comprise silicon nitride.

14. The semiconductor device, according to claim 12, wherein a first insulator is positioned below the transistor, wherein a second insulator is positioned to cover the capacitor, wherein the first insulator is in contact with a bottom surface of the second insulator in a region not overlapping with the transistor or the capacitor, and wherein the first insulator and the second insulator each comprise silicon nitride.

15. The semiconductor device, according to claim 13, wherein the second insulator comprises a first layer and a second layer over the first layer.

16. The semiconductor device, according to claim 7, wherein an interlayer insulating film is positioned above the transistor, wherein the interlayer insulating film comprises an opening reaching any one of a source and a drain of the transistor, wherein the first conductor is positioned in contact with a side surface and a bottom surface of the opening, wherein the ferroelectric layer is positioned to cover the first conductor, and wherein the second conductor is positioned over the ferroelectric layer.

17. A semiconductor device, comprising:

a capacitor;

a transistor electrically connected to the capacitor;

a first conductor functioning as one of a source and a drain of the transistor;

a second conductor functioning as the other of the source and the drain of the transistor;

a third conductor functioning as a first gate of the transistor;

a fourth conductor functioning as a second gate of the transistor;

an oxide semiconductor layer provided between the third conductor and the fourth conductor;

a fifth conductor functioning as a first electrode of the capacitor;

a sixth conductor functioning as a second electrode of the capacitor; and a ferroelectric layer provided between the fifth conductor and the sixth conductor, wherein, in a top view, the fourth conductor is provided inside the third conductor, wherein, in the top view, the sixth conductor overlaps with the second conductor and the oxide semiconductor layer, wherein, in the top view, the sixth conductor extends beyond a first side, a second side, and a third side of the second conductor, and wherein the ferroelectric layer comprises hafnium oxide and zirconium oxide.

18. The semiconductor device, according to claim 17, wherein the fifth conductor is embedded in the second conductor, and wherein the ferroelectric layer is in contact with a top surface and a side surface of the fifth conductor and a bottom and a side surface of the sixth conductor.

19. The semiconductor device, according to claim 17, wherein the fifth conductor is embedded in the second conductor, wherein the ferroelectric layer is in contact with a top surface and a side surface of the fifth conductor and a bottom and a side surface of the sixth conductor, and wherein the fourth conductor is provided adjacent to the fifth conductor and the sixth conductor.

* * * * *